United States Patent
Sasai et al.

(10) Patent No.: US 10,903,848 B2
(45) Date of Patent: *Jan. 26, 2021

(54) IMAGE DECODING METHOD, IMAGE CODING METHOD, IMAGE DECODING APPARATUS, IMAGE CODING APPARATUS, AND IMAGE CODING AND DECODING APPARATUS

(71) Applicant: Sun Patent Trust, New York, NY (US)

(72) Inventors: Hisao Sasai, Osaka (JP); Takahiro Nishi, Nara (JP); Youji Shibahara, Tokyo (JP); Toshiyasu Sugio, Osaka (JP); Kyoko Tanikawa, Osaka (JP); Toru Matsunobu, Osaka (JP)

(73) Assignee: SUN PATENT TRUST, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/545,278

(22) Filed: Aug. 20, 2019

(65) Prior Publication Data
US 2019/0379395 A1    Dec. 12, 2019

Related U.S. Application Data

(63) Continuation of application No. 13/535,414, filed on Jun. 28, 2012, now Pat. No. 10,439,637.
(Continued)

(51) Int. Cl.
*H04N 19/13* (2014.01)
*H03M 7/40* (2006.01)
*H04N 19/186* (2014.01)

(52) U.S. Cl.
CPC .......... *H03M 7/4018* (2013.01); *H04N 19/13* (2014.11); *H04N 19/186* (2014.11)

(58) Field of Classification Search
CPC ...... H04N 19/13; H04N 19/176; H04N 19/91; H04N 19/70; H04N 19/196; H04N 19/61;
(Continued)

(56) References Cited

U.S. PATENT DOCUMENTS

| 6,795,584 B2 | 9/2004 | Karczewicz et al. |
| 7,262,722 B1 | 8/2007 | Jahanghir et al. |

(Continued)

FOREIGN PATENT DOCUMENTS

| CN | 1465190 | 12/2003 |
| CN | 1531347 | 9/2004 |

(Continued)

OTHER PUBLICATIONS

Detlev Marpe et al., "Context-Based Adaptive Binary Arithmetic Coding in the H.264/AVC Video Compression Standard", IEEE Transactions on Circuits and Systems for Video Technology, vol. 13, No. 7, Jul. 2003.

(Continued)

*Primary Examiner* — Daniel Chang
(74) *Attorney, Agent, or Firm* — Wenderoth, Lind & Ponack, L.L.P.

(57) ABSTRACT

The image decoding method includes: determining a context for use in a current block to be processed, from among a plurality of contexts; and performing arithmetic decoding on a bit sequence corresponding to the current block, using the determined context, wherein in the determining: the context is determined under a condition that control parameters of neighboring blocks of the current block are used, when the signal type is a first type, the neighboring blocks being a left block and an upper block of the current block; and the context is determined under a condition that the control parameter of the upper block is not used, when the signal (Continued)

| | c2 Signal type | c3 Binarization scheme | c4 Context model for first element | c5 Left block condition L condL | c6 Upper block condition A condA |
|---|---|---|---|---|---|
| s1 | split_coding_unit_flag | Fixed length | 0, 1, or 2 (condL && availableL) + (condA && availableA) | cuDepth[xL][yL] > cuDepth[xP][yP] | cuDepth[xA][yA] > cuDepth[xP][yP] |
| s2 | skip_flag | Fixed length | 0, 1, 2 | skip_flag[xL][yL] | skip_flag[xA][yA] |
| s3 | merge_flag | Fixed length | 0, 1, 2 | merge_flag[xL][yL] | merge_flag[xA][yA] |
| s4 | intra_chroma_pred_mode | Variable length | 0, 1, 2 | IntraPredMode[xL][yL] == 4 | IntraPredMode[xA][yA] == 4 |
| s5 | inter_pred_flag | Fixed length | 0, 1, 2 | inter_pred_flag[xL][yL] | inter_pred_flag[xA][yA] |
| s6 | mvd_lc mvd_l0 mvd_l1 | Variable length | 0, 1, 2 | mvd_lc[xL][yL] > 16 mvd_l0[xL][yL] > 16 mvd_l1[xL][yL] > 16 | mvd_lc[xA][yA] > 16 mvd_l0[xA][yA] > 16 mvd_l1[xA][yA] > 16 |
| s7 | ref_idx_lc ref_idx_l0 ref_idx_l1 | Variable length | 0, 1, 2, or 3 (condL && availableL) + (condA && availableA) << 1 | ref_idx_lc[xL][yL] > 0 ref_idx_l0[xL][yL] > 0 ref_idx_l1[xL][yL] > 0 | ref_idx_lc[xA][yA] > 0 ref_idx_l0[xA][yA] > 0 ref_idx_l1[xA][yA] > 0 |
| s8 | Cbf_cb(MODE_INTRA) Cbf_cr(MODE_INTRA) | Fixed length | 0, 1, 2, 3 | cbf_cb[xL][yL] cbf_cr[xL][yL] | cbf_cb[xA][yA] cbf_cr[xA][yA] |
| s9 | Cbf_luma | Fixed length | 0, 1, 2, 3 | cbf_luma[xL][yL] | cbf_luma[xA][yA] |
| s10 | no_residual_data_flag | Fixed length | 0, 1, 2, 3 | no_residual_data_flag[xL][yL] | no_residual_data_flag[xA][yA] |
| NA | alf_cu_flag | 1bin | 0, 1, 2 | alf_cu_flag[xL][yL] | alf_cu_flag[xA][yA] | type is a second type, and the second type is one of "cbf_luma", "cbf_cb", and "cbf_cr".

2 Claims, 37 Drawing Sheets

Related U.S. Application Data

(60) Provisional application No. 61/502,969, filed on Jun. 30, 2011.

(58) Field of Classification Search
CPC .. H04N 19/157; H04N 19/136; H04N 19/593; H03M 7/4018; H03M 7/4006
USPC ............ 375/240.12, 240.16, 240.18, 240.01, 375/240.02, 240.24; 382/238, 239, 247
See application file for complete search history.

(56) References Cited

U.S. PATENT DOCUMENTS

| | | |
|---|---|---|
| 7,310,373 B2 | 12/2007 | Kondo et al. |
| 7,379,608 B2 | 5/2008 | Marpe et al. |
| 7,469,070 B2 | 12/2008 | Winger |
| 7,592,937 B1 | 9/2009 | Chang |
| 7,595,743 B1 | 9/2009 | Winger et al. |
| 7,664,180 B2 | 2/2010 | Kondo et al. |
| 7,702,013 B2 | 4/2010 | Schwarz et al. |
| 7,733,960 B2 | 6/2010 | Kondo et al. |
| 7,742,526 B2 | 6/2010 | Kondo et al. |
| 7,756,204 B2 | 7/2010 | Kondo et al. |
| 7,782,936 B2 | 8/2010 | Kondo et al. |
| 7,801,219 B2 | 9/2010 | Kondo et al. |
| 7,809,060 B2 | 10/2010 | Toma et al. |
| 7,843,994 B2 | 11/2010 | Toma et al. |
| 7,856,060 B2 | 12/2010 | Kondo et al. |
| 7,884,743 B2 | 2/2011 | Sakaguchi et al. |
| 7,894,523 B2 | 2/2011 | Jeon et al. |
| 7,940,845 B2 | 5/2011 | Kondo et al. |
| 7,945,102 B2 | 5/2011 | Kondo |
| 7,983,343 B2 | 7/2011 | Pearson et al. |
| 8,094,715 B2 | 1/2012 | Fukuta et al. |
| 8,107,533 B2 | 1/2012 | Kondo et al. |
| 8,126,056 B2 | 2/2012 | Kondo et al. |
| 8,126,057 B2 | 2/2012 | Kondo et al. |
| 8,130,843 B2 | 3/2012 | Toma et al. |
| 8,135,226 B2 | 3/2012 | Fukuhara et al. |
| 8,175,444 B2 | 5/2012 | Kang et al. |
| 8,180,201 B2 | 5/2012 | Kang et al. |
| 8,190,003 B2 | 5/2012 | Kang et al. |
| 8,194,747 B2 | 6/2012 | Kondo et al. |
| 8,199,821 B2 | 6/2012 | Jeon et al. |
| 8,213,517 B2 | 7/2012 | Kondo et al. |
| 8,218,631 B2 | 7/2012 | Marpe et al. |
| 8,218,650 B2 | 7/2012 | Pearson et al. |
| 8,249,147 B2 | 8/2012 | Watanabe et al. |
| 8,254,446 B2 | 8/2012 | Toma et al. |
| 8,254,447 B2 | 8/2012 | Toma et al. |
| 8,265,153 B2 | 9/2012 | Kondo et al. |
| 8,275,235 B2 | 9/2012 | Kang et al. |
| 8,290,049 B2 | 10/2012 | Kondo et al. |
| 8,306,117 B2 | 11/2012 | Jeon et al. |
| 8,320,453 B2 | 11/2012 | Jeon et al. |
| 8,331,453 B2 | 12/2012 | Jeon et al. |
| 8,345,968 B2 | 1/2013 | Sekiguchi et al. |
| 8,396,344 B2 | 3/2013 | Kang et al. |
| 8,488,889 B2 | 7/2013 | Moriya et al. |
| 8,509,551 B2 | 8/2013 | Moriya et al. |
| 8,526,492 B2 | 9/2013 | Schwarz et al. |
| 8,538,248 B2 | 9/2013 | Kang et al. |
| 8,542,977 B2 | 9/2013 | Kang et al. |
| 8,605,789 B2 | 12/2013 | Kondo et al. |
| 8,718,141 B2 | 5/2014 | Kondo et al. |
| 8,743,969 B2 | 6/2014 | Sasai et al. |
| 8,792,739 B2 | 7/2014 | Sasai et al. |
| 8,811,762 B2 | 8/2014 | Sasai et al. |
| 8,817,069 B2 | 8/2014 | Alessandrini et al. |
| 8,831,104 B2 | 9/2014 | Jeon et al. |
| 8,929,453 B2 | 1/2015 | Kondo et al. |
| 8,953,680 B2 | 2/2015 | Jeon et al. |
| 8,958,480 B2 | 2/2015 | Kondo et al. |
| 8,964,839 B2 | 2/2015 | Kondo et al. |
| 8,964,848 B2 | 2/2015 | Kondo et al. |
| 8,971,411 B2 | 3/2015 | Kondo et al. |
| 8,989,265 B2 | 3/2015 | Jeon et al. |
| 9,078,003 B2 | 7/2015 | Kondo et al. |
| 9,083,980 B2 | 7/2015 | Kondo et al. |
| 9,106,919 B2 | 8/2015 | Sasai et al. |
| 9,124,891 B2 | 9/2015 | Jeon et al. |
| 9,154,780 B2 | 10/2015 | Sasai et al. |
| 9,154,783 B2 | 10/2015 | Sasai et al. |
| 9,237,357 B2 | 1/2016 | Park et al. |
| 9,241,161 B2 | 1/2016 | Kondo et al. |
| 9,241,162 B2 | 1/2016 | Kondo et al. |
| 9,264,727 B2 | 2/2016 | Sasai et al. |
| 9,363,525 B2 | 6/2016 | Sasai et al. |
| 9,462,282 B2 | 10/2016 | Sasai et al. |
| 9,525,881 B2 | 12/2016 | Sasai et al. |
| 9,591,311 B2 | 3/2017 | Sasai et al. |
| 9,794,571 B2 | 10/2017 | Sasai et al. |
| 9,912,961 B2 | 3/2018 | Sasai et al. |
| 2003/0138150 A1 | 7/2003 | Srinivasan |
| 2003/0156648 A1 | 8/2003 | Holcomb et al. |
| 2004/0052507 A1 | 3/2004 | Kondo et al. |
| 2004/0066974 A1 | 4/2004 | Karczewicz et al. |
| 2004/0086044 A1 | 5/2004 | Kondo et al. |
| 2004/0131268 A1 | 7/2004 | Sekiguchi et al. |
| 2004/0136461 A1 | 7/2004 | Kondo et al. |
| 2004/0146109 A1 | 7/2004 | Kondo et al. |
| 2004/0151248 A1 | 8/2004 | Kondo et al. |
| 2004/0151252 A1 | 8/2004 | Sekiguchi et al. |
| 2004/0234143 A1 | 11/2004 | Hagai et al. |
| 2004/0268329 A1 | 12/2004 | Prakasam |
| 2005/0013497 A1 | 1/2005 | Hsu et al. |
| 2005/0018768 A1 | 1/2005 | Mabey et al. |
| 2005/0053293 A1 | 3/2005 | Lin et al. |
| 2005/0105809 A1 | 5/2005 | Abe et al. |
| 2005/0123207 A1 | 6/2005 | Marpe et al. |
| 2005/0152682 A1 | 7/2005 | Kang et al. |
| 2005/0169374 A1 | 8/2005 | Marpe et al. |
| 2005/0185928 A1 | 8/2005 | Kang et al. |
| 2005/0219069 A1 | 10/2005 | Sato et al. |
| 2006/0088286 A1 | 4/2006 | Shibata et al. |
| 2006/0109149 A1 | 5/2006 | Sekiguchi et al. |
| 2006/0120461 A1 | 6/2006 | Knight |
| 2006/0158355 A1 | 7/2006 | Jeon et al. |
| 2006/0188012 A1 | 8/2006 | Kondo |
| 2006/0204228 A1 | 9/2006 | Kang et al. |
| 2006/0209949 A1 | 9/2006 | Fukuta et al. |
| 2006/0215999 A1 | 9/2006 | Kang et al. |
| 2006/0216000 A1 | 9/2006 | Kang et al. |
| 2006/0233530 A1 | 10/2006 | Kang et al. |
| 2006/0291556 A1 | 12/2006 | Watanabe et al. |
| 2007/0041451 A1 | 2/2007 | Kondo et al. |
| 2007/0041452 A1 | 2/2007 | Kondo et al. |
| 2007/0098070 A1 | 5/2007 | Saigo et al. |
| 2007/0160147 A1 | 7/2007 | Kondo et al. |
| 2007/0162852 A1 | 7/2007 | Jung et al. |
| 2007/0183491 A1 | 8/2007 | Pearson et al. |
| 2007/0194953 A1 | 8/2007 | Cho |
| 2007/0200949 A1 | 8/2007 | Walker et al. |
| 2007/0205927 A1 | 9/2007 | Sekiguchi et al. |
| 2007/0223582 A1 | 9/2007 | Borer |
| 2007/0263723 A1 | 11/2007 | Sekiguchi et al. |
| 2007/0285286 A1 | 12/2007 | Hussain et al. |
| 2008/0025396 A1 | 1/2008 | Tasaka et al. |
| 2008/0063060 A1 | 3/2008 | Kondo et al. |
| 2008/0063061 A1 | 3/2008 | Kondo et al. |
| 2008/0063075 A1 | 3/2008 | Kondo et al. |
| 2008/0063288 A1 | 3/2008 | Abe et al. |
| 2008/0063291 A1 | 3/2008 | Abe et al. |
| 2008/0069231 A1 | 3/2008 | Kondo et al. |
| 2008/0069232 A1 | 3/2008 | Kondo et al. |
| 2008/0069462 A1 | 3/2008 | Abe et al. |

(56) References Cited

U.S. PATENT DOCUMENTS

| | | |
|---|---|---|
| 2008/0117988 A1 | 5/2008 | Toma et al. |
| 2008/0118218 A1 | 5/2008 | Toma et al. |
| 2008/0118224 A1 | 5/2008 | Toma et al. |
| 2008/0123947 A1 | 5/2008 | Moriya et al. |
| 2008/0123977 A1 | 5/2008 | Moriya et al. |
| 2008/0130747 A1 | 6/2008 | Moriya et al. |
| 2008/0130988 A1 | 6/2008 | Moriya et al. |
| 2008/0130989 A1 | 6/2008 | Moriya et al. |
| 2008/0130990 A1 | 6/2008 | Moriya et al. |
| 2008/0131079 A1 | 6/2008 | Toma et al. |
| 2008/0137744 A1 | 6/2008 | Moriya et al. |
| 2008/0137748 A1 | 6/2008 | Kondo et al. |
| 2008/0144715 A1 | 6/2008 | Kondo et al. |
| 2008/0158027 A1 | 7/2008 | Sekiguchi et al. |
| 2008/0159641 A1 | 7/2008 | Moriya et al. |
| 2008/0165849 A1 | 7/2008 | Moriya et al. |
| 2008/0205522 A1 | 8/2008 | Kondo et al. |
| 2008/0219393 A1 | 9/2008 | Toma et al. |
| 2008/0240252 A1 | 10/2008 | He |
| 2009/0003441 A1 | 1/2009 | Sekiguchi et al. |
| 2009/0034856 A1 | 2/2009 | Moriya et al. |
| 2009/0034857 A1 | 2/2009 | Moriya et al. |
| 2009/0060049 A1 | 3/2009 | Chuang |
| 2009/0074057 A1 | 3/2009 | Marpe et al. |
| 2009/0096643 A1 | 4/2009 | Chang |
| 2009/0102973 A1 | 4/2009 | Harris |
| 2009/0103624 A1 | 4/2009 | Mabey et al. |
| 2009/0123066 A1 | 5/2009 | Moriya et al. |
| 2009/0141798 A1 | 6/2009 | Adachi et al. |
| 2009/0153378 A1 | 6/2009 | Sekiguchi et al. |
| 2009/0168873 A1 | 7/2009 | Jeon et al. |
| 2009/0168894 A1 | 7/2009 | Marpe et al. |
| 2009/0225861 A1 | 9/2009 | Sato et al. |
| 2009/0225862 A1 | 9/2009 | Sato et al. |
| 2009/0232205 A1 | 9/2009 | Chiba |
| 2009/0273491 A1 | 11/2009 | Sakaguchi et al. |
| 2009/0304075 A1 | 12/2009 | Ogura et al. |
| 2010/0014589 A1 | 1/2010 | Kondo et al. |
| 2010/0020873 A1 | 1/2010 | Kondo et al. |
| 2010/0020876 A1 | 1/2010 | Jeon et al. |
| 2010/0027624 A1 | 2/2010 | Yu |
| 2010/0040140 A1 | 2/2010 | Marpe et al. |
| 2010/0080285 A1 | 4/2010 | Lee et al. |
| 2010/0098155 A1 | 4/2010 | Demircin et al. |
| 2010/0183079 A1 | 7/2010 | Jeon et al. |
| 2010/0183080 A1 | 7/2010 | Jeon et al. |
| 2010/0202539 A1 | 8/2010 | Kondo et al. |
| 2010/0238998 A1 | 9/2010 | Nanbu et al. |
| 2010/0239002 A1 | 9/2010 | Park et al. |
| 2010/0266048 A1 | 10/2010 | Yang et al. |
| 2010/0315270 A1 | 12/2010 | Sekiguchi et al. |
| 2010/0329350 A1 | 12/2010 | Abe et al. |
| 2011/0019739 A1 | 1/2011 | Jeon et al. |
| 2011/0026604 A1 | 2/2011 | Zhao et al. |
| 2011/0080464 A1 | 4/2011 | Alessandrini et al. |
| 2011/0090967 A1 | 4/2011 | Chen et al. |
| 2011/0095922 A1 | 4/2011 | Sekiguchi et al. |
| 2011/0102210 A1 | 5/2011 | Sekiguchi et al. |
| 2011/0102213 A1 | 5/2011 | Sekiguchi et al. |
| 2011/0113451 A1 | 5/2011 | Kang et al. |
| 2011/0115656 A1 | 5/2011 | Sekiguchi et al. |
| 2011/0129016 A1 | 6/2011 | Sekiguchi et al. |
| 2011/0135143 A1 | 6/2011 | Zou et al. |
| 2011/0148674 A1 | 6/2011 | Sekiguchi et al. |
| 2011/0150075 A1 | 6/2011 | Pearson et al. |
| 2011/0206125 A1 | 8/2011 | Chien et al. |
| 2011/0249721 A1 | 10/2011 | Karczewicz et al. |
| 2011/0249754 A1 | 10/2011 | Karczewicz et al. |
| 2011/0293007 A1 | 12/2011 | Abe et al. |
| 2011/0310976 A1 | 12/2011 | Wang et al. |
| 2012/0008676 A1 | 1/2012 | Lee et al. |
| 2012/0044099 A1 | 2/2012 | Sekiguchi et al. |
| 2012/0189058 A1 | 7/2012 | Chen et al. |
| 2012/0195514 A1 | 8/2012 | Abe et al. |
| 2012/0224639 A1 | 9/2012 | Lou et al. |
| 2012/0230411 A1 | 9/2012 | Liu |
| 2012/0275523 A1 | 11/2012 | Sato et al. |
| 2012/0287997 A1 | 11/2012 | Kondo et al. |
| 2012/0288008 A1 | 11/2012 | Sato et al. |
| 2012/0288009 A1 | 11/2012 | Sato et al. |
| 2012/0288010 A1 | 11/2012 | Sato et al. |
| 2012/0288011 A1 | 11/2012 | Sato et al. |
| 2012/0294354 A1 | 11/2012 | Sato et al. |
| 2012/0328003 A1 | 12/2012 | Chien et al. |
| 2012/0328010 A1 | 12/2012 | Sasai et al. |
| 2012/0328012 A1 | 12/2012 | Sasai et al. |
| 2012/0328024 A1 | 12/2012 | Kondo et al. |
| 2012/0328209 A1 | 12/2012 | Sasai et al. |
| 2013/0003858 A1 | 1/2013 | Sze |
| 2013/0010862 A1 | 1/2013 | Sato et al. |
| 2013/0010874 A1 | 1/2013 | Sato et al. |
| 2013/0010875 A1 | 1/2013 | Sato et al. |
| 2013/0034166 A1 | 2/2013 | Shiodera et al. |
| 2013/0034167 A1 | 2/2013 | Zheng |
| 2013/0039422 A1 | 2/2013 | Kirchhoffer et al. |
| 2013/0051452 A1 | 2/2013 | Li et al. |
| 2013/0051469 A1 | 2/2013 | Park et al. |
| 2013/0058399 A1 | 3/2013 | Jeon et al. |
| 2013/0064300 A1 | 3/2013 | Jeon et al. |
| 2013/0070850 A1 | 3/2013 | Jeon et al. |
| 2013/0094583 A1 | 4/2013 | Abe et al. |
| 2013/0101045 A1 | 4/2013 | Abe et al. |
| 2013/0107945 A1 | 5/2013 | Sato et al. |
| 2013/0107959 A1 | 5/2013 | Park et al. |
| 2013/0107967 A1 | 5/2013 | Sato et al. |
| 2013/0136172 A1 | 5/2013 | Lim et al. |
| 2013/0177079 A1 | 7/2013 | Kim et al. |
| 2013/0188741 A1 | 7/2013 | Minoo et al. |
| 2013/0279577 A1 | 10/2013 | Schwarz et al. |
| 2013/0308704 A1 | 11/2013 | Park et al. |
| 2013/0329784 A1 | 12/2013 | Chuang et al. |
| 2014/0003495 A1 | 1/2014 | Chuang et al. |
| 2014/0023144 A1 | 1/2014 | Park et al. |
| 2014/0056351 A1 | 2/2014 | Abe et al. |
| 2014/0056359 A1 | 2/2014 | Abe et al. |
| 2014/0064375 A1 | 3/2014 | Kondo et al. |
| 2014/0064376 A1 | 3/2014 | Kondo et al. |
| 2014/0072046 A1 | 3/2014 | Kondo et al. |
| 2014/0072047 A1 | 3/2014 | Kondo et al. |
| 2014/0153649 A1 | 6/2014 | Sato et al. |
| 2014/0219335 A1 | 8/2014 | Lee et al. |
| 2014/0301443 A1 | 10/2014 | Sasai et al. |
| 2014/0341277 A1 | 11/2014 | Jeon et al. |
| 2015/0110188 A1 | 4/2015 | Kondo et al. |
| 2015/0131736 A1 | 5/2015 | Kondo et al. |
| 2015/0139333 A1 | 5/2015 | Lee et al. |
| 2015/0172678 A1 | 6/2015 | Alshina et al. |
| 2015/0172701 A1 | 6/2015 | Kondo et al. |
| 2015/0195536 A1 | 7/2015 | Jeon et al. |
| 2015/0195539 A1 | 7/2015 | Lee et al. |
| 2015/0195585 A1 | 7/2015 | Lee et al. |
| 2015/0195586 A1 | 7/2015 | Lee et al. |
| 2015/0264349 A1 | 9/2015 | Kondo et al. |
| 2015/0264350 A1 | 9/2015 | Kondo et al. |
| 2015/0271518 A1 | 9/2015 | Sato et al. |
| 2015/0373336 A1 | 12/2015 | Sasai et al. |
| 2016/0360197 A1 | 12/2016 | Abe et al. |
| 2016/0360233 A1 | 12/2016 | Abe et al. |
| 2017/0164000 A1 | 6/2017 | Sasai et al. |
| 2017/0188031 A1 | 6/2017 | Lee et al. |
| 2018/0124424 A1 | 5/2018 | Sasai et al. |
| 2018/0192048 A1 | 7/2018 | Abe et al. |

FOREIGN PATENT DOCUMENTS

| | | |
|---|---|---|
| CN | 1640148 | 7/2005 |
| CN | 1650636 | 8/2005 |
| CN | 1791223 | 6/2006 |
| CN | 1910922 | 2/2007 |
| CN | 1922887 | 2/2007 |
| CN | 101001373 | 7/2007 |
| CN | 101014124 | 8/2007 |
| CN | 101076114 | 11/2007 |
| CN | 101218830 | 7/2008 |

(56) References Cited

FOREIGN PATENT DOCUMENTS

| | | |
|---|---|---|
| CN | 101356825 | 1/2009 |
| CN | 101390385 | 3/2009 |
| CN | 101480054 | 7/2009 |
| CN | 101600104 | 12/2009 |
| CN | 101626244 | 1/2010 |
| CN | 101836455 | 9/2010 |
| CN | 101873492 | 10/2010 |
| CN | 101981934 | 2/2011 |
| CN | 102077244 | 5/2011 |
| EP | 1 827 030 | 8/2007 |
| EP | 1 912 443 | 4/2008 |
| EP | 2 015 581 | 1/2009 |
| EP | 2 182 732 | 5/2010 |
| JP | 6225405 | 11/2017 |
| JP | 6308448 | 4/2018 |
| KR | 10-2006-0016243 | 2/2006 |
| RU | 2 330 325 | 7/2008 |
| RU | 2 339 181 | 11/2008 |
| RU | 2 371 881 | 10/2009 |
| RU | 2 423 017 | 5/2010 |
| TW | I324338 | 5/2010 |
| TW | I327030 | 7/2010 |
| TW | I328357 | 8/2010 |
| TW | I329843 | 9/2010 |
| TW | I330976 | 9/2010 |
| WO | 2004/086758 | 10/2004 |
| WO | 2005/076614 | 8/2005 |
| WO | 2006/006936 | 1/2006 |
| WO | 2010/021699 | 2/2010 |
| WO | 2010/125606 | 11/2010 |
| WO | 2012/045886 | 4/2012 |
| WO | 2012/167097 | 12/2012 |
| WO | 2013/005968 | 1/2013 |

OTHER PUBLICATIONS

Thomas Wiegand et al., "WD2: Working Draft 2 of High-Efficiency Video Coding", Joint Collaborative Team on Video Coding (JCT-VC) OF ITU-T SG16 WP3 and ISO/IEC JTC1/SC29/WG11, JCTVC-D503, 4th Meeting: Daegu, KR, Jan. 20-28, 2011.

Frank Bossen, "Common Test Conditions and Software Reference Configurations", Joint Collaborative Team on Video Coding (JCT-VC) OF ITU-T SG16 WP3 and ISO/IEC JTC1/SC29/WG11, JCTVC-E700, 4th Meeting,: Daegu, KR, Jan. 20-28, 2011.

Gisle Bjøntegaard, "Improvements of the BD-PSNR Model", ITU-T SG16/Q6 Document, VCEG-AI11, 35th Meeting: Berlin, Germany, Jul. 16-18, 2008.

Thomas Wiegand et al., "WD3: Working Draft 3 of High-Efficiency Video Coding", Joint Collaborative Team on Video Coding (JCT-VC) of ITU-T SG16 WP3 and ISO/IEC JTC1/SC29/WG11, JCTVC-E603, ver.7, 5th Meeting: Geneva, CH, Mar. 16-23, 2011, http://phenix.int-eviy.fr/jct/doc_end_user/documents/5_Geneva/wg11/JCTVCE-603-v7.zip.

Thomas Wiegand et al., "Joint Final Committee Draft (JFCD) of Joint Video Specification (ITU-T Rec. H.264 | ISO/IEC 14496-10 AVC)", Joint Video Team (JVT) of ISO/IEC MPEG and ITU-T VCEG 4th Meeting: Klagenfurt, Austria, Jul. 22-26, 2002, [JVT-D157].

Xiaoyin Che, Wenpeng Ding, Yunhui Shi, Baocai Yin, "Enhanced Context Modeling for Skip and Split Flag", Joint Collaborative Team on Video Coding (JCT-VC) of ITU-T SG16 WP3 and ISO/IEC JTC1/SC29/WG11 4th Meeting: Daegu, KR, Jan. 20-28, 2011, [JCTVC-D254].

Thomas Wiegand et al., "WD3: Working Draft 3 of High-Efficiency Video Coding", Joint Collaborative Team on Video Coding (JCT-VC) of ITU-T SG16 WP3 and ISO/IEC JTC1/SC29/WG11, JCTVC-E603, Ver.8, 5th Meeting: Geneva, CH, Mar. 16-23, 2011.

International Search Report dated Sep. 25, 2012 in International (PCT) Application No. PCT/JP2012/004061.

International Search Report dated Sep. 25, 2012 in International (PCT) Application No. PCT/JP2012/004068.

International Search Report dated Sep. 25, 2012 in International (PCT) Application No. PCT/JP2012/004046.

International Search Report dated Sep. 25, 2012 in International (PCT) Application No. PCT/JP2012/004047.

International Search Report dated Sep. 25, 2012 in International (PCT) Application No. PCT/JP2012/004051.

International Search Report dated Sep. 25, 2012 in International (PCT) Application No. PCT/JP2012/004060.

International Search Report dated Sep. 25, 2012 in International (PCT) Application No. PCT/JP2012/004063.

International Search Report dated Sep. 25, 2012 in International (PCT) Application No. PCT/JP2012/004067.

International Search Report dated Oct. 2, 2012 in International (PCT) Application No. PCT/JP2012/004407.

Extended European Search Report dated Oct. 22, 2014 in European Patent Application No. 12802482.5.

Extended European Search Report dated Nov. 4, 2014 in European Patent Application No. 12804632.3.

Extended European Search Report dated Nov. 4, 2014 in European Patent Application No. 12803936.9.

Extended European Search Report dated Nov. 4, 2014 in European Patent Application No. 12804513.5.

Extended European Search Report dated Nov. 4, 2014 in European Patent Application No. 12802462.7.

Extended European Search Report dated Dec. 12, 2014 in European Patent Application No. 12811252.1.

Vivienne Sze et al., "Joint Algorithm-Architecture Optimization of CABAC", Joint Collaborative Team on Video Coding (JCT-VC) of ITU-T SG16 WP3 and ISO/IEC JTC1/SC29/WG11, JCTVC-E324, 5th Meeting: Geneva, CH, Mar. 16-23, 2011.

Hisao Sasai et al., "Modified Context Derivation for Complexity reduction", Joint Collaborative Team on Video Coding (JCT-VC) of ITU-T SG16 WP3 and ISO/IEC JTC1/SC29/WG11, JCTVC-F429, 6th Meeting: Torino, IT, Jul. 14-22, 2011, (Version 1).

Jianle Chen et al., "Simplified context model selection for block level syntax coding", Joint Collaborative Team on Video Coding (JCT-VC) of ITU-T SG16 WP3 and ISO/IEC JTC1/SC29/WG11, JCTVC-F497, 6th Meeting: Torino, IT, Jul. 14-22, 2011, (Version 1).

Thomas Wiegand et al., "WD3: Working Draft 3 of High-Efficiency Video Coding", Joint Collaborative Team on Video Coding (JCT-VC) of ITU-T SG16 WP3 and ISO/IEC JTC1/SC29/WG11, JCTVC-E603_d3, 5th Meeting: Geneva, CH, May 1, 2011, (Version 3).

Thomas Wiegand et al., "WD3: Working Draft 3 of High-Efficiency Video Coding", Joint Collaborative Team on Video Coding (JCT-VC) of ITU-T SG16 WP3 and ISO/IEC JTC1/SC29/WG11, JCTVC-E603, 5th Meeting: Geneva, CH, Mar. 16-23, 2011.

Ken McCann et al.,"HM3: High Efficiency Video Coding (HEVC) Test Model 3 Encoder Description", Joint Collaborative Team on Video Coding (JCT-VC) of ITU-T SG16 WP3 and ISO/IEC JTC1/SC29/WG11, JCTVC-E602, 5th Meeting: Geneva, CH, Mar. 16-23, 2011, XP030009013.

Wei-Jung Chen et al.,"CE5:Improved coding of inter prediction mode with LCEC", Joint Collaborative Team on Video Coding (JCT-VC) of ITU-T SG16 WP3 and ISO/IEC JTC1/SC29/WG11, JCTVC-D370, 4th Meeting: Daegu, KR, Jan. 20-28, 2011, XP030008409.

Virginie Drugeon et al., "Improvement of inter mode coding and split flags coding for LCEC", Joint Collaborative Team on Video Coding (JCT-VC) of ITU-T SG16 WP3 and ISO/IEC JTC1/SC29/WG11, JCTVC-E258, 5th Meeting: Geneva, CH, Mar. 16-23, 2011.

Bin Li et al., "Adaptive coding order for skip and split flags in LCEC", Joint Collaborative Team on Video Coding (JCT-VC) of ITU-T SG16 WP3 and ISO/IEC JTC1/SC29/WG11, JCTVC-D140, 4th Meeting: Daegu, KR, Jan. 20-28, 2011.

Toshiyasu Sugio et al., "Parsing Robustness for Merge / AMVP", Joint Collaborative Team on Video Coding (JCT-VC) of ITU-T SG16 WP3 and ISO/IEC JTC1/SC29/WG11, JCTVC-F470, 6th Meeting: Torino, IT, Jul. 14-22, 2011, XP030009493.

Wei-Jung Chien et al., "Memory and Parsing Friendly CABAC Context", Joint Collaborative Team on Video Coding (JCT-VC) of ITU-T SG16 WP3 and ISO/IEC JTC1/SC29/WG11, JCTVC-F606, 6th Meeting: Torino, IT, Jul. 14-22, 2011, XP030009629.

(56) References Cited

OTHER PUBLICATIONS

Jian Lou et al., "On context selection for significant_coeff_flag coding", Joint Collaborative Team on Video Coding (JCT-VC) of ITU-T SG16 WP3 and ISO/IEC JTC1/SC29/WG11, JCTVC-E362, 5th Meeting: Geneva, CH, Mar. 16-23, 2011, XP030008868.

Vivienne Sze et al., "Reduced neighboring dependency in context selection of significant_coeff_flag for parallel processing", Joint Collaborative Team on Video Coding (JCT-VC) of ITU-T SG16 WP3 and ISO/IEC JTC1/SC29/WG11, JCTVC-E330, 5th Meeting: Geneva, CH, Mar. 16-23, 2011, XP030008836.

Vivienne Sze et al., "Joint Algorithm-Architecture Optimization of CABAC to Increase Speed and Reduce Area Cost", 2011 IEEE International Conference on Acoustics, Speech and Signal Processing (ICASSP), May 22, 2011, pp. 1577-1580, XP032001128.

Thomas Wiegand, "Text of Final Committee Draft of Joint Video Specification (ITU-T Rec. H.264| ISO/IEC 14496-10 AVC)", Motion Picture Expert Group or ISO/IEC JTC1/SC29/WG11), No. N4920, Aug. 11, 2002, XP030012343.

Thomas Wiegand et al., "WD3: Working Draft 3 of High-Efficiency Video Coding", Joint Collaborative Team on Video Coding (JCT-VC) of ITU-T SG16 WP3 and ISO/IEC JTC1/SC29/WG11, JCTVC-E603, 5th Meeting: Geneva, CH, Mar. 16-23, 2011, XP055146641.

Vivienne Sze et al., "CE11: Simplified context selection for significant_coeff_flag (JCTVC-C227)", Joint Collaborative Team on Video Coding (JCT-VC) of ITU-T SG16 WP3 and ISO/IEC JTC1/SC29/WG11, JCTVC-D195, 4th Meeting: Daegu, KR, Jan. 20-28, 2011, XP030008235.

Gary Sullivan et al., "Meeting report of the fifth meeting of the Joint Collaborative Team on Video Coding (JCT-VC), Geneva, CH, Mar. 16-23, 2011", Joint Collaborative Team on Video Coding (JCT-VC) of ITU-T SG16 WP3 and ISO/IEC JTC1/SC29/WG11, JCTVC-E_Notes_d6, 5th Meeting: Geneva, CH, Mar. 16-23, 2011, XP030009012.

Thomas Wiegand et al., "WD2: Working Draft 2 of High-Efficiency Video Coding", Joint Collaborative Team on Video Coding (JCT-VC) of ITU-T SG16 WP3 and ISO/IEC JTC1/SC29/WG11, JCTVC-D503, 4th Meeting: Daegu, KR, Jan. 20-28, 2011, XP030113315.

Thomas Wiegand, "Joint Final Committee Draft (JFCD) of Joint Video Specification (ITU-T Rec. H.264 | ISO/IEC 14496-10 AVC)", Joint Video Team (JVT) of ISO/IEC MPEG and ITU-T VCEG, JVT-D157, 4th Meeting: Klagenfurt, Austria; Jul. 22-26, 2002, XP030005420.

Hisao Sasai et al., "Modified MVD coding for CABAC", Joint Collaborative on Video Coding (JCT-VC) of ITU-T SG16 WP3 and ISO/IEC JTC1/SC29/WG11, JCTVC-F423, 6th Meeting: Torino, IT, Jul. 14-22, 2011, XP030049414.

Vivienne Sze et al., "Simplified MVD context selection (Extension of E324)", Joint Collaborative Team on Video Coding (JCT-VC) of ITU-T SG16 WP3 and ISO/IEC JTC1/SC29/WG11, JCTVC-F133, 6th Meeting: Torino, IT, Jul. 14-22, 2011, XP030009156.

Vivienne Sze, "BoG report on context reduction for CABAC", Joint Collaborative Team on Video Coding (JCT-VC) of ITU-T SG16 WP3 and ISO/IEC JTC1/SC29/WG11, JCTVC-F746, 6th Meeting: Torino, IT, Jul. 14-22, 2011, XP030009769.

Jianle Chen et al., "Simplified context model selection for block level syntax coding", Joint Collaborative Team on Video Coding (JCT-VC) of ITU-T SG16 WP3 and ISO/IEC JTC1/SC29/WG11, JCTVC-F497, 6th Meeting: Torino, IT, Jul. 14-22, 2011, pp. 1-8.

Xiaoyin Che et al., "Enhanced Context Modeling for Skip and Split Flag", Joint Collaborative Team on Video Coding (JCT-VC) of ITU-T SG16 WP3 and ISO/IEC JTC1/SC29/WG11, JCTVC-D254, 4th Meeting: Daegu, KR, Jan. 20-28, 2011, pp. 1-4.

Office Action dated Sep. 17, 2015 in U.S. Appl. No. 13/544,061.

Wei-Jung Chien et al., "Memory and Parsing Friendly CABAC Context", Joint Collaborative Team on Video Coding (JCT-VC) of ITU-T SG16 WP3 and ISO/IEC JTC1/SC29/WG11, JCTVC-F606, 6th Meeting: Torino, IT, Jul. 14-22, 2011.

Auyeung et al., "Parallel processing friendly simplified context selection of significance map," Joint Collaborative Team on Video Coding (JCT-VC) of ITU-T SG16 WP3 and ISO/IEC JTC1/SC29/WG11, 4$^{th}$ Meeting: Daegu, KR, Jan. 20-28, 2011, JCTVC-D260, XP030008300.

Chien et al., "Memory and Parsing Friendly CABAC Context," Joint Collaborative Team on Video Coding (JCT-VC) of ITU-T SG16 WP3 and ISO/IEC JTC1/SC29/WG11, 6$^{th}$ Meeting: Torino, IT, Jul. 14-22, 2011, JCTVC-F606_r1.

Sasai et al., "Modified Context Derivation for Complexity reduction," Joint Collaborative Team on Video Coding (JCT-VC) of ITU-T SG16 WP3 and ISO/IEC JTC1/SC29/WG11, 6$^{th}$ Meeting: Torino, IT, Jul. 14-22, 2011, JCTVC-F429_r1.

Official Communication dated Jun. 23, 2016 in European Patent Application No. 12803936.9.

Official Communication dated Jun. 23, 2016 in European Patent Application No. 12804513.5.

Patent Examination Report No. 2 dated Jul. 1, 2016 in Australian Patent Application No. 2012277219.

Benjamin Bross et al., "WD4: Working Draft 4 of High-Efficiency Video Coding", Joint Collaborative Team on Video Coding (JCT-VC) of ITU-T SG16 WP3 and ISO/IEC JTC1/SC29/WG11 6th Meeting: Torino, IT, Oct. 28, 2011, [JCTVC-F803_d5](version 7), pp. 189-192.

Office Action dated Aug. 9, 2016 in Philippines patent application No. 1-2013-502458.

Office Action dated Aug. 15, 2016 in MY patent application No. PI2013702238.

Office Action dated Oct. 11, 2016 in Philippines patent application No. 1-2013-502502.

Office Action dated Jan. 19, 2017 in U.S. Appl. No. 15/244,336.

Office Action dated Jan. 25, 2017 in Philippines Patent Application No. 1-2013-502458.

Office Action dated Jan. 13, 2017 in Malaysia Patent Application No. PI2013702266.

Office Action dated Mar. 10, 2017 in U.S. Appl. No. 15/330,776.

Office Action dated Mar. 27, 2017 in U.S. Appl. No. 14/709,967.

Notice of Allowance dated Jun. 16, 2017 in U.S. Appl. No. 14/709,967.

Office Action dated Jun. 21, 2017 in U.S. Appl. No. 15/143,896.

Office Action dated Jun. 30, 2017 in U.S. Appl. No. 15/412,450.

Office Action dated Jul. 31, 2017 in Malaysian Patent Application No. PI 2013702265.

Office Action dated Aug. 30, 2017 in Malaysian Patent Application No. PI 2013702279.

Office Action dated Oct. 9, 2017 in European Patent Application No. 12 811 252.1.

Office Action dated Sep. 22, 2017 in European Patent Application No. 12 802 482.5.

Office Action dated Nov. 22, 2017 in U.S. Appl. No. 15/143,896.

Office Action dated Dec. 1, 2017 in U.S. Appl. No. 15/697,652.

Office Action dated Jan. 8, 2018 in Canadian Patent Application No. 2,837,537.

Office Action dated Feb. 26, 2018 in U.S. Appl. No. 15/699,115.

Office Action dated Mar. 13, 2018 in U.S. Appl. No. 14/967,437.

Office Action dated Mar. 12, 2018 in U.S. Appl. No. 15/457,275.

Summons to attend oral proceedings dated Apr. 6, 2018 in European Application No. 12804513.5.

Office Action dated Apr. 9, 2018 in U.S. Appl. No. 15/168,529.

Office Action dated Apr. 6, 2018 in U.S. Appl. No. 15/168,806.

Office Action dated Apr. 10, 2018 in U.S. Appl. No. 15/168,867.

Summons to attend oral proceedings dated Apr. 10, 2018 in European Application No. 12803936.9.

Office Action dated Feb. 7, 2019 in U.S. Appl. No. 15/861,222.

Bin Li et al., "On merge candidate construction", Joint Collaborative Team on Video Coding (JCT-VC) of ITU-T SG16 WP3 and ISO/IEC JTC1/SC29/WG11, 5th Meeting: Geneva, CH, Mar. 16-23, 2011, JCTVC-E146_r3, pp. 1-5 (Version4).

Jianle Chen and Tammy Lee, "Simplified context model selection for block level syntax coding", Joint Collaborative Team on Video Coding (JCT-VC) of ITU-T SG16 WP3 and ISO/IEC JTC1/SC29/WG11, 6th Meeting: Torino, IT, Jul. 14-22, 2011, JCTVC-F497, pp. 1-8 (Version2).

Office Action issued for Indian Patent Application No. 9480/CHENP/2013 dated Oct. 23, 2018.

(56) References Cited

OTHER PUBLICATIONS

Summons to attend oral proceedings dated Nov. 14, 2018 in European Application No. 12811252.1.
Office Action dated Dec. 3, 2018 in U.S. Appl. No. 15/168,529.
Test Model under Consideration, JCTVC-B205, Jul. 21-28, 2010.
Office Action dated Dec. 3, 2018 in U.S. Appl. No. 15/168,806.
Office Action dated Mar. 18, 2019 in Indian Patent Application No. 8536/CHENP/2013.
Office Action dated May 23, 2019 in Indian Patent Application No. 9470/CHENP/2013.
Office Action dated Jun. 28, 2019 in Indian Patent Application No. 9693/CHENP/2013.
Office Action dated Jul. 18, 2019 in U.S. Appl. No. 16/452,842.
Office Action dated Feb. 25, 2019 in Indian Patent Application No. 9491/CHENP/2013.
Machine Translation of DE 59510488 published Jan. 16, 2003.
Office Action dated Aug. 14, 2019 in U.S. Appl. No. 15/861,222.
Notice of Allowance dated Oct. 16, 2019 in U.S. Appl. No. 16/232,517.
Office Action issued for Indian Patent Application No. 9467/CHENP/2013 dated Nov. 1, 2019.
Thomas Wiegand, "Editor's Proposed Draft Text Modifications for Joint Video Specification (ITU-T Rec. H.264 | ISO/IEC 14496-10 AVC), Draft 7", Joint Video Team (JVT) of ISO/IEC MPEG and ITU-T VCEG, JVT-E022d7, 5th Meeting: Geneva, Switzerland; Oct. 9-17, 2002.
B. Bross, et al., "WD4: Working Draft 4 of High-Efficiency Video Coding", JCT-VC of ITU-T and ISO/IEC, JCTVC-F803 Ver. 8, Nov. 20, 2011, pp. 1-216.
Notice of Allowance dated Jan. 28, 2020 in U.S. Appl. No. 16/202,931.
Hearing Notice dated Apr. 23, 2020 issued for Indian Patent Application No. 9693/CHENP/2013.
Summons to attend oral proceedings dated Jun. 17, 2020 in European Application No. 12 804 632.3.
Official Communication dated Jun. 15, 2020 issued in European Application No. 12 802 462.7.
Hearing Notice dated Jul. 16, 2020 issued for Indian Patent Application No. 9480/CHENP/2013.

FIG. 3

| | c2<br>Signal type | c3<br>Binarization scheme | c4<br>Context model for first element | c5<br>Left block condition L<br>condL | c6<br>Upper block condition A<br>condA |
|---|---|---|---|---|---|
| s1 | split_coding_unit_flag | Fixed length | 0, 1, or 2<br>(condL && availableL)<br>+ (condA && availableA) | cuDepth[xL][yL] ><br>cuDepth[xP][yP] | cuDepth[xA][yA] ><br>cuDepth[xP][yP] |
| s2 | skip_flag | Fixed length | 0, 1, 2 | skip_flag[xL][yL] | skip_flag[xA][yA] |
| s3 | merge_flag | Fixed length | 0, 1, 2 | merge_flag[xL][yL] | merge_flag[xA][yA] |
| s4 | intra_chroma_pred_mode | Variable length | 0, 1, 2 | IntraPredMode[xL][yL] == 4 | IntraPredMode[xA][yA] == 4 |
| s5 | inter_pred_flag | Fixed length | 0, 1, 2 | inter_pred_flag[xL][yL] | inter_pred_flag[xA][yA] |
| s6 | mvd_lc<br>mvd_l0<br>mvd_l1 | Variable length | 0, 1, 2 | mvd_lc[xL][yL] > 16<br>mvd_l0[xL][yL] > 16<br>mvd_l1[xL][yL] > 16 | mvd_lc[xA][yA] > 16<br>mvd_l0[xA][yA] > 16<br>mvd_l1[xA][yA] > 16 |
| s7 | ref_idx_lc<br>ref_idx_l0<br>ref_idx_l1 | Variable length | 0, 1, 2, or 3<br>(condL && availableL) +<br>(condA && availableA) << 1 | ref_idx_lc[xL][yL] > 0<br>ref_idx_l0[xL][yL] > 0<br>ref_idx_l1[xL][yL] > 0 | ref_idx_lc[xA][yA] > 0<br>ref_idx_l0[xA][yA] > 0<br>ref_idx_l1[xA][yA] > 0 |
| s8 | Cbf_cb(MODE_INTRA)<br>Cbf_cr(MODE_INTRA) | Fixed length | 0, 1, 2, 3 | cbf_cb[xL][yL]<br>cbf_cr[xL][yL] | cbf_cb[xA][yA]<br>cbf_cr[xA][yA] |
| s9 | Cbf_luma | Fixed length | 0, 1, 2, 3 | cbf_luma[xL][yL] | cbf_luma[xA][yA] |
| s10 | no_residual_data_flag | Fixed length | 0, 1, 2 | no_residual_data_flag[xL][yL] | no_residual_data_flag[xA][yA] |
| NA | alf_cu_flag | 1bin | | alf_cu_flag[xL][yL] | alf_cu_flag[xA][yA] |

FIG. 11

| Verification pattern | Signal type (syntax element) | Binarization scheme | Context index increment of binary sequence element (binIdx = 0) | c5 Left block condition L condL | c6 Upper block condition A condA |
|---|---|---|---|---|---|
| Pattern 1 | split_coding_unit_flag | Fixed length | 0, 1, or 2 (condL && availableL) + (condA && availableA) | cuDepth[xL][yL] > cuDepth[xP][yP] | cuDepth[xA][yA] > cuDepth[xP][yP] |
| Pattern 2 | | | 0 or 1 (condL && availableL) | cuDepth[xL][yL] > cuDepth[xP][yP] | Fixed (not held in memory) |
| Pattern 3 | | | Fixed to 0 | Fixed | Fixed (not held in memory) |

FIG. 12A

Pattern 2: using only left block (split_coding_unit_flag)

|  | Intra | | | Random access | | | Low delay | | | Low delay (P) | | |
|---|---|---|---|---|---|---|---|---|---|---|---|---|
|  | Y BD-rate | U BD-rate | V BD-rate | Y BD-rate | U BD-rate | V BD-rate | Y BD-rate | U BD-rate | V BD-rate | Y BD-rate | U BD-rate | V BD-rate |
| Class A | 0.02 | −0.07 | 0.04 | 0.09 | 0.56 | −0.12 | 0.15 | 0.33 | 0.28 | 0.16 | 0.17 | −0.13 |
| Class B | 0.02 | 0.04 | 0.03 | 0.06 | 0.08 | 0.18 | 0.16 | 0.22 | 0.08 | 0.25 | 0.23 | 0.69 |
| Class C | 0.03 | 0.09 | 0.06 | 0.18 | 0.16 | 0.20 | 0.06 | 0.35 | 0.87 | 0.12 | −0.21 | 0.85 |
| Class D | 0.05 | −0.05 | 0.06 | 0.32 | 0.39 | 0.18 | 0.36 | 0.79 | −0.89 | 0.38 | 0.90 | −0.72 |
| Class E | 0.13 | −0.02 | 0.01 |  |  |  |  |  |  |  |  |  |
| All | 0.05 | 0.01 | 0.03 | 0.17 | 0.18 | 0.18 | 0.17 | 0.40 | 0.16 | 0.21 | 0.22 | 0.21 |
| Enc Time [%] | 100 % | | | 99 % | | | 99 % | | | 99 % | | |
| Dec Time [%] | 101 % | | | 103 % | | | 102 % | | | 103 % | | |

FIG. 12B

Pattern 3: using neither left block nor upper block (split_coding_unit_flag)

|  | Intra | | | Random access | | | Low delay | | | Low delay (P) | | |
|---|---|---|---|---|---|---|---|---|---|---|---|---|
|  | Y BD-rate | U BD-rate | V BD-rate | Y BD-rate | U BD-rate | V BD-rate | Y BD-rate | U BD-rate | V BD-rate | Y BD-rate | U BD-rate | V BD-rate |
| Class A | 0.05 | −0.05 | 0.01 | 0.15 | 0.56 | −0.27 | 0.32 | 0.20 | 0.53 | 0.36 | 0.27 | 0.54 |
| Class B | 0.11 | −0.01 | 0.04 | 0.23 | 0.16 | 0.49 | 0.32 | 0.20 | 0.35 | 0.22 | 0.05 | 0.52 |
| Class C | 0.04 | 0.09 | 0.13 | 0.18 | 0.46 | 0.23 | 0.25 | 0.57 | 0.65 | 0.26 | 0.41 | 0.46 |
| Class D | 0.07 | −0.05 | 0.02 | 0.29 | −0.13 | −0.05 | 0.65 | 0.44 | −0.65 | 0.61 | 1.03 | −0.06 |
| Class E | 0.20 | −0.13 | −0.33 |  |  |  |  |  |  |  |  |  |
| All | 0.10 | −0.01 | −0.01 | 0.24 | 0.17 | 0.22 | 0.36 | 0.34 | 0.29 | 0.35 | 0.39 | 0.41 |
| Enc Time [%] | 100 % | | | 99 % | | | 99 % | | | 99 % | | |
| Dec Time [%] | 101 % | | | 103 % | | | 103 % | | | 103 % | | |

FIG. 13

| Verification number | Signal type (syntax element) | Binarization scheme | Context index increment of binary sequence element (binIdx = 0) | c5<br>Left block condition L<br>condL | c6<br>Upper block condition A<br>condA |
|---|---|---|---|---|---|
| Pattern 1 | skip_flag | Fixed length | 0, 1, 2 | skip_flag[xL][yL] | skip_flag[xA][yA] |
| Pattern 2 | | | 0 or 1 | skip_flag[xL][yL] | Fixed |
| Pattern 3 | | | Fixed to 0 | Fixed | Fixed |

FIG. 14A

Pattern 2: using only left block (skip_flag)

| | Intra | | | Random access | | | Low delay | | | Low delay (P) | | |
|---|---|---|---|---|---|---|---|---|---|---|---|---|
| | Y BD-rate | U BD-rate | V BD-rate | Y BD-rate | U BD-rate | V BD-rate | Y BD-rate | U BD-rate | V BD-rate | Y BD-rate | U BD-rate | V BD-rate |
| Class A | 0.00 | 0.00 | 0.00 | 0.05 | -0.23 | -0.01 | 0.12 | 0.21 | 0.23 | 0.07 | -0.03 | -0.04 |
| Class B | 0.00 | 0.00 | 0.00 | 0.11 | 0.03 | 0.02 | 0.08 | 0.24 | 0.11 | 0.11 | 0.19 | 0.44 |
| Class C | 0.00 | 0.00 | 0.00 | 0.06 | 0.16 | 0.10 | 0.09 | 0.39 | 0.07 | 0.26 | -0.09 | 0.37 |
| Class D | 0.00 | 0.00 | 0.00 | 0.11 | -0.11 | -0.10 | 0.03 | 0.13 | -0.33 | 0.28 | 0.32 | 0.16 |
| Class E | 0.00 | 0.00 | 0.00 | | | | | | | | | |
| All | 0.00 | 0.00 | 0.00 | 0.09 | -0.02 | -0.02 | 0.08 | 0.25 | 0.05 | 0.17 | 0.07 | 0.22 |
| Enc Time [%] | 1.00 | | | 0.99 | | | 0.99 | | | 0.99 | | |
| Dec Time [%] | 101 % | | | 103 % | | | 102 % | | | 103 % | | |

FIG. 14B

Pattern 3: using neither left block nor upper block (skip_flag)

| | Intra | | | Random access | | | Low delay | | | Low delay (P) | | |
|---|---|---|---|---|---|---|---|---|---|---|---|---|
| | Y BD-rate | U BD-rate | V BD-rate | Y BD-rate | U BD-rate | V BD-rate | Y BD-rate | U BD-rate | V BD-rate | Y BD-rate | U BD-rate | V BD-rate |
| Class A | 0.00 | 0.00 | 0.00 | 0.11 | 0.11 | -0.04 | 0.20 | 0.45 | 0.15 | 0.17 | 0.32 | 0.36 |
| Class B | 0.00 | 0.00 | 0.00 | 0.21 | 0.06 | 0.14 | -0.01 | 0.06 | 0.12 | 0.15 | 0.03 | 0.18 |
| Class C | 0.00 | 0.00 | 0.00 | 0.04 | 0.20 | -0.17 | 0.26 | 0.20 | 0.26 | 0.16 | -0.32 | -0.18 |
| Class D | 0.00 | 0.00 | 0.00 | 0.15 | -0.31 | -0.08 | 0.22 | -0.05 | -0.20 | 0.31 | 0.31 | -0.07 |
| Class E | 0.00 | 0.00 | 0.00 | | | | | | | | | |
| All | 0.00 | 0.00 | 0.00 | 0.14 | -0.00 | -0.02 | 0.17 | 0.20 | 0.11 | 0.19 | 0.09 | 0.10 |
| Enc Time [%] | 1.00 | | | 0.99 | | | 0.99 | | | 0.99 | | |
| Dec Time [%] | 101 % | | | 103 % | | | 102 % | | | 103 % | | |

FIG. 15

| Verification number | Signal type (syntax element) | Binarization scheme | Context index increment of binary sequence element (binIdx = 0) | c5 Left block condition L condL | c6 Upper block condition A condA |
|---|---|---|---|---|---|
| Pattern 1 | Cbf_cb(MODE_INTRA) | Fixed length | 0, 1, 2, or 3<br>00: condAfalse condLfalse<br>01: condAfalse condL_true<br>10: condA_true condLfalse<br>11: condA_true condL_true | Cbf_cb[xL][yL] | Cbf_cb[xA][yA] |
| Pattern 1 | Cbf_cr(MODE_INTRA) | | | Cbf_cr[xL][yL] | Cbf_cr[xA][yA] |
| Pattern 1 | Cbf_luma | | | Cbf_luma[xL][yL] | Cbf_luma[xA][yA] |
| Pattern 2 | Cbf_cb(MODE_INTRA) | | fixed_0: condLfalse<br>fixed_1: condLtrue | Cbf_cb[xL][yL] | Fixed |
| Pattern 2 | Cbf_cr(MODE_INTRA) | | | Cbf_cr[xL][yL] | Fixed |
| Pattern 2 | Cbf_luma | | | Cbf_luma[xL][yL] | Fixed |
| Pattern 3 | Cbf_cb(MODE_INTRA) | | Fixed | Fixed | Fixed |
| Pattern 3 | Cbf_cr(MODE_INTRA) | | | | |
| Pattern 3 | Cbf_luma | | | | |

FIG. 16A

Pattern 2: using only left block (cbf_luma, cbf_cr, cbf_cb)

|  | Intra ||| Random access |||| Low delay |||| Low delay (P) ||||
|---|---|---|---|---|---|---|---|---|---|---|---|---|---|---|---|
|  | Y BD-rate | U BD-rate | V BD-rate | Y BD-rate | U BD-rate | V BD-rate | | Y BD-rate | U BD-rate | V BD-rate | | Y BD-rate | U BD-rate | V BD-rate | |
| Class A | 0.01 | 0.05 | 0.02 | -0.01 | 0.45 | -0.26 | | | | | | | | | |
| Class B | 0.02 | 0.05 | 0.10 | -0.03 | -0.05 | 0.08 | | -0.06 | 0.16 | 0.18 | | -0.08 | 0.26 | 0.47 | |
| Class C | 0.02 | 0.12 | 0.06 | -0.11 | 0.39 | -0.03 | | -0.07 | -0.02 | -0.15 | | 0.00 | 0.06 | 0.31 | |
| Class D | 0.02 | -0.03 | 0.06 | 0.14 | -0.52 | 0.04 | | -0.01 | 0.58 | -0.13 | | 0.03 | 0.19 | -0.43 | |
| Class E | 0.03 | 0.13 | 0.18 | | | | | -0.04 | -0.52 | -1.42 | | 0.00 | -0.12 | -1.21 | |
| All | 0.02 | 0.06 | 0.08 | -0.00 | -0.05 | 0.01 | | -0.04 | 0.09 | -0.28 | | -0.02 | 0.12 | -0.11 | |
| Enc Time [%] | 100 % |||| 99 % |||| 99 % |||| 99 % ||||
| Dec Time [%] | 101 % |||| 103 % |||| 103 % |||| 103 % ||||

FIG. 16B

Pattern 3: using neither left block nor upper block (cbf_luma, cbf_cr, cbf_cb)

|  | Intra ||| Random access |||| Low delay |||| Low delay (P) ||||
|---|---|---|---|---|---|---|---|---|---|---|---|---|---|---|---|
|  | Y BD-rate | U BD-rate | V BD-rate | Y BD-rate | U BD-rate | V BD-rate | | Y BD-rate | U BD-rate | V BD-rate | | Y BD-rate | U BD-rate | V BD-rate | |
| Class A | 0.04 | 0.06 | 0.15 | -0.04 | 0.37 | -0.13 | | | | | | | | | |
| Class B | 0.07 | 0.10 | 0.15 | -0.00 | 0.23 | -0.06 | | 0.06 | 0.46 | 0.20 | | 0.04 | 0.38 | 0.32 | |
| Class C | 0.03 | 0.13 | 0.20 | -0.09 | 0.59 | 0.53 | | -0.06 | 0.23 | 0.35 | | 0.06 | 0.24 | 0.53 | |
| Class D | -0.00 | 0.07 | 0.19 | 0.12 | 0.16 | 0.19 | | -0.09 | 0.90 | -0.79 | | 0.03 | 0.17 | -0.77 | |
| Class E | 0.12 | 0.14 | 0.26 | | | | | 0.02 | -0.13 | -1.29 | | 0.05 | -0.45 | -0.42 | |
| All | 0.05 | 0.10 | 0.19 | 0.01 | 0.30 | 0.15 | | -0.02 | 0.40 | -0.29 | | 0.04 | 0.14 | -0.04 | |
| Enc Time [%] | 100 % |||| 99 % |||| 99 % |||| 99 % ||||
| Dec Time [%] | 101 % |||| 103 % |||| 103 % |||| 103 % ||||

FIG. 25

| |
|---|
| Video stream (PID=0x1011, Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00, Secondary video) |
| Video stream (PID=0x1B01, Secondary video) |

FIG. 28
Stream of TS packets
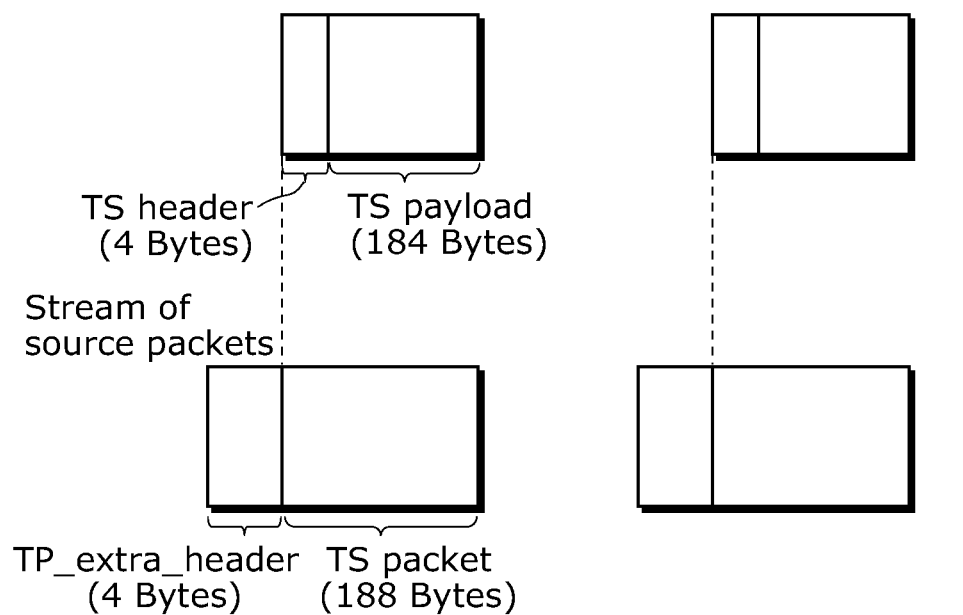
Multiplexed data
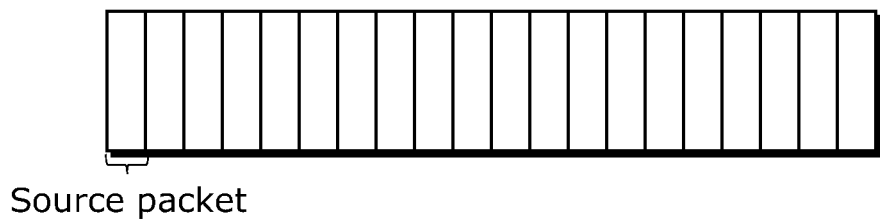

Data structure of PMT

FIG. 36

| Corresponding standard | Driving frequency |
|---|---|
| MPEG-4 AVC | 500 MHz |
| MPEG-2 | 350 MHz |
| ⋮ | ⋮ |

IMAGE DECODING METHOD, IMAGE CODING METHOD, IMAGE DECODING APPARATUS, IMAGE CODING APPARATUS, AND IMAGE CODING AND DECODING APPARATUS

TECHNICAL FIELD

The present invention relates to an image decoding method, an image coding method, an image decoding apparatus, an image coding apparatus, and an image coding and decoding apparatus, and in particular to an image decoding method, an image coding method, an image decoding apparatus, an image coding apparatus, and an image coding and decoding apparatus which use arithmetic coding or arithmetic decoding.

BACKGROUND ART

Natural image signals have statistical variations showing nonstationary behavior. One of the entropy coding methods using the nonstationary statistical variations is Context-Based Adaptive Binary Arithmetic Coding (CABAC) (see NPL 1). CABAC is employed as the ITU-T/ISOIEC standard for video coding, H.264/AVC.

The meaning of the terms used in the CABAC scheme will be described hereinafter.

(1) "Context-Based Adaptive" means adapting the coding and decoding methods to the statistical variations. In other words, "Context-Based Adaptive" means predicting an appropriate probability as an occurrence probability of a symbol along with an event of surrounding conditions, when the symbol is coded or decoded. In coding, when an occurrence probability p(x) of each value of a symbol S is determined, a conditional occurrence probability is applied using an actual event or a sequence of events F(z) as a condition.

(2) "Binary" means representation of a symbol using a binary sequence. A symbol represented by a multi-value is once mapped to a binary sequence referred to as "bin string". A predicted probability (conditional probability) is switched and used for each of the sequence elements, and occurrence of one of the events of the two values is represented by a bit sequence. Accordingly, the probability of a value can be managed (initialized and updated) using a unit (binary element unit) smaller than a unit of a signal type (see FIG. 2 and others of NPL 1).

(3) "Arithmetic" means that the bit sequence is generated not with reference to the correspondences in a table but by the computation. In the coding scheme using the tables of variable-length codes such as H.263, MPEG-4, and H.264, even each value of a symbol with an occurrence probability greater than 0.5 (50%) needs to be associated with one binary sequence (bit sequence). Thus, a value with the greatest probability needs to be associated with one bit for one symbol at minimum. In contrast, the arithmetic coding can represent the occurrence of an event with a higher probability by an integer equal to or smaller than one bit. When (i) there is a signal type in which the occurrence probability of having the first binary value as 0 exceeds 0.9 (90%) and (ii) an event having the first binary value as 0 successively occurs N times, there is no need to output data of 1 bit N times for each value of "0".

CITATION LIST

Non Patent Literature

[NPL 1] Detlev Marpe, et. al., "Context-Based Adaptive Binary Arithmetic Coding in the H.264/AVC Video Compression Standard", IEEE Transaction on circuits and systems for video technology, Vol. 13, No. 7, July 2003.

[NPL 2] Joint Collaborative Team on Video Coding (JCT-VC) of ITU-T SG16 WP3 and ISO/IEC JTC1/SC29/WG11, 5th Meeting: Geneva, CH, 16-23 Mar. 2011, JCTVC-E603, ver.7 "WD3: Working Draft 3 of High-Efficiency Video Coding", http://phenix.int-evry.fr/jct/doc_end_user/documents/5_Geneva/wg 11/JCTVC-E603-v7.zip

[NPL 3] Joint Collaborative Team on Video Coding (JCT-VC) of ITU-T SG16 WP3 and ISO/IEC JTC1/SC29/WG11, 4th Meeting: Daegu, KR, 20-28 Jan. 2011, "Common test conditions and software reference configurations", JCTVC-E700

[NPL 4] Gisle Bjøntegaard, "Improvements of the BD-PSNR model," ITU-T SG16 Q.6 Document, VCEG-AI11, Berlin, July 2008

SUMMARY OF INVENTION

Technical Problem

In such an image coding method and an image decoding method, memory usage (memory capacity to be used) is desired to be reduced.

Here, the present invention has an object of providing an image coding method or an image decoding method that can reduce the memory usage.

Solution to Problem

In order to achieve the object, the image decoding method according to an aspect of the present invention is an image decoding method using arithmetic decoding, and the method includes: determining a context for use in a current block to be processed, from among a plurality of contexts; performing arithmetic decoding on a bit sequence corresponding to the current block, using the determined context to reconstruct a binary sequence, the bit sequence being obtained by performing arithmetic coding on a control parameter of the current block; and inversely binarizing the binary sequence to reconstruct the control parameter of the current block, wherein the determining of a context includes: determining a signal type of the control parameter of the current block; determining the context under a first condition that decoded control parameters of neighboring blocks of the current block are used, when the signal type is a first type, the neighboring blocks being a left block and an upper block of the current block; and determining the context under a second condition that the decoded control parameter of the upper block is not used, when the signal type is a second type different from the first type, the first type is one of "split_coding_unit_flag" and "skip_flag", and the second type is one of "cbf_luma", "cbf_cb", and "cbf_cr".

Advantageous Effects of Invention

The present invention can provide an image coding method or an image decoding method that can reduce the memory usage.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 3 is a table of a context model of a control parameter according to Embodiment 1;

FIG. 11 illustrates an arithmetic decoding method for split_coding_unit_flag according to Embodiment 3;

FIG. 12A is a table indicating a result of verification on split_coding_unit_flag according to Embodiment 3;

FIG. 12B is a table indicating a result of verification on split_coding_unit_flag according to Embodiment 3;

FIG. 13 illustrates an arithmetic decoding method for skip_flag according to Embodiment 3;

FIG. 14A is a table indicating a result of verification on skip_flag according to Embodiment 3;

FIG. 14B is a table indicating a result of verification on skip_flag according to Embodiment 3;

FIG. 15 is a table indicating an arithmetic decoding method for cbf_luma(cr,cb) according to Embodiment 3;

FIG. 16A is a table indicating a result of verification on cbf_luma(cr,cb) according to Embodiment 3;

FIG. 16B is a table indicating a result of verification on cbf_luma(cr,cb) according to Embodiment 3;

FIG. 25 illustrates a structure of multiplexed data;

FIG. 28 illustrates a structure of TS packets and source packets in the multiplexed data;

FIG. 36 illustrates an example of a look-up table in which the standards of video data are associated with the driving frequencies;

DESCRIPTION OF EMBODIMENTS

Embodiment 1

Figure 1:
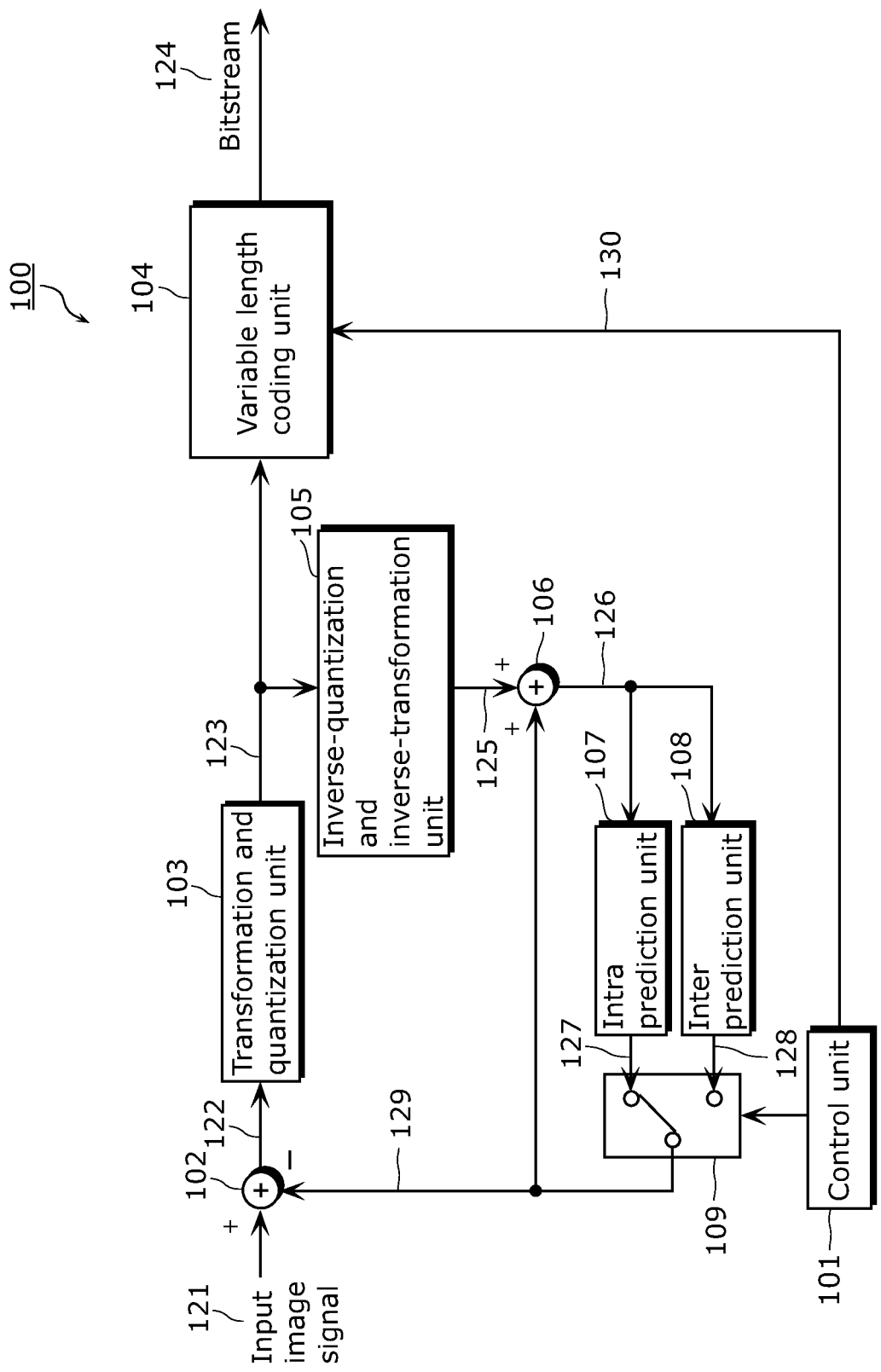
FIG. 1 is a functional block diagram of an image coding apparatus according to Embodiment 1.

(Knowledge on which the Present Invention is Based)

The present inventors have found the following problems.

In High-Efficiency Video Coding (HEVC) that is a next-generation video coding scheme, the context model in coding and decoding various control parameters is being studied (NPL 2). The control parameter is included in a coded bitstream, and is a parameter (flag, etc.) used in coding or decoding processing. More specifically, the control parameter is a syntax element.

The context model is information indicating (i) which condition is considered for (ii) a signal of which unit (each element of a multi-value, a binary value, a binary sequence (bin string). Here, "which condition" indicates which condition with the number of conditional elements is applied or which signal type of a control parameter to be considered as a condition is appropriate. As the conditions are divided into smaller categories, that is, as the number of conditions t increases, the number of the cases that hold true for the conditions decreases. As a result, since the number of trainings decreases, the precision of the predicted probability decreases (for example, see "dilution effect" in NPL 1).

Furthermore, decrease in the number of conditions indicates not considering a context (surrounding conditions), and being not adaptive to the statistical variations.

In designing a context model, after determining a guideline for designing the model, it is necessary to consider the validity of the model by conducting verifications specialized for an image, such as the verifications of statistical variations in details of an image and in control parameter for controlling coding and decoding of an image.

In H.264, using advanced events of a limited number for coding a symbol is a criterion of a rule, and the context models are classified into four basic design types.

The first and second types relate to coding and decoding of a control parameter.

The first context model uses coded values of up to two neighboring coded values (see NPL 1). Although the definition of the two neighboring coded values depends on each signal type, normally, values of corresponding control parameters included in neighboring blocks to the left and upper of the current block are used.

The second type of context models is a type for determining a context based on a binary tree as an occurrence probability. More specifically, the second type of context models is applied to the control parameters mb_type and sub_mb_type.

The third and fourth types of context models relate to coding and decoding of residual values (residual data), such as image data. The third type uses only the past coded or decoded values in the scanning order of frequency coefficients (or quantized coefficients). The fourth type determines a context according to the decoded and accumulated values (levels).

The advantages of the design principle and implementation of the probability transition model in H.264, such as the first type, have long been studied, and will be applied to HEVC that is being studied (see NPL 2). For example, the first type (context model using neighboring syntax elements) is being studied to be used for the control parameters alf_cu_flag, split_coding_unit_flag, skip_flag, merge_flag, intra_chroma_pred_mode, inter_pred_flag, ref_idx_lc, ref_idx_l0, ref_idx_l1, mvd_l0, mvd_l1, mvd_lc, no_residual_data_flag, cbf_luma, cbf_cb, and cbf_cr (see 9.3.3.1.1 of NPL 2).

However, the present inventors have found that there is a problem in the memory usage in coding using the "context model using the two neighboring blocks" of the first type.

Figure 17:
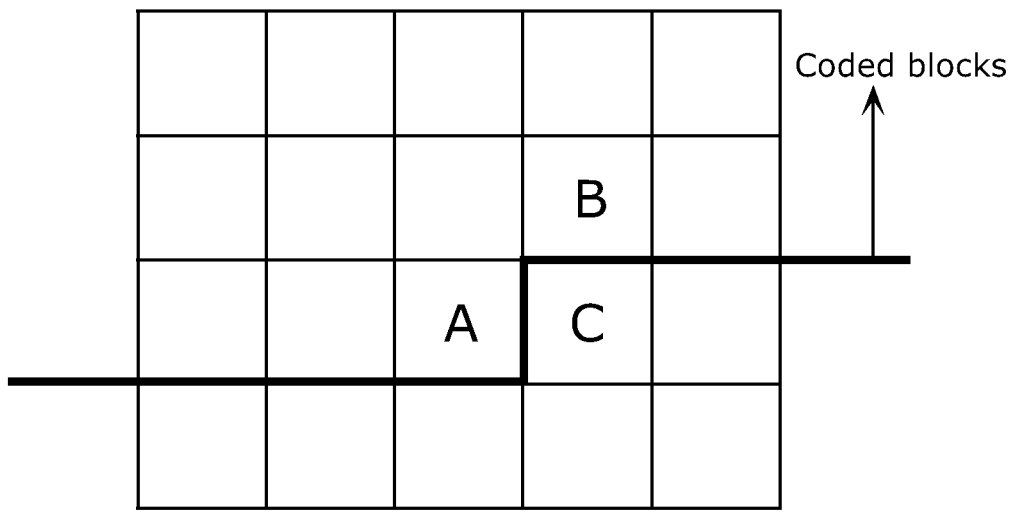
FIG. 17 illustrates context models using values of control parameters corresponding to two neighboring blocks according to Embodiments.

FIG. 17 illustrates context models using values of control parameters corresponding to the two neighboring blocks. Furthermore, FIG. 17 illustrates the context models using the neighboring blocks in H.264.

The block C in FIG. 17 includes a value of a control parameter SE currently to be coded and decoded. When the value of the control parameter SE is coded, values of control parameters SE of the same type included in the upper block A and the left block B that are already coded are used. More specifically, the probability p(x) indicating whether the value x of the control parameter SE of the block C (or the first binary value of bin string of the control parameter SE) is 1 or 0 is predicted based on a conditional probability p(x| (condition A (value of the upper block) and condition B (value of the left block)) using, as conditions, the value of the control parameter SE of the upper block A and the value of the control parameter SE of the left block B.

Figure 18:
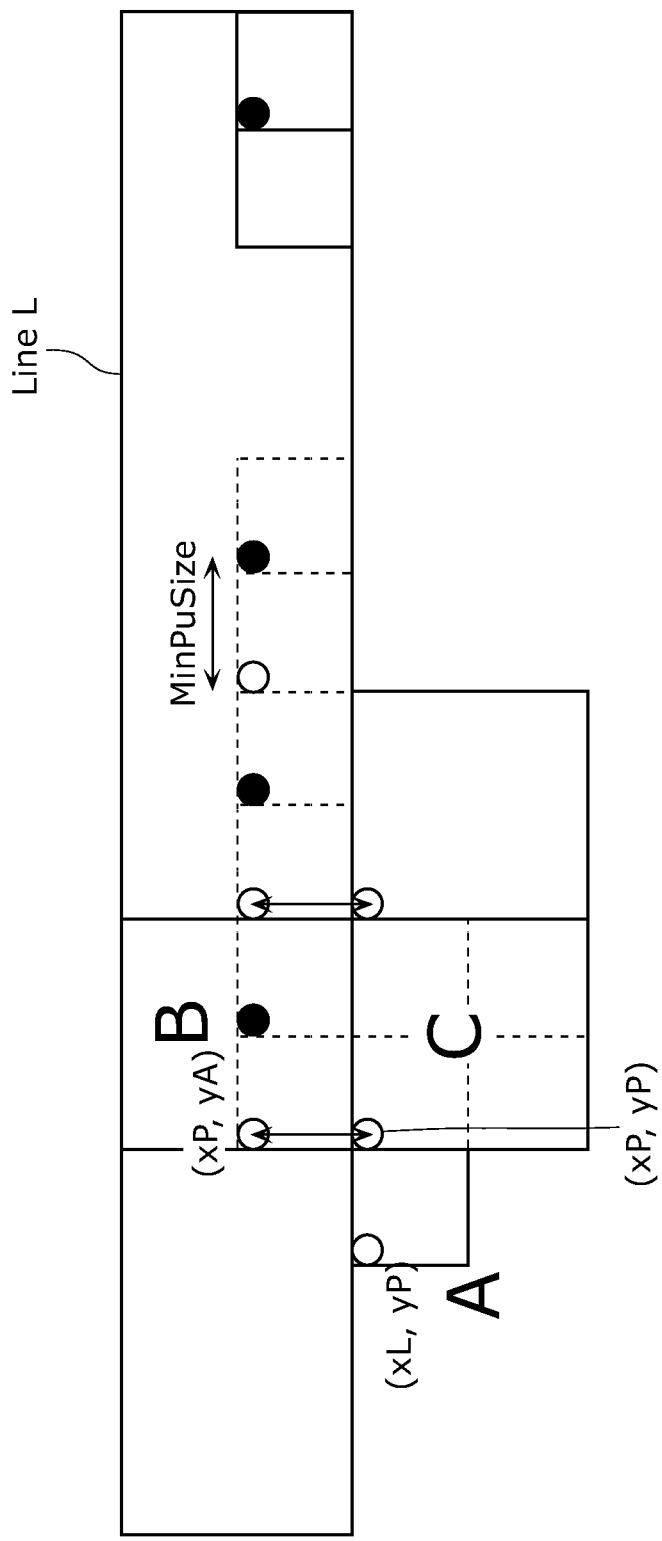
FIG. 18 illustrates increase in memory usage when an upper block is used according to Embodiments.

FIG. 18 illustrates increase in memory usage when an upper block is used.

In FIG. 18, (xP, yP) is a position of an upper left pixel of a prediction unit (PU, unit of motion prediction) including the block C. Here, the block C is a block including a control parameter (for example, skip_flag) currently to be coded. Furthermore, (xP, yA) in FIG. 18 is a position of a pixel that is included in the block B and is used as a condition A (value of the control parameter skip_flag of the upper block). Furthermore, (xL, yP) in FIG. 18 is a position of a pixel that is included in the block A and is used as a condition B (value of the control parameter skip_flag of the left block).

In order to code or decode the value of the control parameter skip_flag of the block C, the coding apparatus or the decoding apparatus needs to hold the value of skip_flag of PU (or a result of determination of a condition) corresponding to the position (xP, yA) included in the upper block B and the position (xL, yP) included in the left block A. Assuming that the picture has a horizontal width of 4096 pixels, in order to code one control parameter skip_flag, it is necessary to hold all the determination values included in the upper row (Line L in FIG. 18). In other words, one control parameter needs the memory capacity obtained by 4096 pixels/block size.

Here, the block C to be coded has variable sizes, for example, 64×64, 16×16, or 4×4. Furthermore, the block size of the block C to be later coded or decoded cannot be predicted when the blocks in the upper row (Line L) including (xP, yA) are coded or decoded. This is because the size of each of the blocks in the lower row (row including the block C) is not known when the upper row (row including the block A) is coded or decoded. Thus, the coding apparatus or the decoding apparatus needs to hold a value of a control parameter (or determination value) for each minimum block size, assuming that the smallest block size from among all the sizes applied to the control parameters is used as the block size of the lower row. The positions of the black circles in FIG. 18 indicate conditions that have to be held, although the conditional values are not actually necessary when the lower row (row including the block C) is coded and decoded.

Furthermore, the two neighboring blocks in FIG. 18 (the left block A and the upper block B) follow the concept of the neighboring blocks in H.264, and no new perspective on the division of hierarchical blocks is introduced. As described below, there are cases where such conditional values to be referred to in FIG. 18 do not always make sense for control parameters adapted to the recursive quad tree partitioning to be introduced in HEVC, because the control parameters follow the recursive execution order, the hierarchical depth, or positions of blocks.

As such, the present inventors have found that the memory usage increases by using the conditional values of the upper blocks in performing arithmetic coding or decoding on the control parameters. Furthermore, the present inventors have found that the memory usage further increases in HEVC.

In contrast, the image decoding method according to an aspect of the present invention is an image decoding method using arithmetic decoding, and the method includes: determining a context for use in a current block to be processed, from among a plurality of contexts; performing arithmetic decoding on a bit sequence corresponding to the current block, using the determined context to reconstruct a binary sequence, the bit sequence being obtained by performing arithmetic coding on a control parameter of the current block; and inversely binarizing the binary sequence to reconstruct the control parameter of the current block, wherein the determining of a context includes: determining a signal type of the control parameter of the current block; determining the context under a first condition that decoded control parameters of neighboring blocks of the current block are used, when the signal type is a first type, the neighboring blocks being a left block and an upper block of the current block; and determining the context under a second condition that the decoded control parameter of the upper block is not used, when the signal type is a second type different from the first type, the first type is one of "split_coding_unit_flag" and "skip_flag", and the second type is one of "cbf_luma", "cbf_cb", and "cbf_cr".

With the structure, the image decoding method can reduce the memory usage. More specifically, in the image decoding method, since the control parameter of the upper block is not used for a control parameter of the second type, there is no need to hold the control parameter of the second type of the upper block. With the structure, compared to the case where the left block and the upper block are used as uniformly "using a context model based on values of control parameters of neighboring blocks", the memory usage can be reduced according to the image decoding method. Furthermore, the image decoding method can appropriately reduce the memory usage of the control parameter of the second type without, for example, failing to evaluate a BD-rate of an image.

Furthermore, according to the image decoding method, the context appropriate for a hierarchical tree structure that is a data structure that is not consider in the conventional H.264 and is unique to the new standard HEVC can be used. Alternatively, memory reference can be performed.

Furthermore, the second condition may be a condition that the decoded control parameters of the left block and the upper block are not used.

With the structure, the image decoding method can reduce the memory usage by not using the control parameter of the left block in addition to the control parameter of the upper block.

Furthermore, in the determining of a context, a predetermined context may be determined under the second condition, as the context for use in the arithmetic decoding of the current block, when the signal type is the second type.

With the structure, the image decoding method can reduce the processing amount.

Furthermore, the context may be determined under the second condition according to a hierarchical depth of a data unit to which the control parameter of the current block belongs, when the signal type is the second type.

With the structure, the image decoding method can select an appropriate context while reducing the memory usage.

Furthermore, the determining of a context may further include: determining whether or not the decoded control parameter of the upper block is available in decoding, based on a position of the current block; and determining the context under the second condition, when the decoded control parameter of the upper block is not available.

With the structure, the image decoding method can reduce the processing amount.

Furthermore, in the determining of a context, it may be determined that the decoded control parameter of the upper block is not available in decoding, when the current block is at a slice boundary.

Furthermore, in the determining of a context, it may be determined whether or not the decoded control parameter of the upper block is available in decoding, according to a hierarchical depth of a data unit to which the control parameter of the current block belongs.

Furthermore, the second type may be a control parameter having a predetermined data structure.

Furthermore, the determining of a context may further include determining a context of a control parameter of a second unit smaller than a first unit by switching between the first condition and the second condition, based on a control parameter of the first unit.

Furthermore, the determining of a context may further include determining a context using a different condition for each case where the signal type is the "cbf_luma", or the signal type is one of the "cbf_cb" and the "cbf_cr".

Furthermore, the "split_coding_unit_flag" may indicate whether or not the current block is partitioned into a plurality of blocks, the "skip_flag" may indicate whether or not the current block is to be skipped, the "cbf_luma" may indicate whether or not a luma transform block of the current block contains one or more transform coefficient levels not equal to 0, the "cbf_cb" may indicate whether or not a Cb transform block of the current block contains one or more transform coefficient levels not equal to 0, and the "cbf_cr" may indicate whether or not a Cr transform block of the current block contains one or more transform coefficient levels not equal to 0.

Furthermore, decoding processes in accordance with a first standard and decoding processes in accordance with a second standard may be switched according to an identifier indicating one of the first standard and the second standard, the identifier being included in a coded signal, and the determining of a context, the performing, and the inversely binarizing may be performed as the decoding processes in accordance with the first standard, when the identifier indicates the first standard.

Furthermore, the image coding method according to an aspect of the present invention is an image coding method using arithmetic coding, and the method includes: binarizing a control parameter of a current block to be processed to generate a binary sequence; determining a context for use in the current block, from among a plurality of contexts; and performing arithmetic coding on the binary sequence using the determined context to generate a bit sequence, wherein the determining of a context includes: determining a signal type of the control parameter of the current block; determining the context under a first condition that control parameters of neighboring blocks of the current block are used, when the signal type is a first type, the neighboring blocks being a left block and an upper block of the current block; and determining the context under a second condition that the control parameter of the upper block is not used, when the signal type is a second type different from the first type, the first type is one of "split_coding_unit_flag" and "skip_flag", and the second type is one of "cbf_luma", "cbf_cb", and "cbf_cr".

With the structure, the image coding method can reduce the memory usage. More specifically, in the image coding method, since the control parameter of the upper block is not used for a control parameter of the second type, there is no need to hold the control parameter of the second type of the upper block. With the structure, compared to the case where the left block and the upper block are used as uniformly "using a context model based on values of control parameters of neighboring blocks", the memory usage can be reduced according to the image coding method. Furthermore, the image coding method can appropriately reduce the memory usage of the control parameter of the second type without, for example, failing to evaluate a BD-rate of an image.

Furthermore, according to the image coding method, the context appropriate for a hierarchical tree structure that is a data structure that is not consider in the conventional H.264 and is unique to the new standard HEVC can be used. Alternatively, memory reference can be performed.

Furthermore, the image decoding apparatus according to an aspect of the present invention is an image decoding apparatus using arithmetic decoding, and the apparatus includes: a context control unit configured to determine a context for use in a current block to be processed, from among a plurality of contexts; an arithmetic decoding unit configured to perform arithmetic decoding on a bit sequence corresponding to the current block, using the determined context to reconstruct a binary sequence, the bit sequence being obtained by performing arithmetic coding on a control parameter of the current block; and an inverse binarization unit configured to inversely binarize the binary sequence to reconstruct the control parameter of the current block, wherein the context control unit is configured to: determine a signal type of the control parameter of the current block; determine the context under a first condition that decoded control parameters of neighboring blocks of the current block are used, when the signal type is a first type, the neighboring blocks being a left block and an upper block of the current block; and determine the context under a second condition that the decoded control parameter of the upper block is not used, when the signal type is a second type different from the first type, the first type is one of "split_coding_unit_flag" and "skip_flag", and the second type is one of "cbf_luma", "cbf_cb", and "cbf_cr".

With the configuration, the image decoding apparatus can reduce the memory usage.

Furthermore, the image coding apparatus according to an aspect of the present invention is an image coding apparatus using arithmetic coding, and the apparatus includes: a binarization unit configured to binarize a control parameter of a current block to be processed to generate a binary sequence; a context control unit configured to determine a context for use in the current block, from among a plurality of contexts; and an arithmetic coding unit configured to perform arithmetic coding on the binary sequence using the determined context to generate a bit sequence, wherein the context control unit is configured to: determine a signal type of the control parameter of the current block; determine the context under a first condition that control parameters of neighboring blocks of the current block are used, when the signal type is a first type, the neighboring blocks being a left block and an upper block of the current block; and determine the context under a second condition that the control parameter of the upper block is not used, when the signal type is a second type different from the first type, the first type is one of "split_coding_unit_flag" and "skip_flag", and the second type is one of "cbf_luma", "cbf_cb", and "cbf_cr".

With the configuration, the image coding apparatus can reduce the memory usage.

Furthermore, the image coding and decoding apparatus according to an aspect of the present invention is an image coding and decoding apparatus including the image decoding apparatus and the image coding apparatus.

The general or specific aspects may be implemented by a system, a method, an integrated circuit, a computer program, or a recording medium, or by an arbitrary combination of the system, the method, the integrated circuit, the computer program, and the recording medium.

The image decoding apparatus and the image coding apparatus according to an aspect of the present invention will be specifically described with reference to drawings.

Embodiments described hereinafter indicate specific examples of the present invention. The values, shapes, materials, constituent elements, positions and connections of the constituent elements, steps, and orders of the steps indicated in Embodiments are examples, and do not limit the present invention. The constituent elements in Embodiments that are not described in independent Claims that describe the most generic concept of the present invention are described as arbitrary constituent elements.

Embodiment 1

An image coding apparatus according to Embodiment 1 of the present invention will be described. The image coding apparatus according to Embodiment 1 determines a context by switching between (1) using the upper block and (2) without using the upper block, according to a signal type of a control parameter in arithmetic coding. With the structure, the deterioration in image quality can be suppressed, and memory usage can be reduced.

First, a configuration of the image coding apparatus according to Embodiment 1 will be described.

FIG. 1 is a block diagram illustrating an image coding apparatus 100 according to Embodiment 1.

The image coding apparatus 100 in FIG. 1 is an image coding apparatus using arithmetic coding, and codes an input image signal 121 to generate a bitstream 124. The image coding apparatus 100 includes a control unit 101, a subtracting unit 102, a transformation and quantization unit 103, a variable length coding unit 104, an inverse-quantization and inverse-transformation unit 105, an adding unit 106, an intra prediction unit 107, an inter prediction unit 108, and a switch 109.

The control unit 101 calculates a control parameter 130 based on the input image signal 121 to be coded. For example, the control parameter 130 includes information on a picture type of the input image signal 121 to be coded, a size of a unit of motion prediction (prediction unit, PU) of the current block to be coded, and control information of the unit of motion prediction. Here, the control parameter 130 (control data) itself is to be coded. Thus, the control unit 101 outputs the control parameter 130 to the variable length coding unit 104.

The subtracting unit 102 calculates a residual signal 122 that is a difference (residual value) between the input image signal 121 and an image prediction signal 129 on a block unit basis.

The transformation and quantization unit 103 transforms the residual signal 122 into frequency coefficient values and quantizes the obtained frequency coefficient values into quantized transform coefficients 123 (residual data).

The inverse-quantization and inverse-transformation unit 105 inversely quantizes the quantized transform coefficients 123 into the frequency coefficient values and inversely transforms the obtained frequency coefficient values into a reconstructed residual signal 125.

The adding unit 106 adds the residual signal 125 to the image prediction signal 129, and outputs a reconstructed image signal 126.

The intra prediction unit 107 performs intra prediction using the reconstructed image signal 126 to generate an image prediction signal 127. The inter prediction unit 108 performs inter prediction using the reconstructed image signal 126 to generate an image prediction signal 128.

The switch 109 selects one of the image prediction signal 127 and the image prediction signal 128, and outputs the selected signal as the image prediction signal 129.

The variable length coding unit 104 codes, using the CABAC, the quantized transform coefficients 123 and the control parameter 130 for each input block to generate the bitstream 124.

Next, the configuration of the variable length coding unit 104 will be described.

Figure 2:
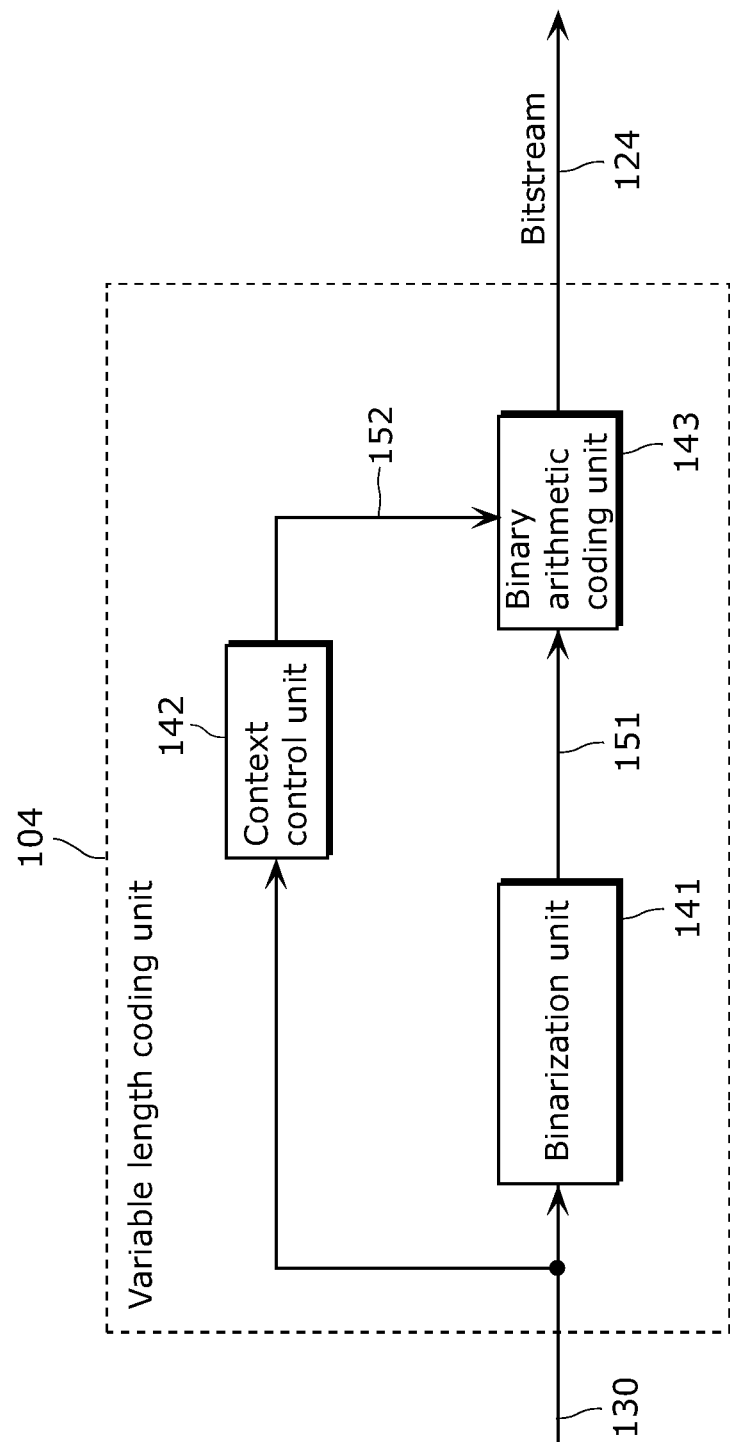
FIG. 2 is a functional block diagram of a variable length coding unit according to Embodiment 1.

FIG. 2 is a functional block diagram of the variable length coding unit 104. The variable length coding unit 104 includes a binarizing unit 141, a context control unit 142, and a binary arithmetic coding unit 143. The following describes the variable length coding process on the control parameter 130. Although the description about the variable length coding process on the quantized transform coefficients 123 is omitted, the process can be implemented, for example, using a known technique.

The binarization unit 141 binarizes the control parameter 130 to generate a binary sequence 151. More specifically, the binarization unit 141 is a processing unit that performs "II.1) binarization processing" according to NPL 1. The binarization unit 141 transforms the control parameter 130 into the binary sequence 151 referred to as "bin string" for each signal type, according to a predetermined binarization method. The correspondence between the signal types and the binarization methods will be described later. When the input control parameter 130 is one binary value, such as a flag, the binarization unit 141 outputs the control parameter 130 as the binary sequence 151 as it is.

The context control unit 142 determines a context for use in arithmetic coding of the control parameter 130 included in a current block to be processed, from among a plurality of contexts (a probability state table). Furthermore, the context control unit 142 outputs a context index 152 specifying the determined context to the binary arithmetic coding unit 143.

More specifically, the context control unit 142 is a processing unit that performs "2) context modeling" according to NPL 1. The context control unit 142 sequentially receives a plurality of elements included in the binary sequence 151 output from the binary arithmetic coding unit 143. The context control unit 142 selects one of the contexts to be used for the binary of the control parameter 130, according to the signal type of the control parameter 130 and an element position of the binary in the binary sequence 151, and outputs, to the binary arithmetic coding unit 143, the context index 152 that is an index indicating the selected context.

Furthermore, the context control unit 142 holds the probability state table of values (context index values) obtained by dividing the elements in the binary sequence of the control parameter 130 into conditions of conditional probabilities, as states of the context, and initializes and updates the probability state table.

Furthermore, the context control unit 142 holds a state (probability state index) for each occurrence condition τ (for each context), as a further division of a signal type (for each element number in the binary sequence of the control parameter 130 when the number of elements in the binary sequence is two or more; the same will apply hereafter). The state is represented by the total 7-bit value by combining the occurrence probability P (internal ratio, typically, a 6-bit value) that is the lower probability of one of two values 0 and 1, and a 1-bit value indicating which one of the values has the higher probability. Furthermore, holding a state means initializing and updating the state. For example, the updating corresponds to changing the indexing that indicates a current probability state (that is, a probability) as a transition among 64 finite states as in H.264.

When an event X at the most probable side having the highest probability between the two values occurs, a ratio of the probability at the most probable side is slightly increased. For example, the context control unit 142 can slightly increase the ratio of the probability at the most probable side by incrementing or decrementing, by 1, the value of the probability state index corresponding to 64 tables. On the other hand, when an event Not-X having the lower probability (against the predicted probability) occurs, the context control unit 142 largely decreases the ratio of the held most probable probability based on a predetermined scale coefficient α (for example, ≈0.95) (see FIG. 6 of NPL 1). The context control unit 142 according to Embodiment 1 transitions and holds a state, based on a corresponding table index change value so as to be associated with the change in consideration of α as in H.264.

The binary arithmetic coding unit 143 performs arithmetic coding on the binary sequence 151 using the context determined by the context control unit 142 to generate the bitstream 124 (bit sequence).

More specifically, the binary arithmetic coding unit 143 is a processing unit that performs "3) binary arithmetic coding" according to NPL 1. The binary arithmetic coding unit 143 performs arithmetic coding on the binary sequence 151 using the context specified by the context index 152 to generate the bitstream 124. Here, the arithmetic coding is to handle events occurring for the control parameters 130 of various signal types as a cumulative sum of probabilities, and determine correspondences between the events by narrowing down the range to a predetermined range on one number line.

First, the binary arithmetic coding unit 143 divides the one number line into two half sections, according to the occurrence probabilities of two possible values of the binary given from the context control unit 142. When the actual value occurring for the binary (for example, 0) is a value with a higher probability (exceeding 0.5 (for example, 0.75)), the binary arithmetic coding unit 143 maintains the lower limit "Low" in the range on the number line without change, and sets a value corresponding to a result of multiplying one time a scale coefficient 0.95 by the probability 0.75 this time, to a new range. On the other hand, when the actually generated binary value is a predicted value with a lower probability, the binary arithmetic coding unit 143 shifts the lower limit "Low" by the higher probability, and changes the range according to the lower probability. The sections are held according to a cumulative sum of results of multiplications of the probability ranges. When a value with a lower probability successively occurs, the precision of the length of the range becomes soon lower than the precision that can be ensured by a computation. Here, the binary arithmetic coding unit 143 enlarges (renorms) the range to maintain the precision, and outputs the bit sequence indicating the current range. Conversely, when a value with a higher probability (0.95, etc.) successively occurs, the probability values can bear a number of computations (state transitions in the case of implementation by a table) until the length of the range becomes shorter than a predetermined length even with the multiplication of the values. Thus, the number of symbols that can be cumulated until the bit is output is many.

FIG. 3 is a table in which the control parameters 130 each using a context model based on a value of the control parameter 130 of a neighboring block are sorted out.

The meaning of each column will be described from the left of the table.

(c2) Signal type (syntax element) indicates a specific name of a signal type of the control parameter 130. The meaning of each of the signal types will be described later.

(c3) Binarization scheme indicates a binarization scheme to be applied to the control parameter 130 (SE) specified in the immediately left column. The binarization unit 141 performs the binarization process. In the column, "Fixed length" means that the binarization unit 141 outputs the value of the control parameter 130 at the immediately left section as a binary sequence (bin string) of a fixed length. In HEVC, a signal type of the control parameter 130 whose name ends with "flag" is one binary value of either 0 or 1. Thus, the binarization unit 141 outputs only the first element (binIdx=0) as the element of the binary sequence 151, and does not output the elements after the second element (binIdx>=1). In other words, the binarization unit 141 outputs the value of the control parameter 130 as the binary sequence 151 as it is.

Furthermore, "Variable length" in the column means that the binarization unit 141 maps, to a binary sequence, the value of the control parameter 130 using binary sequences with respective variable lengths whose values are associated to have binary lengths in ascending order of the occurrence frequencies (bin string or binary sequences each with the number of elements≥1), and outputs the binary sequence. For example, the binarization unit 141 employs and outputs a scheme according to the signal type, such as a (truncated) unary scheme, and a combination of the unary and other exponetional Golomb schemes (see "A. Binarization" of NPL 1). In the case of "Variable length", the number of elements of the binary sequence 151 is sometimes limited to 1, or is equal to or larger than 2. An inverse binarization unit in an image decoding apparatus to be described later performs transformation inverse to the binarization scheme to reconstruct the input binary sequence into a multi-value or a flag value.

Regarding (c4) Context index of the first element (binIdx=0), the context control unit 142 indicates the choice of a context index (increment) to be applied to the first element included in a binary sequence generated according to the binarization scheme specified in the column of c3. In the column, "0, 1, 2" indicates that the context control unit 142 selects and applies one of three probability state tables (contexts). For example, three context indexes with detailed conditions are prepared for the one signal type "skip_flag", that is, three contexts are prepared, and the arithmetic coding is performed on the context indexes.

Similarly, "0, 1, 2, 3" in the column c4 indicates that the context to be applied to the first element (binIdx=0) included in the binary sequence 151 is selected from among one of four values, either 0, 1, 2, or 3. The binary sequence 151 is obtained by mapping, to a binary sequence, the value of the control parameter 130 of the signal type specified in the column of c2, according to the binarization scheme in the column of c3. The conditional expressions in the column will be described later.

Regarding (c5) Left block condition L (condL), the context control unit 142 indicates the left block condition to select one of 0, 1, and 2 at the column c4. The left block condition L has a value of true or false determined according to the value of the control parameter of the left block corresponding to the control parameter to be coded (or to be decoded).

For example, in the case where the control parameter (SE) is skip_flag, the left block condition L has the value of true when skip_flag[xL][yL] indicates true (for example, 1), and has the value of false when it indicates false (for example, 0).

Regarding (c6) Upper block condition A, the context control unit 142 indicates the upper block condition to select one of 0, 1, and 2 in coding or decoding elements of a sequence specified in the column c4. The upper block condition A has a value of true or false determined according to the value of the control parameter of the upper block corresponding to the control parameter to be coded (or to be decoded). For example, in the case where the control parameter (SE) is skip_flag, the upper block condition A has the value of true when skip_flag[xA][yA] indicates true (for example, 1), and has the value of false when it indicates false (for example, 0).

Although not illustrated, the signal type of more than two bits is associated with "(c7) Context increment to be applied to binIdx>=1". This (c7) indicates the context model applied by the context control unit 142 to a binary after the second element in the binary sequence (binary value of a binary sequence element including an index value of binIdx>=1).

In the coding method of Embodiment 1, the following operations are switched according to the signal type of the control parameter 130 for the left block condition L and the upper block condition A (operated using different patterns):

(Pattern 1) Using two neighboring blocks (a determination value of the left block condition L and a determination value of the upper block condition A);

(Pattern 2) Using one neighboring block (only a determination value of the left block condition L); and (Pattern 3) Using zero neighboring block (using neither a determination value of the left block condition L nor a determination value of the upper block condition A).

Figure 4:
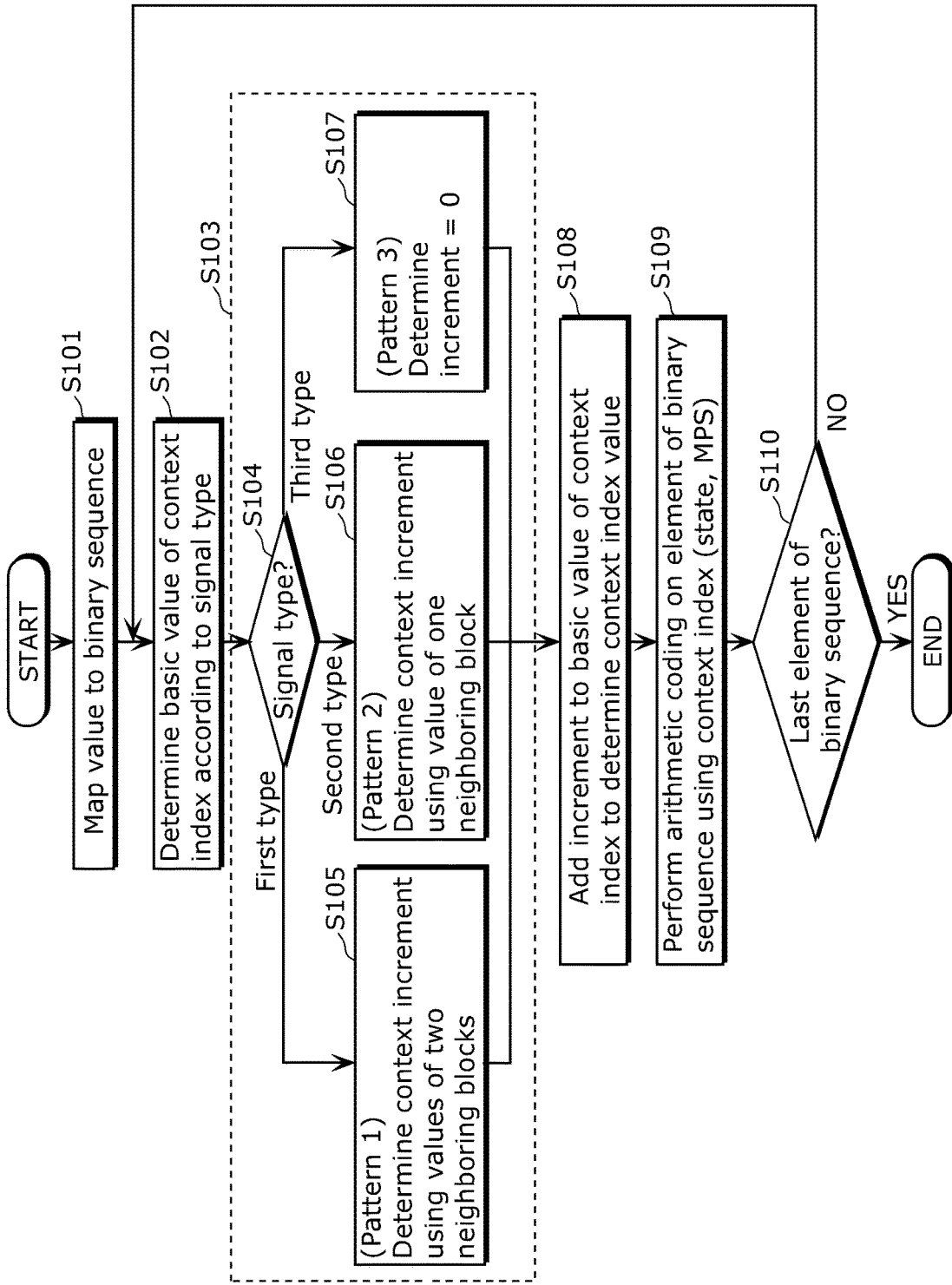
FIG. 4 is a flowchart indicating an arithmetic coding method according to Embodiment 1.

FIG. 4 is a flowchart indicating an image coding method according to Embodiment 1 that is performed by the variable length coding unit 104 in FIG. 2.

First, the binarization unit 141 maps the value of the control parameter 130 to a binary sequence according to a scheme corresponding to the signal type of the control parameter 130 (S101).

Next, the context control unit 142 obtains a basic value of a context for use in arithmetic coding of the control parameter 130 (S102). For example, the context control unit 142 determines the basic value according to the picture type (I, P, or B).

Next, the context control unit 142 determines a context value using one of the patterns 1 to 3, based on the signal type of the control parameter 130 (S103). Here, determining a context value is equivalent to determining an adjustment value (increment value CtxIdxInc) for the basic value of the context.

First, the context control unit 142 determines the signal type of the control parameter 130 (S103). When the signal type of the control parameter 130 is the first type corresponding to the pattern 1 (the first type at S104), the context control unit 142 determines a context value using a determination value derived from values of control parameters of two neighboring blocks (block A and block B) (S105). In other words, the context control unit 142 determines a context under a condition that the control parameters of the two neighboring blocks of the left block and the upper block are used. Here, the context control unit 142 uses both of a result of the determination of (c5) condL and a result of the determination of (c6) condA in FIG. 3. Accordingly, data of one row of pictures are held for the control parameters of the first type.

On the other hand, when the signal type of the control parameter 130 is the second type corresponding to the pattern 2 (the second type at S104), the context control unit 142 determines a context value using a value of a control parameter of one neighboring block (one immediately neighboring block in coding order) (S106). In other words, the context control unit 142 determines the context value under a condition that the control parameter of the upper block is not used.

On the other hand, when the signal type of the control parameter 130 is the third type corresponding to the pattern 3 (the third type at S104), the context control unit 142 fixedly determines a context value without using both of the control parameters of the upper block and the left block (S107).

Next, the context control unit 142 adds the increment determined at Step S103 to the basic value of the context index determined at Step S102 to determine a context index value (S108).

Finally, the binary arithmetic coding unit 143 performs arithmetic coding on the binary value of the first element using the context value specified by the context index value determined at Step S108 to generate the bit sequence (bitstream 124) (S109).

Next, when the processes from Steps S102 to S109 are not executed on all the elements included in the binary sequence (No at S110), the variable length coding unit 104 performs the processes from Steps S102 to S109 on the next element included in the binary sequence. On the other hand, when the processes from Steps S102 to S109 are completed on all the elements included in the binary sequence (Yes at S110), the variable length coding unit 104 ends the coding processing on the control parameter of the current block.

As described above, the image coding apparatus 100 according to Embodiment 1 determines a context using the upper block in performing arithmetic coding on the control parameter of the first type, and determines a context without using the upper block for the control parameters of the second and third types.

Compared to the case where the left block and the upper block are used as uniformly "using a context model based on values of control parameters of neighboring blocks", the image coding apparatus 100 can reduce the memory usage with the configuration. Thus, the image coding apparatus 100 can suppress the deterioration in image quality, and reduce the memory usage.

Embodiment 2

Embodiment 2 will describe an image decoding apparatus that decodes the bitstream 124 generated by the image coding apparatus 100.

Figure 5:
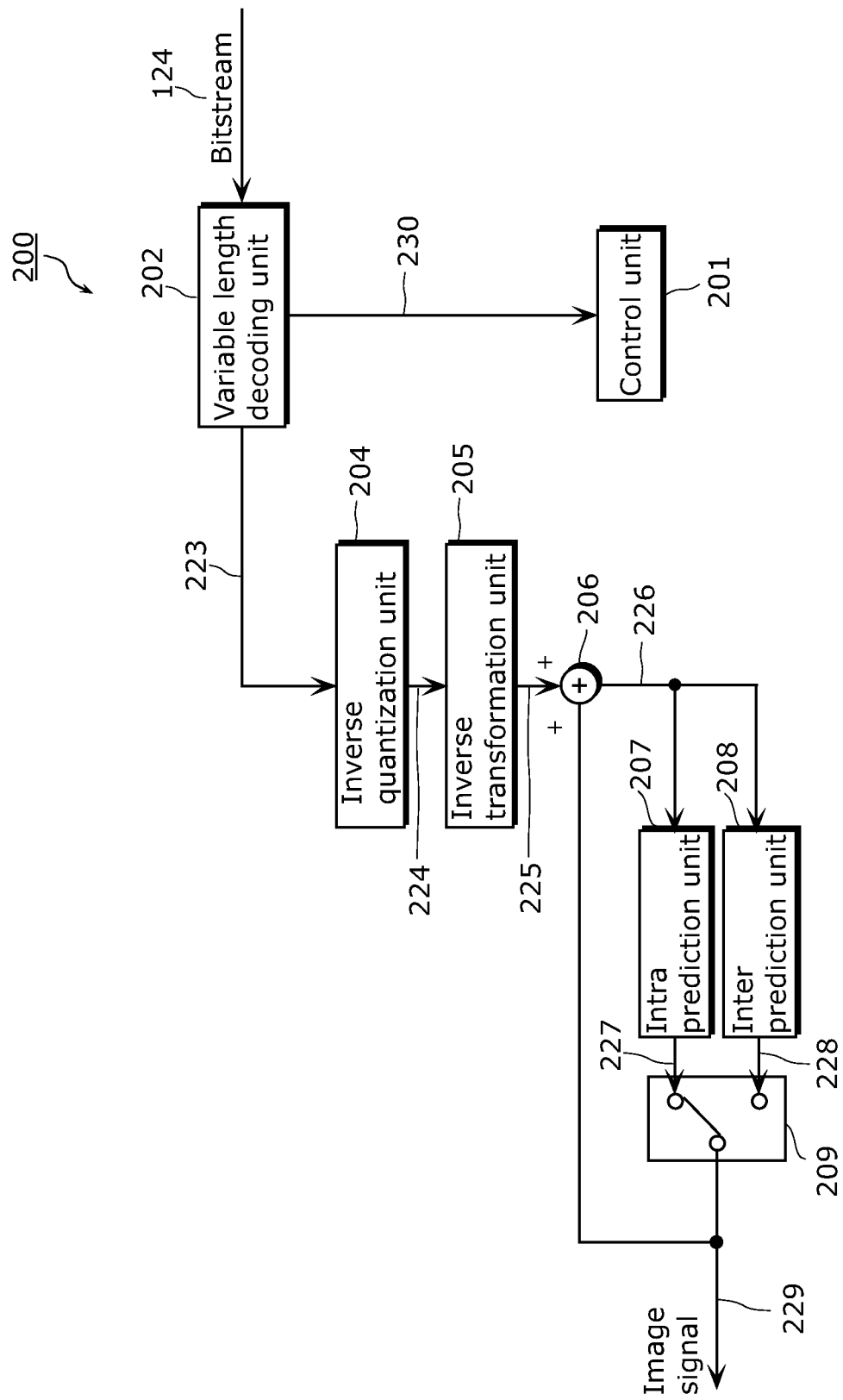
FIG. 5 is a functional block diagram of an image decoding apparatus according to Embodiment 2.

FIG. 5 is a block diagram illustrating an image decoding apparatus 200 according to Embodiment 2. The image decoding apparatus 200 is an image decoding apparatus using arithmetic decoding, and decodes the bitstream 124 to generate an image signal 229. Here, the bitstream 124 is, for example, generated by the image coding apparatus 100.

The image decoding apparatus 200 includes a control unit 201, a variable length decoding unit 202, an inverse quantization unit 204, an inverse transformation unit 205, an adding unit 206, an intra prediction unit 207, and an inter prediction unit 208.

The image decoding apparatus 200 performs decoding processing for each bitstream of a predetermined processing unit. The processing unit is, for example, a slice unit or a block unit.

The variable length decoding unit 202 performs arithmetic decoding on the bitstream 124 to generate a control parameter 230 (control data syntax element) and quantized transform coefficients 223 (residual data syntax element values). The control unit 201 receives the generated control parameter 230.

The control unit 201 controls each of the processing units included in the image decoding apparatus 200, according to the control parameter 230.

The inverse quantization unit 204 inversely quantizes the quantized transform coefficients 223 into orthogonal transform coefficients 224.

The inverse transformation unit 205 inversely transforms the orthogonal transform coefficients 224 to reconstruct a residual signal 225. The adding unit 206 adds the residual signal 225 to an image prediction signal (image signal 229) to generate a decoded image signal 226.

The intra prediction unit 207 performs intra prediction using the decoded image signal 226 to generate an image prediction signal 227. The inter prediction unit 208 performs inter prediction using the decoded image signal 226 to generate an image prediction signal 228.

The switch 209 selects one of the image prediction signal 227 and the image prediction signal 228, and outputs the selected signal as the image signal 229 (image prediction signal).

Next, the configuration of the variable length decoding unit 202 will be described.

Figure 6:
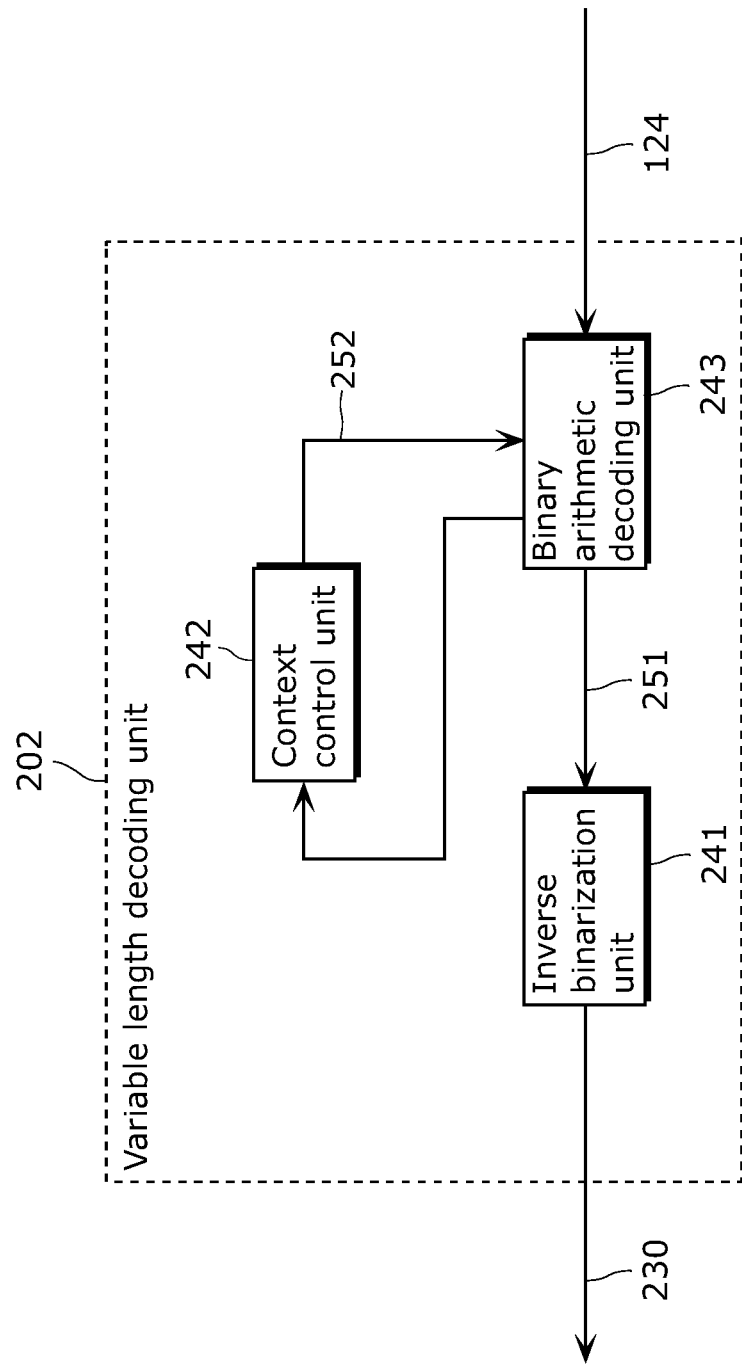
FIG. 6 is a functional block diagram of a variable length decoding unit according to Embodiment 2.

FIG. 6 is a functional block diagram illustrating a configuration of the variable length decoding unit 202. The variable length decoding unit 202 includes a binary arithmetic decoding unit 243, a context control unit 242, and an inverse binarization unit 241. The following describes the variable length decoding process on the control parameter 230. Although the description about the variable length decoding process on the quantized transform coefficients 223 is omitted, the process can be implemented, for example, using a known technique.

The context control unit 242 determines a context for use in arithmetic decodinhierag of the control parameter 230 of the current block, from among a plurality of contexts. Furthermore, the context control unit 242 outputs a context index 252 specifying the determined context to the binary arithmetic decoding unit 243.

More specifically, the context control unit 242 uses the same context model as that of the context control unit 142 in FIG. 2 as a held probability transition model. When the arithmetic coding unit 143 uses 64 probability states, the binary arithmetic decoding unit 243 also holds the 64 probability states. This is because both the coder and the decoder need to interpret a range of the number line to be coded exactly in the same manner. Thus, the decoder uses the same pattern as the pattern selected by the coder from among the three patterns 1 to 3.

The arithmetic decoding unit 243 performs arithmetic decoding on the bit sequence (bitstream 124) using the context determined by the context control unit 242 to reconstruct the binary sequence 251. More specifically, the arithmetic decoding unit 243 reconstructs the input bit sequence into the binary sequence 251, according to the context (probability state table) specified by the context index given from the context control unit 242.

The inverse binarization unit 241 reconstructs the binary sequence 251 into a control parameter 230 if necessary through the inverse binarization process. As such, the context control unit 142 included in the image coding apparatus 100 and the context control unit 242 included in the image decoding apparatus 200 use the same context model in both of the arithmetic coding and the arithmetic decoding of a control parameter of a certain signal type.

Figure 7:
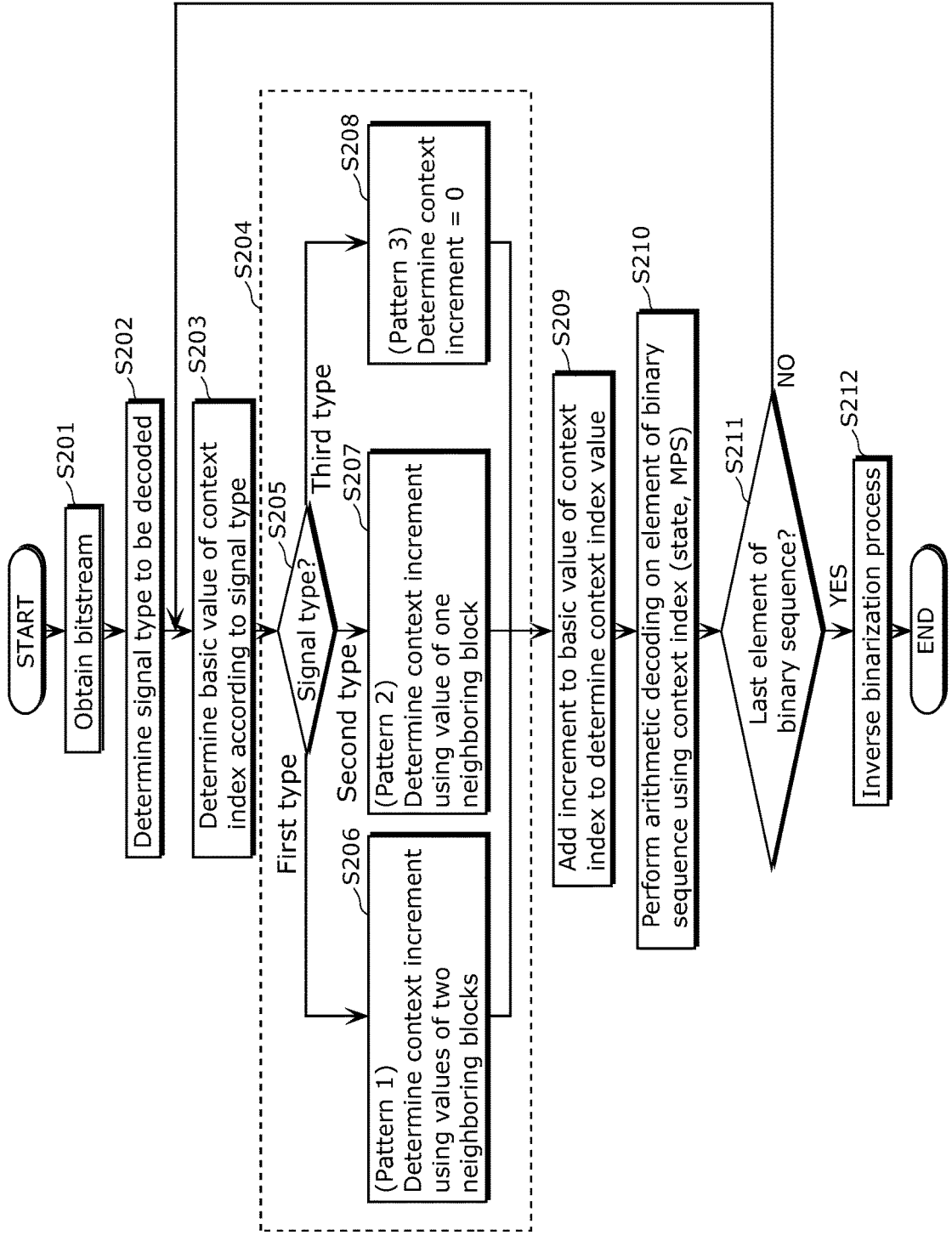
FIG. 7 is a flowchart indicating an arithmetic decoding method according to Embodiment 2.

FIG. 7 is a flowchart indicating an image decoding method according to Embodiment 2 that is performed by the variable length decoding unit 202.

First, the variable length decoding unit 202 obtains the bitstream 124 (S201).

Next, the context control unit 242 determines a signal type of a control parameter to be decoded, according to the data structure of the bitstream 124 (S202).

Next, the context control unit 242 determines a basic value of a context for use in arithmetic decoding of the control parameter to be decoded (S203). For example, the context control unit 242 determines the basic value according to the picture type (I, P, or B).

Next, the context control unit 242 determines a context value using one of the patterns 1 to 3, based on the signal type of the control parameter (S204). Here, determining a context value is equivalent to determining an adjustment value (increment value CtxIdxInc) for the basic value of the context. For example, the context control unit 242 statically determines one of the patterns 1 to 3 based on the signal type of the control parameter by following a predetermined table.

The context control unit 242 switches between neighboring blocks for use in determining a context for obtaining a binary value of the first element included in the binary sequence 251 using the arithmetic decoding, according to the signal type of the control parameter.

First, the context control unit 242 determines the signal type of the control parameter 230 (S205). When the signal type is the first type corresponding to the pattern 1 (the first type at S205), the context control unit 242 determines a context value using control parameters of two neighboring blocks (S206). In other words, the context control unit 242 determines the context value under a condition that decoded control parameters of the two neighboring blocks of the left block and the upper block are used.

On the other hand, when the signal type is the second type corresponding to the pattern 2 (the second type at S205), the context control unit 242 determines a context value using a value of a control parameter of one neighboring block (one immediately neighboring block in coding order) (S207). In other words, the context control unit 242 determines the context value under a condition that the decoded control parameter of the upper block is not used.

On the other hand, when the signal type is the third type corresponding to the pattern 3 (the third type at S205), the context control unit 242 fixedly determines a context value (S208). In other words, the context control unit 242 determines the context value under a condition that the decoded control parameters of the upper block and the left block are not used.

Next, the context control unit 242 adds the increment determined at Step S204 to the basic value of the context index determined at Step S203 to determine a context index value (S209).

Next, the binary arithmetic decoding unit 243 determines one of the elements of the binary sequence through decoding using the context value indicated by the context index value given from the context control unit 242 (S210).

Next, when the processes from Steps S203 to S210 are not executed on all the elements included in the binary sequence (No at S211), the variable length decoding unit 202 performs the processes from Steps S203 to S210 on the next element included in the binary sequence.

On the other hand, when the processes from Steps S203 to S210 are completed on all the elements included in the binary sequence (Yes at S211), the inverse binarization unit 241 changes one or more of the elements of the binary sequence 251 obtained by repeating the processes from Steps S203 to S210 more than one time to generate the control parameter 230 (S212).

As described above, the image decoding apparatus 200 according to Embodiment 2 determines a context using the upper block in performing arithmetic decoding on the control parameter of the first type, and determines a context without using the upper block for the control parameters of the second and third types.

Compared to the case where the left block and the upper block are used as uniformly "using a context model based on values of control parameters of neighboring blocks", the image decoding apparatus 200 can reduce the memory usage with the configuration. Thus, the image decoding apparatus 200 can suppress the deterioration in image quality, and reduce the memory usage.

For example, when the binary sequence 251 is a flag and has only one element, that is, the binary sequence 251 is composed of 1 binary, the inverse binarization unit 241 may output the binary sequence 251 as it is.

In addition to the description above, the control unit 101 or 201 may control each of the processing units or refer to a value of a memory, through a signal line that is not illustrated.

Although the context control unit 142 or 242 switches between the three patterns 1 to 3 according to a signal type of a control parameter in the above description, it may switch between two of the patterns 1 to 3 according to the signal type. In other words, the context control unit 142 or 242 may switch between using and not using the upper block condition, according to a signal type of a control parameter.

Furthermore, the context control unit 142 or 242 may change a method of switching between the context models selected in such a manner (including a case where the context model increment is changed; the same will apply hereafter) according to predetermined image information. For example, the context control unit 142 or 242 may further switch the switching policy itself, according to the amount of memory, or the size of the horizontal width or a sampling format of an image that affects the number of trainings of each context.

Although the context control unit 142 or 242 switches between using and not using the upper block condition as the simplified description, the context control unit 142 or 242 may combine a case where the upper block is not available to the switching and apply the combined case. For example, the context control unit 142 or 242 may change the switching policy itself, according to whether or not a slice to be processed is an entropy slice (entropy_slice_flag indicates 1 or 0). Similarly, when the availability of the upper neighboring block cannot be ensured, the context control unit 142 or 242 may change the switching policy so as not to use the upper block.

Figure 8:
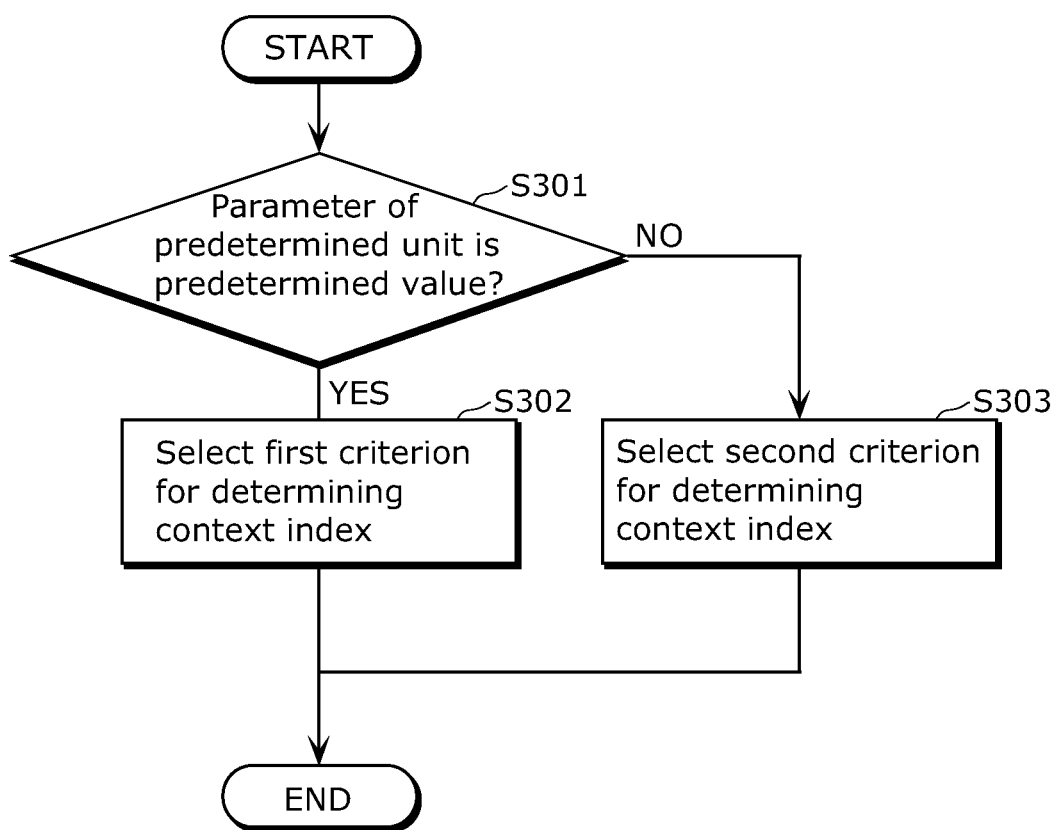
FIG. 8 is a flowchart indicating a modification of the arithmetic decoding method according to Embodiment 2.

For example, as illustrated in FIG. 8, the context control unit 142 or 242 may switch the determination policy of the context model between the first determination criterion (S302) and the second determination criterion (S303), according to a value of a parameter of a predetermined unit. Here, "according to a value of a parameter of a predetermined unit" means according to whether or not a slice is an entropy slice as described above. Furthermore, the first determination criterion is a criterion based on which the processes in FIG. 7 are performed. The second determination criterion is a criterion excluding Step S204 in FIG. 7, and is, for example, a conventional criterion. This is equivalent to determining the context index increment, using a parameter of a predetermined local unit and a value of a parameter of a unit larger than the predetermined local unit.

In other words, the context control unit 142 or 242 may switch from a determination criterion to be applied to a unit smaller than the first unit, to another determination criterion based on a value of a control parameter of the first unit.

Furthermore, the context control unit 142 or 242 may change the determination criterion to be used, according to the characteristics of an image system. For example, the context control unit 142 or 242 may change the determination criterion to be used, according to intervals of I-pictures (setting values of Intra Period).

Although the context control unit 142 or 242 switches between the determination criterions according to the above conditions, it may switch whether or not the upper block is used.

Furthermore, the context control unit 142 or 242 may determine whether or not a control parameter of the upper block is used, according to whether or not the control parameter of the upper block is available in coding or decoding based on a position of the control parameter. In other words, the context control unit 142 or 242 may determine whether or not the control parameter of the upper block is available in decoding, based on a position of the current block, and determine a context using one of the patterns 2 and 3 when the control parameter of the upper block is not available. Furthermore, the context control unit 142 or 242 may determine whether or not a reference value of the upper block is available based on a tree structure for partitioning TU, CU, or PU blocks. In other words, the context control unit 142 or 242 may determine whether or not the control parameter of the upper block is available in decoding, according to the hierarchical depth of a data unit to which each of the control parameters to be processed belongs.

Figure 9:
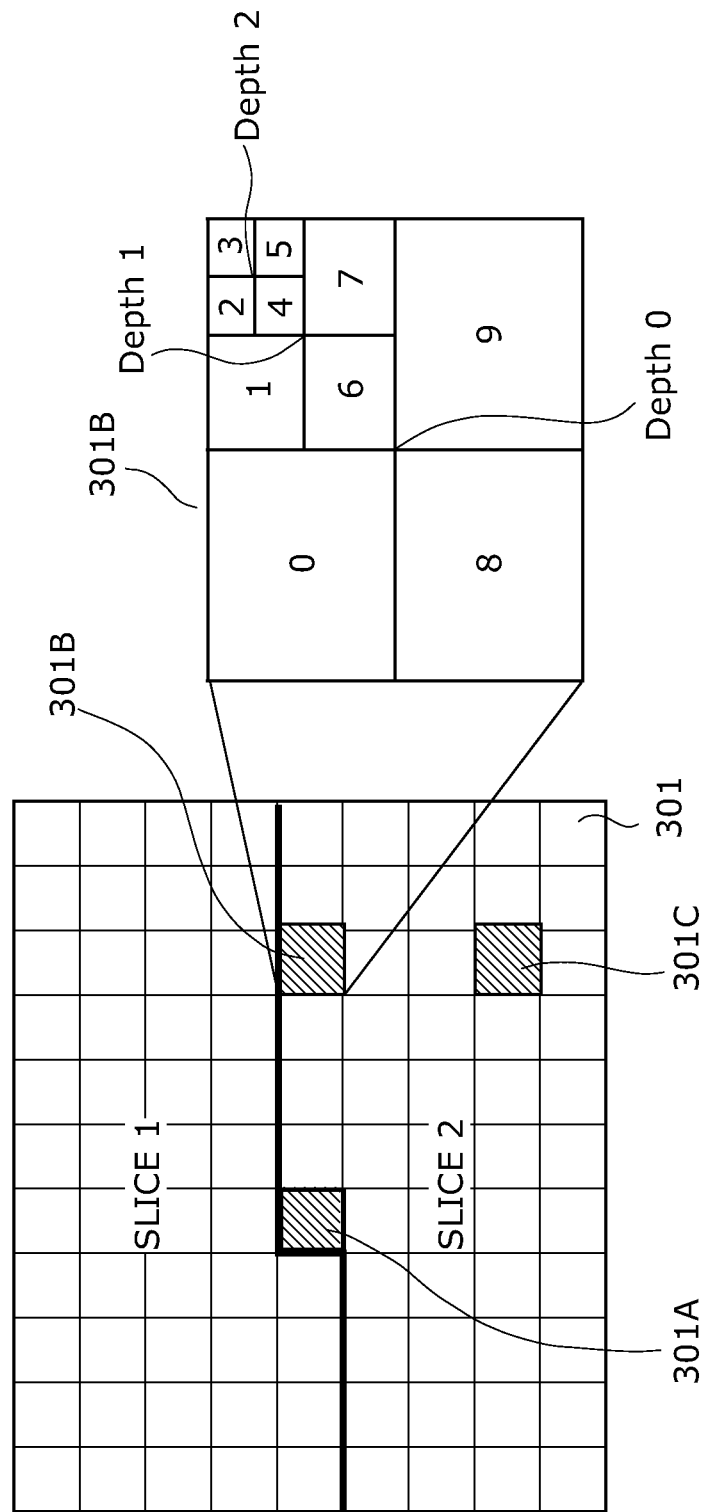
FIG. 9 illustrates partitioned blocks (a tree structure) in accordance with HEVC according to Embodiment 2.

FIG. 9 illustrates a relationship between a picture, slices, and blocks in accordance with the HEVC standard. One picture is partitioned into one or more slices. In the example of FIG. 9, the picture is partitioned into two slices (SLICE 1 and SLICE 2). One of the slices includes blocks 301 (for example, treeblocks). Here, the block 301 is the largest unit as a certain control unit when a slice is partitioned in a predetermined size, and has a size of a root when the unit is at the root in the hierarchically-partitioned structure.

In the example of FIG. 9, SLICE 2 starts from a block 301A, and is composed of one sequence including blocks to the bottom right corner of the picture through the hatched blocks 301B and 301C. One of the hatched blocks in FIG. 9 is one block (TreeBlock) to be currently processed.

Each of the blocks 301 includes N×M pixels. One of the blocks 301 is recursively partitioned inside (typically into four). In other words, one TreeBlock conceptually composes one quad tree. In the block 301B in FIG. 9, the upper right block obtained by partitioning the hatched block 301B into four are recursively partitioned into four blocks twice. In other words, the block 301B includes 10 logical units from the upper-left zero-th unit to the lower-right ninth unit that are partitioned with a certain perspective.

Here, the perspective indicates the concept of a plurality of trees having different depths with a root as a base point, such as a tree regarding a coding unit (CU) and a tree regarding residual_data. Here, a value of each control parameter belongs to one of leaf nodes.

Here, whether or not a value of a control parameter of a certain signal type included in an upper block is actually available depends on a type of a tree to which the control parameter belongs. Thus, the context control unit 142 or 242 may change a determination criterion according to a type of a tree to which the control parameter belongs. This change is equivalent to the change to a syntax unit. For example, the context control unit 142 or 242 may use the pattern 2 or 3 in which the upper block is not used for data of an adaptive filter with a data structure such as alf_param, whereas it may use the context model policy (pattern 1) for the other syntaxes as conventionally used. In other words, the second type or the third type may be a control parameter having a predetermined data structure. Furthermore, this means that the determination criterion may be changed according to the type of a tree of a neighboring block.

Furthermore, whether or not the value of the control parameter can be actually used or produces the advantage of reducing the memory usage differs depending on a position of a block in the hierarchical relationship. In other words, the context control unit 142 or 242 may switch between using or not using the upper block, according to a depth of a block and a hierarchical position of the block.

For example, in FIG. 9, the numbers 0 to 9 in the block 301B are in decoding order. In this case, the control parameters of the blocks 1 and 2 are available when the block 4 is coded or decoded.

Furthermore, in order to reduce memory usage, the context control unit 142 or 242 may select the pattern 1 using the upper block, when the block is not at a depth 0 and the own position is one of the second to the subsequent elements in the vertical partitioning. Here, "depth" indicates the depth from the root. In other words, when a certain block is defined as block[xn],[y0][depth], the determination criterion may be changed according to whether or not the current block satisfies block[xn][(y0)+1][depth]. In other words, the upper blocks are used for the blocks 4 to 9 in FIG. 9. When the tree is coded or decoded in the order as numbered (starting from 0 and ending at 9), it is clear that the blocks 4 to 9 can use the control parameters included in the upper blocks. Furthermore, there is an advantage that these blocks have only to temporally hold data. Furthermore, this indicates that the context value is determined according to the 3D position including the depth in addition to the x and y coordinates. Besides, a conditional value of a block in the higher layer can be used (followed) as a conditional value of a block in the lower layer.

Furthermore, the context control unit 142 or 242 may change these criteria in consideration of the position relationship between the current block and the other slices. Hereinafter, the three hatched blocks 301A, 301B, and 301C in FIG. 9 will be described.

Here, the block 301A is a start block, and both of the left block and the upper block of the block 301A are included in another slice. The upper block of the block 301B is included in another slice. Both of the left block and the upper block of the block 301C are included in the same slice including the block 301C. The context control unit 142 or 242 may switch the criterion according to such a condition. In other words, the context control unit 142 or 242 may switch the criterion (i) according to whether or not the upper block is included in another slice, (ii) according to whether or not the left block is included in another slice, or (iii) according to both (i) and (ii). In other words, the context control unit 142 or 242 may determine that the control parameter of the upper block is not available in decoding when the current block is at the slice boundary. Accordingly, when the decoding processing on the upper SLICE 1 is not completed, for example, it is possible to perform the decoding processing in consideration of whether or not SLICE 2 can obtain information by itself.

Figure 10:
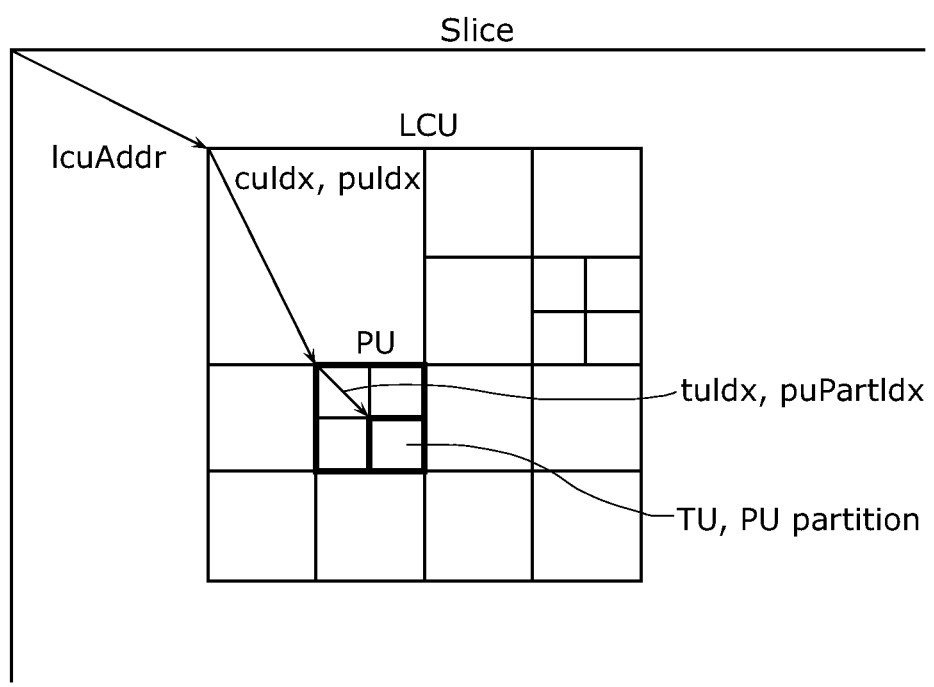
FIG. 10 illustrates a multi-layer block structure according to Embodiment 2.

Next, the hierarchical processing unit (multi-layer block structure) will be described. FIG. 10 illustrates the hierarchical processing unit (multi-layer block structure).

The image coding apparatus 100 codes moving pictures on a per processing unit, and the image coding apparatus 200 decodes a coded stream on a per processing unit. The processing unit is layered by partitioning the processing unit into small processing units and further partitioning the small processing units into smaller processing units. As the processing unit is smaller, the depth of the processing unit is greater and is hierarchically lower, and the value indicating the depth is larger. Conversely, as the processing unit is larger, the depth of the processing unit is less and is hierarchically higher, and the value indicating the depth is smaller.

The processing unit includes a coding unit (CU), a prediction unit (PU), and a transformation unit (TU). A CU is a block of 128×128 pixels at maximum, and is a unit corresponding to a conventional macroblock. A PU is a basic unit for the inter prediction. A TU is a basic unit for orthogonal transformation, and has a size identical to that of PU or much smaller than PU. A CU is, for example, partitioned into 4 sub-CUs, and one of the sub-CUs includes a PU and a TU having the same size as that of the sub-CU (here, PU and TU overlap one another). For example, the PU is further partitioned into 4 sub-PUs, and the TU is further partitioned into 4 sub-CUs. When the processing unit is partitioned into smaller processing units, each of the smaller processing units is referred to as a sub-processing unit. For example, when the processing unit is a CU, the sub-processing unit is a sub-CU. When the processing unit is a PU, the sub-processing unit is a sub-PU. Furthermore, when the processing unit is a TU, the sub-processing unit is a sub-TU.

More specifically, the below indicates the details.

One picture is partitioned into one or more slices. A slice is a sequence of the largest coding unit. The position of the largest coding unit is indicated by an address of the largest coding unit lcuAddr.

Each of the coding units including the respective largest coding units is partitioned into four coding units. As a result, a quad tree having the size of a CU is constructed. The position of the CU is indicated by a coding unit index cuIdx having a sample (pixel or coefficients) at the upper left corner of the largest coding unit as a starting point.

When partitioning of a CU is not permitted, the CU is handled as a PU. Similarly as the CU, the position of a PU is indicated by a prediction unit index puIdx having a sample at the upper left corner of the largest coding unit as a starting point.

The PU may include partitions (PU partitions or sub-PUs). The PU partition is indicated by a prediction-unit partition index puPartIdx having a sample at the upper left corner of the PU as a starting point.

The PU may include TUs. Similarly as the CU, the TU may be partitioned into four smaller TUs (sub-TUs). This indicates the permission of the quad tree partitioning of a residual signal. The position of the TU is indicated by a transformation unit index tuIdx having a sample at the upper left corner of the PU as a starting point.

Here, the definition of each of the processing units is as follows:

CTB (coding tree block): Basic unit for identifying quad tree partitioning of a square region. Having various square sizes;

LCTB (largest coding tree block): The largest CTB permitted in a slice. A slice includes a plurality of LCTBs that do not overlap one another;

SCTB (smallest coding tree block): The smallest CTB permitted in a slice. Partitioning of a SCTB into smaller CTBs is not permitted;

PU (prediction unit): Basic unit for identifying prediction processing. A PU is as large as a CU in which partitioning is not permitted. Although partitioning a CU into four square regions is permitted, a PU can be partitioned into a plurality of partitions having any shape;

TU (transform unit): Basic unit for identifying transformation and quantization;

CU (coding unit): Same as CTB;

LCU (largest coding unit): Same as the largest CTB; and

SCU (smallest coding unit): Same as the smallest CTB.

Furthermore, quantization parameters include at least one of a delta quantization scale parameter (delta QP or QP delta), a quantization offset parameter, an index (Q matrix select idc), and a quantization dead zone offset parameter. The index is for selecting one of quantized scaling matrices.

The delta quantization scale parameter (delta QP or QP delta) is a difference between a quantization scale parameter to be applied to transform coefficients and a quantization scale parameter specified by a sequence header or a slice header (or a quantization scale parameter immediately before in Z scanning order).

The quantization offset parameter is also referred to as a quantization offset, and is an adjustment value (offset value) for rounding a signal in performing quantization. Thus, when the image coding apparatus 100 performs quantization, it codes the quantization offset. Then, the image decoding apparatus 200 decodes the coded quantization offset. Next, the image decoding apparatus 200 performs correction using the quantization offset when inversely quantizing the transform coefficients.

An index (Qmatrix select idc) is referred to as an adaptive quantization matrix, and indicates which quantization scaling matrix is used from among a plurality of quantization scaling matrices. Furthermore, when there is only one quantization scaling matrix, Qmatrix select idc indicates whether or not the quantization scaling matrix is used. The adaptive quantization matrix can be controlled per block unit (processing unit).

The quantization dead zone offset parameter is referred to as an adaptive dead zone, and is control information for adaptively changing a dead zone per block. The dead zone is a width whose frequency coefficients become 0 by quantization (last width that becomes +1 or −1 after the quantization).

Although a case where the pattern 3 with which a predetermined fixed value is used as a context value is described hereinbefore, the case may be performed under the condition that the control parameters of the upper block and the left block are not used, and further under the condition without using the control parameters of the upper block and the left block as the pattern 3. For example, the context control unit 142 or 242 may determine a context according to the hierarchical depth of a data unit to which each of the control parameters belongs, as the pattern 3.

Embodiment 3

Embodiment 3 will describe which signal type should be used as the first type and the second type (or the third type).

More specifically, the present inventors have verified each of the signal types below among the signal types as indicated in FIG. 3 (Section 9.3.3.1.1.1 of NPL 2). Each of the signal types has been verified, because there are various parameters, and it is difficult to predict whether or not each pattern of the other signal types satisfies the validity, based on a result of the verification on one of the signal types (which one of the patterns 1 to 3 is appropriate).

The verification is in conformity with the structure (setting parameter and software version HM3.0) described in JCTVC-E700, "Common test conditions and software reference configurations" (see NPL 3). Furthermore, each of the test images has a length limited to 49 frames.

The image coding method and the image decoding method according to Embodiment 3 relate to CABAC. Thus, the verification has been conducted using the following four test patterns that are a set of setting values each indicating 1 as the value of Symbol Mode (#0: LCEC, 1: CABAC):

4.1 Intra, high-efficiency setting;
4.3 Random access, high-efficiency setting;
4.5 Low delay, high-efficiency setting; and
4.7 Low delay, high-efficiency setting (P slices only).

The evaluation is made based on an evaluation value called a "BD-rate" that is used as an evaluation standard uniformly used for an implementation evaluation in HEVC. Y BD-rate, U BD-rate, and V BD-rate are BD-rates for a YUV color space, and are evaluation standard values. According to VCEG-AI11 (NPL 4), the BD-rate is an evaluation value obtained by integrating two pairs of code amounts with a result of PSNR, and representing the coding efficiency according to the area ratio. Furthermore, the BD-rate indicating a minus value means that the coding efficiency has been improved. The comparison criteria are based on a result of the output of a reference program which implements the pattern 1. The results of the patterns 2 and 3 are shown with respect to the result of the pattern 1.

The following describes a result of the verification on each of the signal types:

(First verification) split_coding_unit_flag;
(Second verification) skip_flag; and
(Third verification) cbf_luma, cbf_cr, cbf_cb.

(First Verification) split_coding_unit_flag

FIG. 11 illustrates an arithmetic decoding method for split_coding_unit_flag.

The verification is conducted by changing the context model from the pattern 1 to the pattern 2 or 3 only for a signal type to be verified, without changing the context model for the other signal types and the verification parameter specified in NPL 3. In the column in FIG. 11, the value of "Fixed" indicates that the condition (the left block condition or the upper block condition) of the column specified by "Fixed" is not used when a context value (or increment) is derived. In other words, when only one of the left block condition and the upper block condition is "Fixed", only the other condition is used. Furthermore, when both of the left block condition and the upper block condition are "Fixed", a predetermined value (for example, 0) is used as a context value (or increment).

The meaning of the signal type "split_coding_unit_flag" is defined as follows.

split_coding_unit_flag[x0][y0] specifies whether a coding unit is split into coding units with half horizontal and vertical size. The array indices x0, y0 specify the location (x0, y0) of the top-left luma sample of the considered coding block relative to the top-left luma sample of the picture. In other words, "split_coding_unit_flag" indicates whether or not the target CU is partitioned into four. More specifically, the target CU is partitioned when split_coding_unit_flag indicates 1, whereas the target CU is not partitioned when split_coding_unit_flag indicates 0.

Data of split_coding_unit_flag is structured into a coding tree syntax as a syntax. The image decoding apparatus parses a bit sequence in accordance with the syntax of this data structure.

FIGS. 12A and 12B are tables for describing results of the verification on split_coding_unit_flag.

FIG. 12A indicates the result of the verification using one neighboring block (only a determination value of the left block condition L) of the pattern 2. FIG. 12B indicates the result of the verification using zero neighboring block (using neither the upper block condition L nor the left block condition L) of the pattern 3.

The result of the verification in each of FIGS. 12A and 12B indicates the increment and decrement of the BD-rate according to the four test patterns.

Furthermore, the evaluation value is represented by the evaluation standard indicating a value relative to an evaluation value in the case of the pattern 1 in which both of the left block and the upper block are used. More specifically, when the evaluation value is positive, the result is inferior to the evaluation value (BD-rate) in the case of the pattern 1. Furthermore, when the evaluation value is negative, the result is more improved than the evaluation value in the case of the pattern 1.

The result clarifies that the pattern 1 is superior as a pattern of a context model for split_coding_unit_flag. In other words, the evaluation values obtained by the patterns 2 and 3 are inferior to that of the pattern 1.

Thus, when the signal type of a control parameter is split_coding_unit_flag, the context control unit 142 or 242 determines a context value using the pattern 1 that is a conventional pattern of a context model, in terms of the BD-rate.

(Second Verification) skip_flag

FIG. 13 illustrates an arithmetic decoding method for skip_flag. Here, the verification method is the same as that in the first verification.

The meaning of the signal type "skip_flag" is defined as follows.

skip_flag[x0][y0] equal to 1 specifies that for the current coding unit, when decoding a P or B slice, no more syntax elements except the motion vector predictor indices are parsed after skip_flag[x0][y0]. skip_flag[x0][y0] equal to 1 specifies that the coding unit is not to be skipped. The array indices x0, y0 specify the location (x0, y0) of the top-left luma sample of the considered coding block relative to the top-left luma sample of the picture. In other words, skip_flag indicates whether or not the target CU is to be skipped (handled as a skipped block).

Data of skip_flag is structured into a coding unit syntax as a syntax. In other words, skip_flag is set for each CU. The image decoding apparatus parses a bit sequence in accordance with the syntax of this data structure.

FIGS. 14A and 14B are tables for describing results of the verification on skip_flag.

FIG. 14A indicates the result of the verification using one neighboring block (only a determination value of the left block condition L) of the pattern 2. FIG. 14B indicates the result of the verification using zero neighboring block (using neither the upper block condition L nor the left block condition L) of the pattern 3.

The result of the verification in each of FIGS. 14A and 14B indicates the increment and decrement of the BD-rate according to the four test patterns as described for the first verification. Furthermore, the meaning of the evaluation value is the same as that of the first verification.

The result clarifies that the pattern 1 is superior as a pattern of a context model for "skip_flag". In other words, the evaluation values obtained by the patterns 2 and 3 are inferior to that of the pattern 1.

Thus, when the signal type of a control parameter is "skip_flag", the context control unit 142 or 242 determines a context value using the pattern 1 that is a conventional pattern of a context model, in terms of the BD-rate.

(Third Verification) "cbf_luma, cbf_cr, cbf_cb"

FIG. 15 is a table indicating an arithmetic decoding method for cbf_luma, cbf_cr, and cbf_cb.

The meaning of the signal type "cbf_luma" is defined as follows.

cbf_lunna[x0][y0][trafoDepth] equal to 1 specifies that the luma transform block contains one or more transform coefficient levels not equal to 0. The array indices x0, y0 specify the location (x0, y0) of the top-left luma sample of the considered transform block relative to the top-left luma sample of the picture. The array index trafoDepth specifies the current subdivision level of a coding unit into blocks for the purpose of transform coding. trafoDepth is equal to 0 for blocks that correspond to coding units.

In other words, the position of the luma transform block is defined as a value of a three-dimensional array including a hierarchical depth (trafoDepth) relative to a layer of a CU, in addition to the vertical and horizontal elements.

Furthermore, a signal type "cbf_cb" defines cbf_luma regarding luma for chroma (cb). The meaning of the signal type "cbf_cb" is defined as follows.

cbf_cb[x0][y0][trafoDepth] equal to 1 specifies that the Cb transform block contains one or more transform coefficient levels not equal to 0. The array indices x0, y0 specify the location (x0, y0) of the top-left luma sample of the considered transform block relative to the top-left luma sample of the picture. The array index trafoDepth specifies the current subdivision level of a coding unit into blocks for the purpose of transform coding. trafoDepth is equal to 0 for blocks that correspond to coding units. When cbf_cb[x0][y0][trafoDepth] is not present and PredMode is not equal to MODE_INTRA, the value of cbf_cb[x0][y0][trafoDepth] is inferred to be equal to 0.

In other words, the position of the Cb transform block is defined as a value of a three-dimensional array including a hierarchical depth (trafoDepth) relative to a layer of a CU, in addition to the vertical and horizontal elements.

Furthermore, a signal type "cbf_cr" defines cbf_luma regarding luma for chroma (cr). The meaning of the signal type "cbf_cr" is defined as follows.

cbf_cr[x0][y0][trafoDepth] equal to 1 specifies that the Cb transform block contains one or more transform coefficient levels not equal to 0. The array indices x0, y0 specify the location (x0, y0) of the top-left luma sample of the considered transform block relative to the top-left luma sample of the picture. The array index trafoDepth specifies the current subdivision level of a coding unit into blocks for the purpose of transform coding. trafoDepth is equal to 0 for blocks that correspond to coding units. When cbf_cr[x0][y0][trafoDepth] is not present and PredMode is not equal to MODE_INTRA, the value of cbf_cr[x0][y0][trafoDepth] is inferred to be equal to 0.

In other words, the position of the Cb transform block is defined as a value of a three-dimensional array including a hierarchical depth (trafoDepth) relative to a layer of a CU, in addition to the vertical and horizontal elements.

FIGS. 16A and 16B are tables for describing results of the verification on cbf_luma, cbf_cr, and cbf_cb.

FIG. 16A indicates the result of the verification using one neighboring block (only a determination value of the left block condition L) of the pattern 2. FIG. 16B indicates the result of the verification using zero neighboring block (using neither the upper block condition L nor the left block condition L) of the pattern 3.

The result of the verification in each of FIGS. 16A and 16B indicates the increment and decrement of the BD-rate according to the four test patterns as described for the first verification. Furthermore, the meaning of the evaluation value is the same as that of the first verification.

The result is different from those of the first verification of split_coding_unit_flag and the second verification of skip_flag. There is no significant difference in BD-rate between the patterns 1 and 2 or 3 as a pattern of a context model for cbf_luma, cbf_cr, and cbf_cb.

Thus, under a mixed environment with a plurality of control parameters of signal types, the context control unit 142 or 242 determines a context value without using the upper block as a neighboring block particularly when the signal type of the control parameter is cbf_luma, cbf_cr, and cbf_cb. In other words, the context control unit 142 or 242 determines a context value using the pattern 2 or 3 when the signal type of the control parameter is cbf_luma, cbf_cr, and cbf_cb. In other words, the first type includes "split_coding_unit_flag" or "skip_flag", and the second type or the third type includes "cbf_luma, cbf_cr, and cbf_cb". Accordingly, the image coding apparatus and the image decoding apparatus according to Embodiment 3 can reduce memory usage while suppressing the decrease in the BD-rate.

When the pattern 2 is compared with the pattern 3 for cbf_luma, cbf_cr, and cbf_cb, these BD-rates have no significant difference. Thus, it is preferred to use the pattern 3 for cbf_luma, cbf_cr, and cbf_cb. Accordingly, it is possible to further reduce the memory usage and the processing amount.

Furthermore, cbf_luma, cbf_cb, and cbf_cr are values of a three-dimensional array having a depth. Thus, as described for FIG. 9 according to Embodiment 2, distances (remoteness) between neighboring reference values in the decoding order (including recursive execution order and will be the same hereinafter) are different according to the respective hierarchical depths. Accordingly, whether or not the value of the control parameter is actually available or produces the advantage for reducing the memory usage differs depending on a position of a block in the hierarchical relationship.

Thus, the context control unit 142 and 242 may change a determination criterion of a conditional value according to the hierarchical depth. For example, the context control unit 142 and 242 may use (follow) a conditional value of a block in the higher layer as a conditional value of a block in the lower layer.

Furthermore, the context control unit 142 and 242 may change these criteria in consideration of the position relationship with another slice, in addition to the above or singly.

As a result of the above verifications, the following detailed modification is conceivable. Whether or not the dilution effect occurs depends on the number of trainings to which the condition is applied. Generally, Y that represents luminance in Y, U, and V, such as the 4:2:0 format, is greater in number of samples than the other two axes (U and V). Thus, one boundary that should be distinguished is between (a) luma and (b) a pair of cb and cr.

For example, the pattern 3 may be applied to (a) cbf_luma, and the other pattern 2 or 1 may be applied to (b) cbf_cb and cbf_cr. In other words, the context control unit 142 and 242 may determine a context using a different condition for each case where the signal type is the "cbf_luma", or the signal type is one of the "cbf_cb" and the "cbf_cr".

Here, when the number of trainings is sufficient, it is preferred that the context control unit 142 and 242 increase the number of (context) conditions for the precision. Furthermore, it is preferred that the context control unit 142 and 242 decrease the number of the context conditions when the number of trainings is less. Thus, the context control unit 142 and 242 may switch between these conditions according to the resolution. Furthermore, the context control unit 142 and 242 may switch between these conditions according to the format (4:2:0) and others.

Furthermore, cbf_luma, cbf_cr, and cbf_cb indicate the presence or absence of coefficients of luma or chroma. In other words, cbf_luma, cbf_cr, and cbf_cb are hierarchically lower than no_residual_data_flag indicating the presence or absence of residual data. Here, no_residual_data_flag is used for the largest TU that can be selected for the size of a CU in a relationship of CU≥PU≥TU. More specifically, no_residual_data_flag is used in the top layer of a TU. On the other hand, cbf_luma, cbf_cr, and cbf_cb are used in a layer lower than the layer of no_residual_data_flag. The presence of no_residual_data_flag indicates that the subsequent blocks have no residual data. Furthermore, as the depth is greater, the residual data is probably present. Thus, the context control unit 142 and 242 can improve the coding efficiency using the hierarchical information for cbf_luma, cbf_cr, and cbf_cb. In other words, the context control unit 142 and 242 may determine a context according to a hierarchical depth of a data unit to which the control parameter (cbf_luma, cbf_cr, and cbf_cb) of the current block belongs. On the other hand, since no_residual_data_flag is a flag that depends on a prediction mode, it is preferred that a fixed value that does not depend on a depth as a context value is used.

Although the image coding apparatus and the image decoding apparatus according to Embodiments 1 to 3 of the present invention are described, the present invention is not limited to these Embodiments.

For example, at least part of the image coding apparatus, the image decoding apparatus, and functions of the modifications of these apparatuses according to Embodiments 1 to 3 may be combined.

Furthermore, all the values and the logical values described above are exemplifications for specifically describing the present invention, and the present invention is not limited by the exemplified values.

Furthermore, the divisions of the functional blocks in the block diagrams are examples. Thus, the functional blocks may be implemented as one functional block, one functional block may be divided into a plurality of functional blocks, and a part of the functions may be switched to another functional block. Furthermore, a plurality of functional blocks having similar functions may be processed by single hardware or software in parallel or with time division.

The orders of the steps of the image coding method performed by the image coding apparatus and the image decoding method performed by the image decoding apparatus are for specifically describing the present invention, and may be an order other than the above orders. Furthermore, part of the steps may be performed simultaneously (in parallel) with the other steps.

Embodiment 4

The processing described in each of Embodiments can be simply implemented by a computer system by recording, onto a recording medium, a program for implementing the structure of the moving image coding method or the moving image decoding method described in Embodiment. The recording medium may be any recording medium as long as the program can be recorded thereon, such as a magnetic disk, an optical disc, a magnetic optical disc, an IC card, and a semiconductor memory.

Hereinafter, the applications to the moving image coding method or the moving image decoding method described in each of Embodiments and a system using the same will be described.

Figure 19:
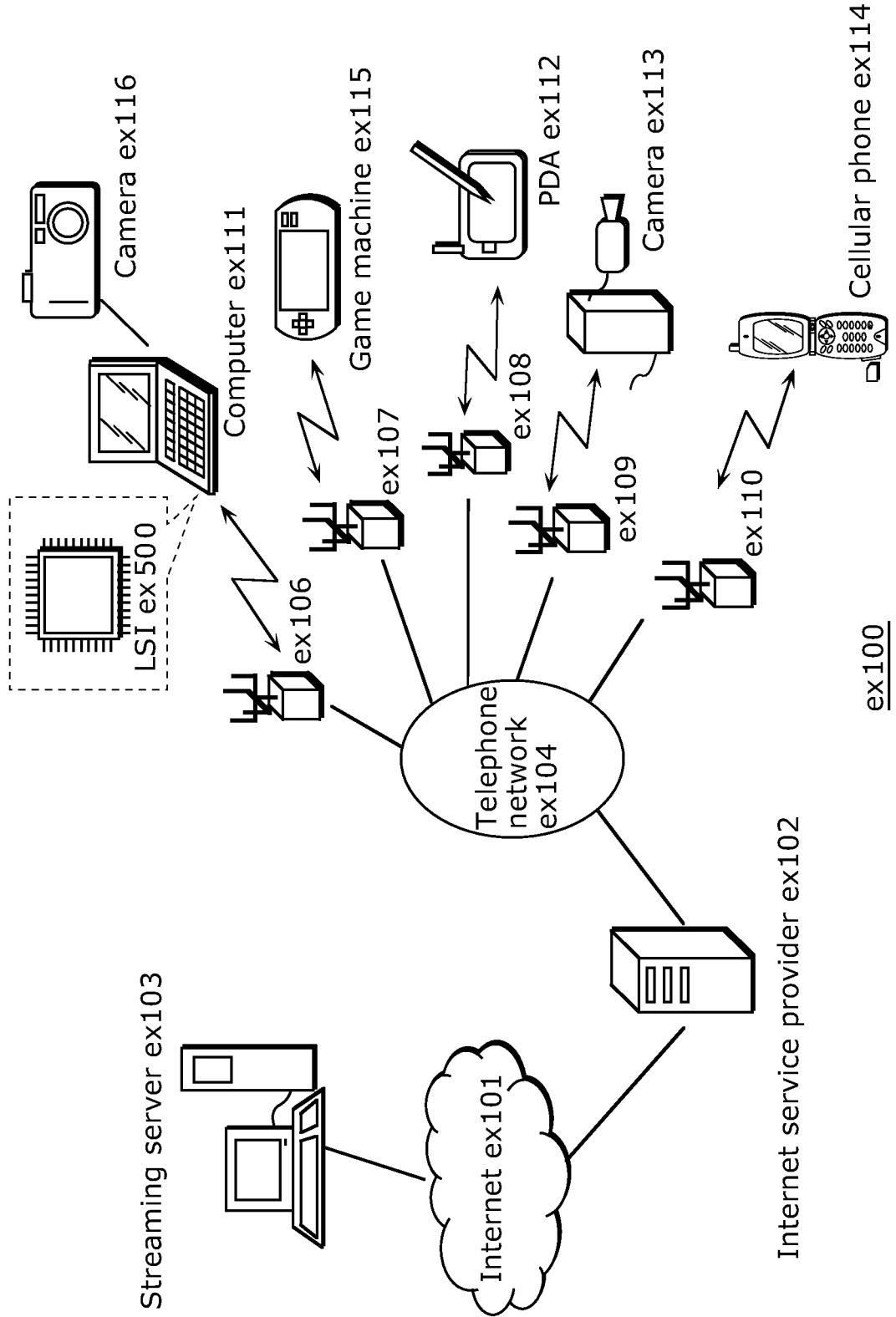
FIG. 19 illustrates an overall configuration of a content providing system for implementing content distribution services.

FIG. 19 illustrates an overall configuration of a content providing system ex100 for implementing content distribution services. The area for providing communication services is divided into cells of desired size, and base stations ex106 to ex110 which are fixed wireless stations are placed in each of the cells.

The content providing system ex100 is connected to devices, such as a computer ex111, a personal digital assistant (PDA) ex112, a camera ex113, a cellular phone ex114 and a game machine ex115, via an Internet ex101, an Internet service provider ex102, a telephone network ex104, as well as the base stations ex106 to ex110.

However, the configuration of the content providing system ex100 is not limited to the configuration shown in FIG. 19, and a combination in which any of the elements are connected is acceptable. In addition, each of the devices may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing moving images. A camera ex116, such as a digital video camera, is capable of capturing both still images and moving images. Furthermore, the cellular phone ex114 may be the one that meets any of the standards such as Global System for Mobile Communications (GSM), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS).

In the content providing system ex100, a streaming server ex103 is connected to the camera ex113 and others via the telephone network ex104 and the base station ex 109, which enables distribution of a live show and others. For such a distribution, a content (for example, video of a music live show) captured by the user using the camera ex113 is coded as described above in each of Embodiments, and the coded content is transmitted to the streaming server ex103. On the other hand, the streaming server ex103 carries out stream distribution of the received content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the coded data.

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and moving images captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, generally, the computer ex111 and an LSI ex500 included in each of the devices perform such coding and decoding processes. The LSI ex500 may be configured of a single chip or a plurality of chips. Software for coding and decoding moving images may be integrated into some type of a recording medium (such as a CD-ROM, a flexible disk, a hard disk) that is readable by the computer ex111 and others, and the coding and decoding processes may be performed using the software. Furthermore, when the cellular phone ex114 is equipped with a camera, the video data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients can receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

Figure 20:
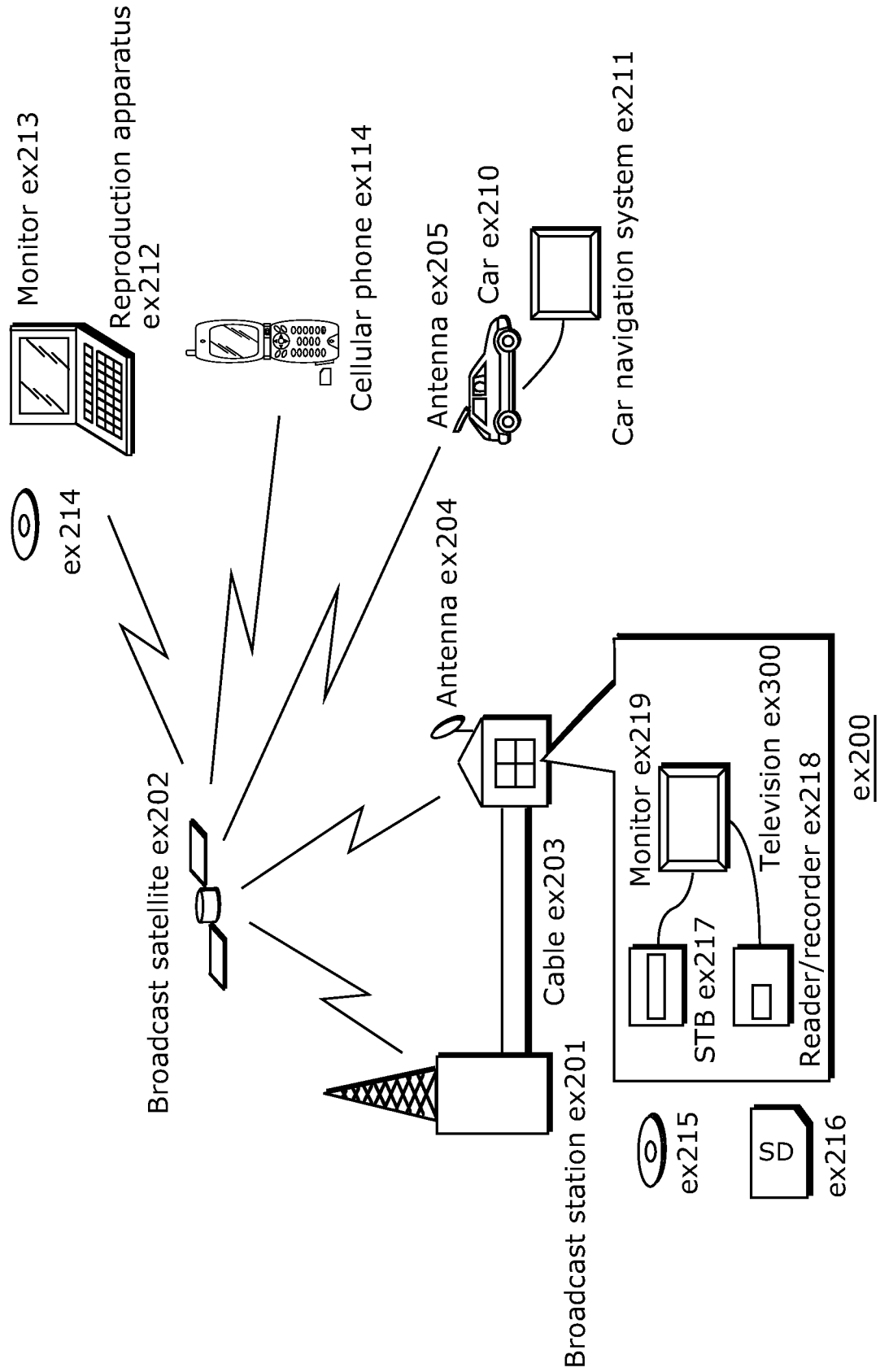
FIG. 20 illustrates an overall configuration of a digital broadcasting system.

The present invention is not limited to the above-mentioned content providing system ex100, and at least either the moving image coding apparatus or the moving image decoding apparatus described in each of Embodiments can be incorporated into a digital broadcasting system ex200 as shown in FIG. 20. More specifically, a broadcast station ex201 communicates or transmits, via radio waves to a broadcast satellite ex202, multiplexed data obtained by multiplexing the audio data and the video data. The video data is data coded according to the moving image coding method described in each of Embodiments. Upon receipt of the video data, the broadcast satellite ex202 transmits radio waves for broadcasting. Then, a home-use antenna ex204 capable of receiving a satellite broadcast receives the radio waves. A device, such as a television (receiver) ex300 and a set top box (STB) ex217, decodes the received multiplexed data and reproduces the data.

Furthermore, a reader/recorder ex218 that (i) reads and decodes the multiplexed data recorded on a recording media ex215, such as a DVD and a BD, or (ii) codes video signals in the recording medium ex215, and in some cases, writes data obtained by multiplexing an audio signal on the coded data can include the moving image decoding apparatus or the moving image coding apparatus as shown in each of Embodiments. In this case, the reproduced video signals are displayed on the monitor ex219, and another apparatus or system can reproduce the video signals, using the recording medium ex215 on which the multiplexed data is recorded. Furthermore, it is also possible to implement the moving image decoding apparatus in the set top box ex217 connected to the cable ex203 for a cable television or the antenna ex204 for satellite and/or terrestrial broadcasting, so as to display the video signals on the monitor ex219 of the television ex300. The moving image decoding apparatus may be included not in the set top box but in the television ex300.

Figure 21:
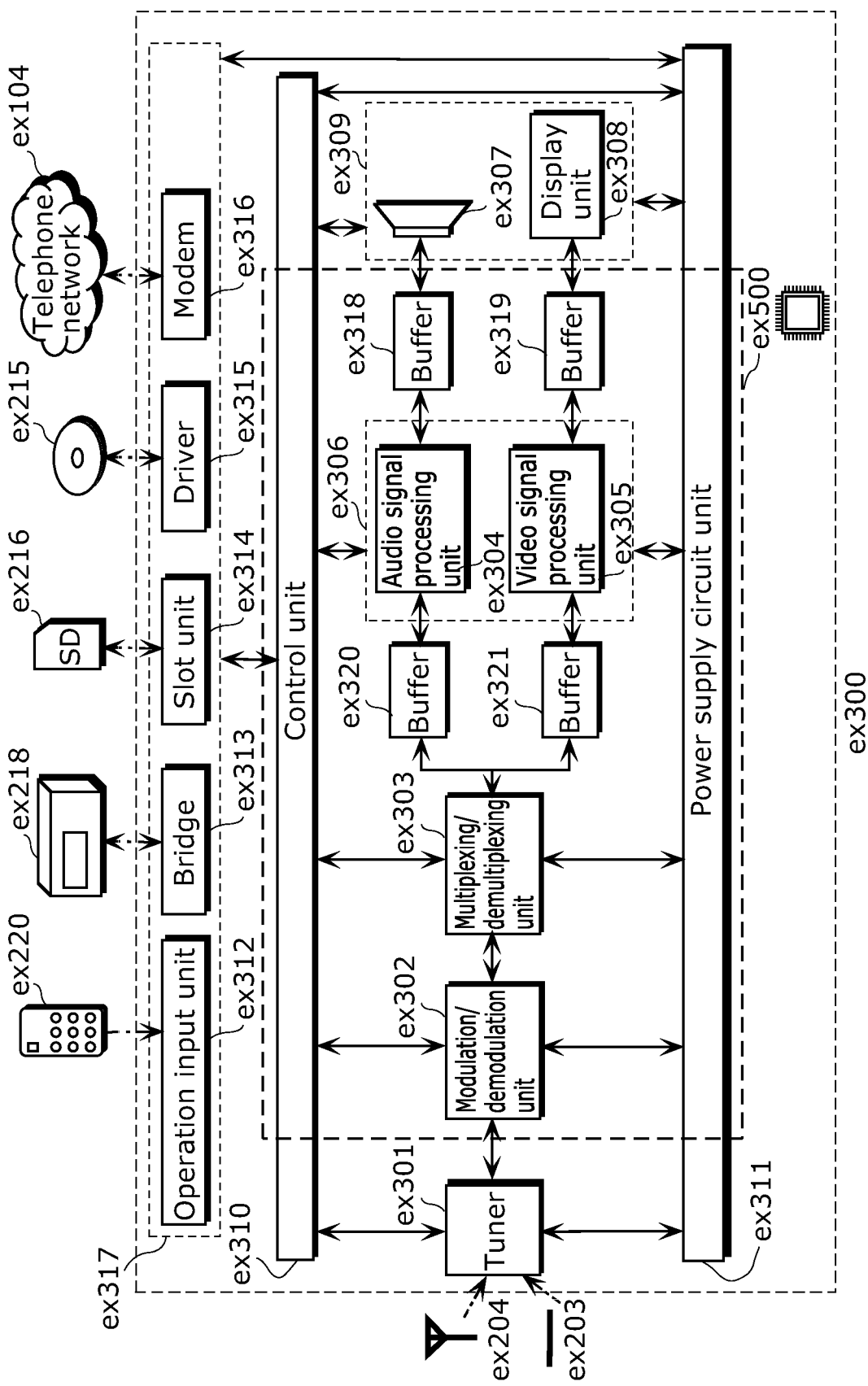
FIG. 21 is a block diagram illustrating an example of a configuration of a television.

FIG. 21 illustrates the television (receiver) ex300 that uses the moving image coding method and the moving image decoding method described in each of Embodiments. The television ex300 includes: a tuner ex301 that obtains or provides multiplexed data obtained by multiplexing the audio data and the video data through the antenna ex204 or the cable ex203, etc. that receives a broadcast; a modulation/demodulation unit ex302 that demodulates the received multiplexed data or modulates data into multiplexed data to be supplied outside; and a multiplexing/demultiplexing unit ex303 that demultiplexes the modulated multiplexed data into video data and audio data, or multiplexes the video data and audio data coded by the signal processing unit ex306 into data.

Furthermore, the television ex300 further includes: a signal processing unit ex306 including an audio signal processing unit ex304 and a video signal processing unit ex305 that decode audio data and video data and code audio data and video data, respectively; a speaker ex307 that provides the decoded audio signal; and an output unit ex309 including a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to one another through a synchronous bus.

First, a configuration in which the television ex300 decodes the multiplexed data obtained from outside through the antenna ex204 and others and reproduces the decoded data will be described. In the television ex300, upon receipt of a user operation from a remote controller ex220 and others, the multiplexing/demultiplexing unit ex303 demultiplexes the multiplexed data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in each of Embodiments, in the television ex300. The output unit ex309 provides the decoded video signal and audio signal outside. When the output unit ex309 provides the video signal and the audio signal, the signals may be temporarily stored in buffers ex318 and ex319, and others so that the signals are reproduced in synchronization with each other. Furthermore, the television ex300 may read the multiplexed data not through a broadcast and others but from the recording media ex215 and ex216, such as a magnetic disk, an optical disc, and an SD card. Next, a configuration in which the television ex300 codes an audio signal and a video signal, and transmits the data outside or writes the data on a recording medium will be described. In the television ex300, upon receipt of a user operation from the remote controller ex220 and others, the audio signal processing unit ex304 codes an audio signal, and the video signal processing unit ex305 codes a video signal, under control of the control unit ex310 using the image coding method as described in each of Embodiments. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in buffers ex320 and ex321, and others so that the signals are reproduced in synchronization with each other. Here, the buffers ex318 to ex321 may be plural as illustrated, or at least one buffer may be shared in the television ex300. Furthermore, data may be stored in a buffer other than the buffers ex318 to ex321 so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be not capable of performing all the processes but capable of only one of receiving, decoding, and providing outside data.

Furthermore, when the reader/recorder ex218 reads or writes the multiplexed data from or in a recording medium, one of the television ex300 and the reader/recorder ex218 may decode or code the multiplexed data, and the television ex300 and the reader/recorder ex218 may share the decoding or coding.

Figure 22:
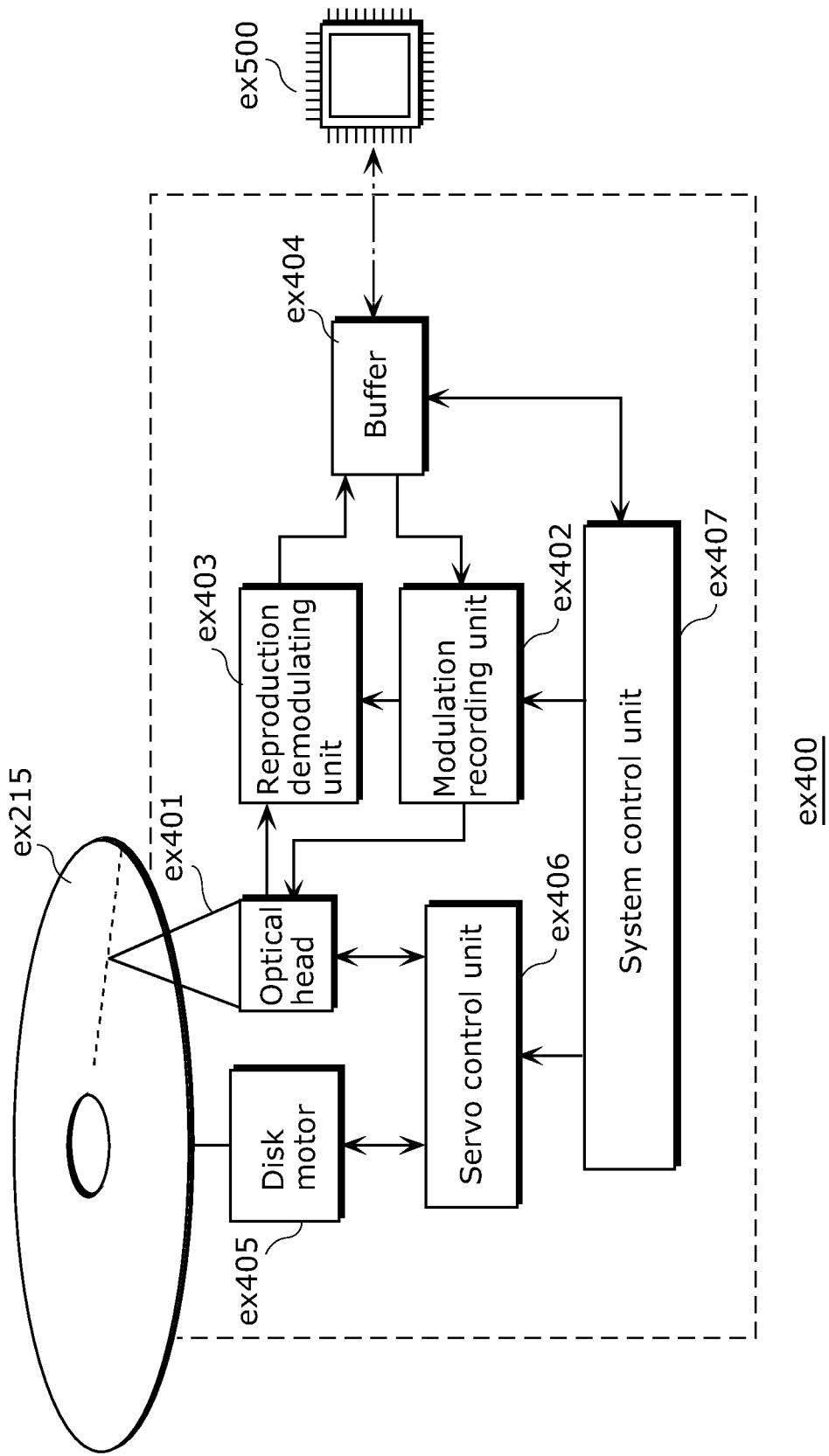
FIG. 22 is a block diagram illustrating an example of a configuration of an information reproducing/recording unit that reads and writes information from or on a recording medium that is an optical disc.

As an example, FIG. 22 illustrates a configuration of an information reproducing/recording unit ex400 when data is read or written from or in an optical disc. The information reproducing/recording unit ex400 includes constituent elements ex401 to ex407 to be described hereinafter. The optical head ex401 irradiates a laser spot on a recording surface of the recording medium ex215 that is an optical disc to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. A disk motor ex405 rotates the recording medium ex215. A servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 23:
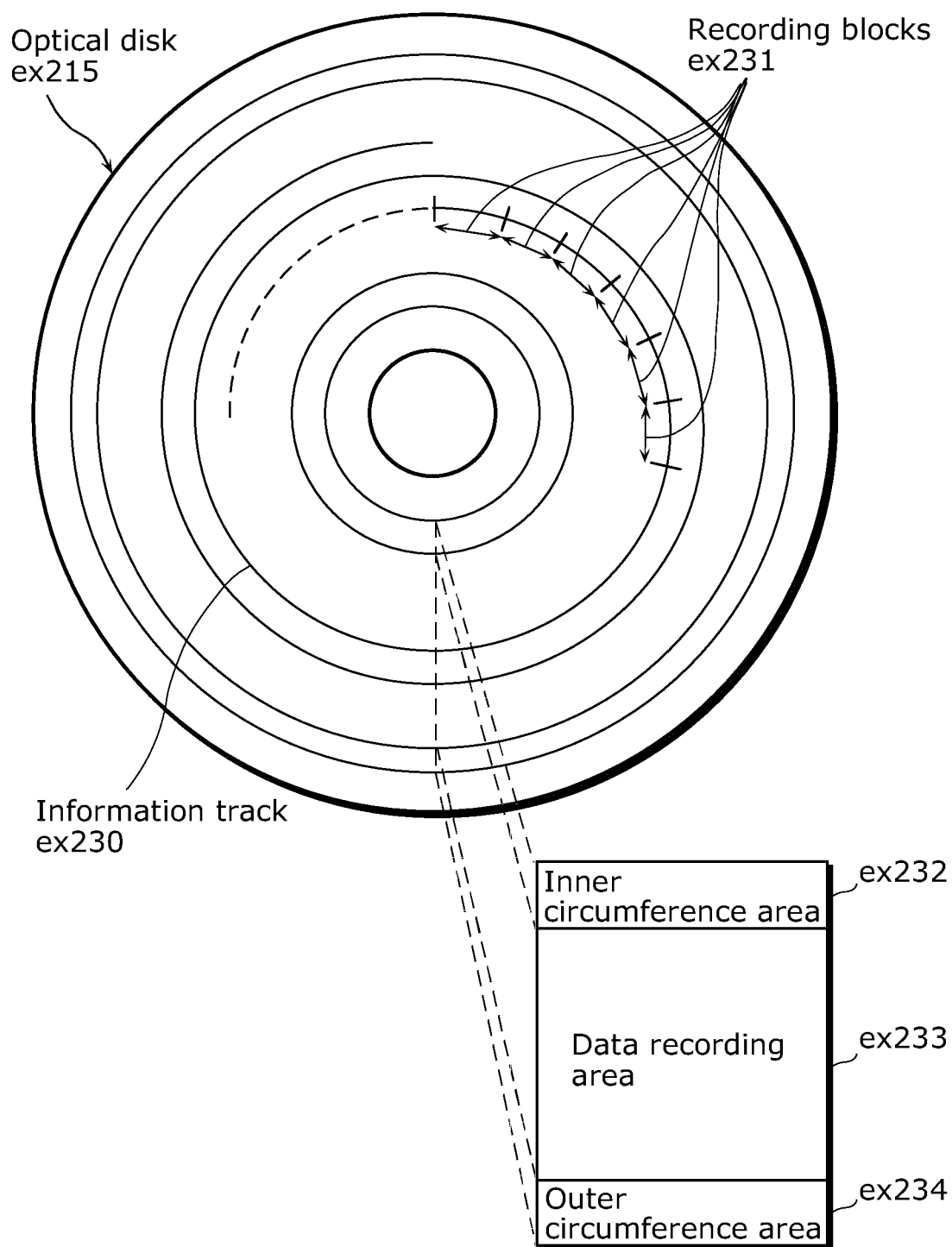
FIG. 23 illustrates an example of a configuration of a recording medium that is an optical disc.

FIG. 23 schematically illustrates the recording medium ex215 that is the optical disc. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. An apparatus that records and reproduces data reproduces the information track ex230 and reads the address information so as to determine the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio data, coded video data, or multiplexed data obtained by multiplexing the coded audio data and the coded video data, from and on the data recording area ex233 of the recording medium ex215.

Although an optical disc having a layer, such as a DVD and a BD is described as an example in the description, the optical disc is not limited to such, and may be an optical disc having a multilayer structure and capable of being recorded on a part other than the surface. Furthermore, the optical disc may have a structure for multidimensional recording/reproduction, such as recording of information using light of colors with different wavelengths in the same portion of the optical disc and recording information having different layers from various angles.

Furthermore, the car ex210 having the antenna ex205 can receive data from the satellite ex202 and others, and reproduce video on the display device such as the car navigation system ex211 set in the car ex210, in a digital broadcasting system ex200. Here, a configuration of the car navigation system ex211 will be the one for example, including a GPS receiving unit in the configuration illustrated in FIG. 21. The same will be true for the configuration of the computer ex111, the cellular phone ex114, and others.

Figure 24A:
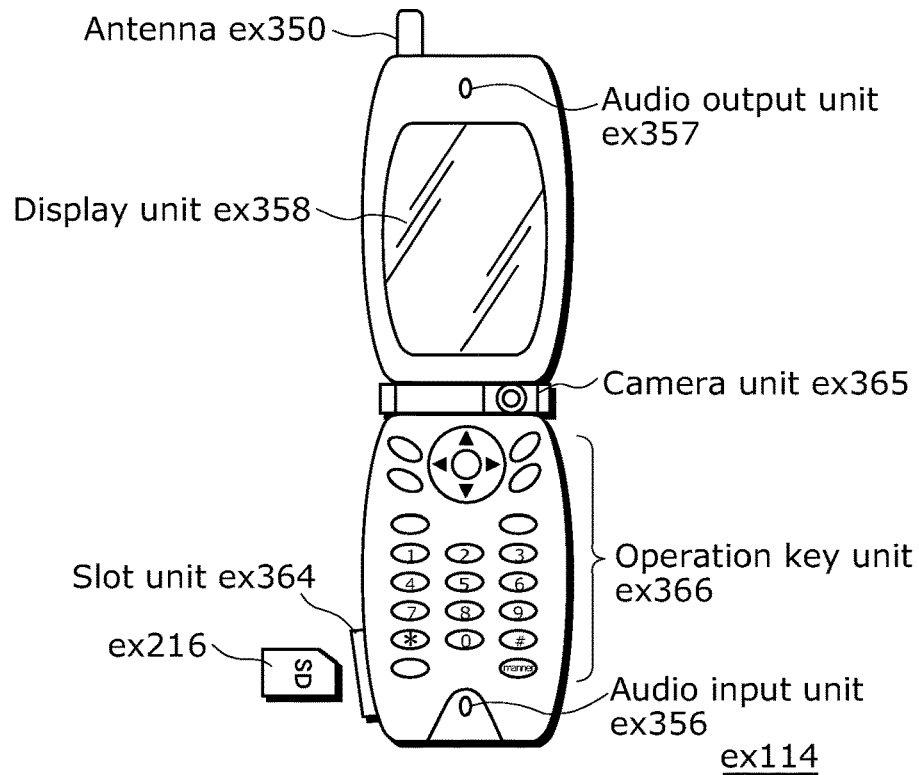
FIG. 24A illustrates an example of a cellular phone.

FIG. 24A illustrates the cellular phone ex114 that uses the moving image coding method and the moving image decoding method described in each of Embodiments. The cellular phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The cellular phone ex114 further includes: a main body unit including a set of operation keys ex366; an audio output unit ex357 such as a speaker for output of audio; an audio input unit ex356 such as a microphone for input of audio; a memory unit ex367 for storing captured video or still pictures, recorded audio, coded or decoded data of the received video, the still images, e-mails, or others; and a slot unit ex364 that is an interface unit for a recording medium that stores data in the same manner as the memory unit ex367.

Figure 24B:
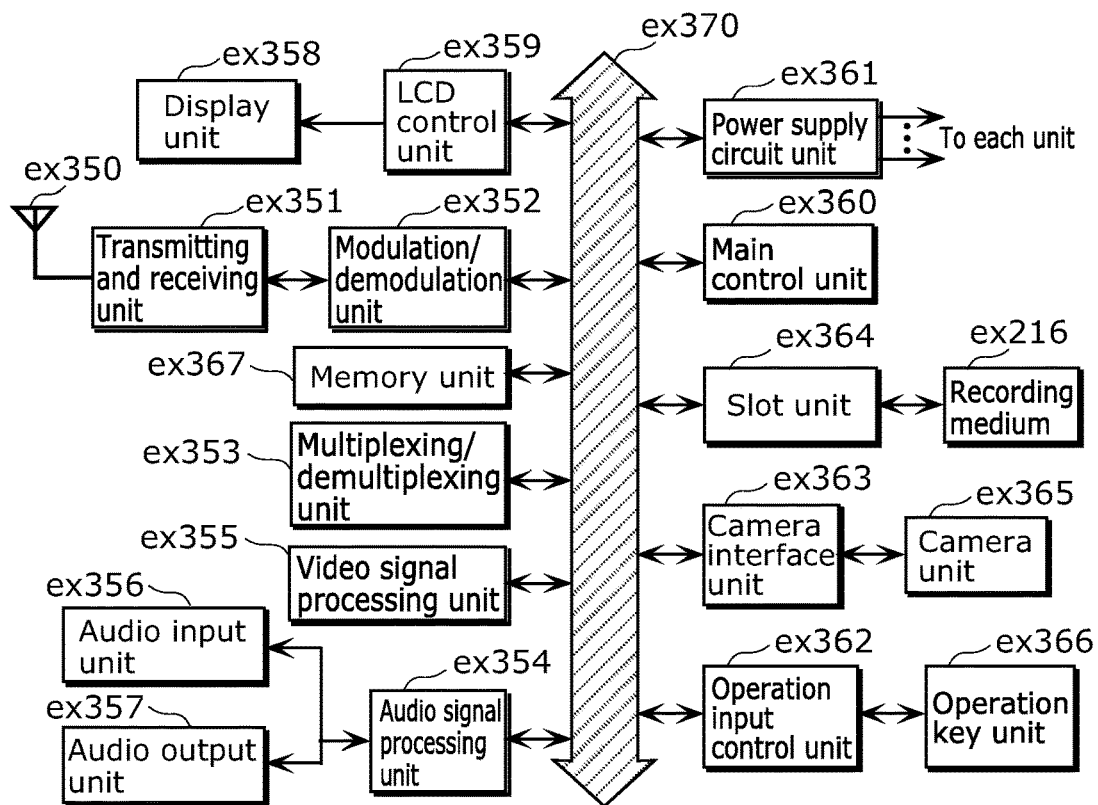
FIG. 24B illustrates a block diagram showing an example of a configuration of the cellular phone.

Next, an example of a configuration of the cellular phone ex114 will be described with reference to FIG. 24B. In the cellular phone ex114, a main control unit ex360 designed to control overall each unit of the main body including the display unit ex358 as well as the operation keys ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulation/demodulation unit ex352, a multiplexing/demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the cellular phone ex114, the audio signal processing unit ex354 converts the audio signals collected by the audio input unit ex356 in voice conversation mode into digital audio signals under the control of the main control unit ex360 including a CPU, ROM, and RAM. Then, the modulation/demodulation unit ex352 performs spread spectrum processing on the digital audio signals, and the transmitting and receiving unit ex351 performs digital-to-analog conversion and frequency conversion on the data, so as to transmit the resulting data via the antenna ex350. Also, in the cellular phone ex114, the transmitting and receiving unit ex351 amplifies the data received by the antenna ex350 in voice conversation mode and performs frequency conversion and the analog-to-digital conversion on the data.

Then, the modulation/demodulation unit ex352 performs inverse spread spectrum processing on the data, and the audio signal processing unit ex354 converts it into analog audio signals, so as to output them via the audio output unit ex357. Furthermore, when an e-mail in data communication mode is transmitted, text data of the e-mail inputted by operating the operation keys ex366 and others of the main body is sent out to the main control unit ex360 via the operation input control unit ex362. The main control unit ex360 causes the modulation/demodulation unit ex352 to perform spread spectrum processing on the text data, and the transmitting and receiving unit ex351 performs the digital-to-analog conversion and the frequency conversion on the resulting data to transmit the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and codes video signals supplied from the camera unit ex365 using the moving image coding method shown in each of Embodiments, and transmits the coded video data to the multiplexing/demultiplexing unit ex353. In contrast, during when the camera unit ex365 captures video, still images, and others, the audio signal processing unit ex354 codes audio signals collected by the audio input unit ex356, and transmits the coded audio data to the multiplexing/demultiplexing unit ex353.

The multiplexing/demultiplexing unit ex353 multiplexes the coded video data supplied from the video signal processing unit ex355 and the coded audio data supplied from the audio signal processing unit ex354, using a predetermined method. Then, the modulation/demodulation unit ex352 performs spread spectrum processing on the multiplexed data, and the transmitting and receiving unit ex351 performs digital-to-analog conversion and frequency conversion on the data so as to transmit the resulting data via the antenna ex350.

When receiving data of a video file which is linked to a Web page and others in data communication mode or when receiving an e-mail with video and/or audio attached, in order to decode the multiplexed data received via the antenna ex350, the multiplexing/demultiplexing unit ex353 demultiplexes the multiplexed data into a video data bit stream and an audio data bitstream, and supplies the video signal processing unit ex355 with the coded video data and the audio signal processing unit ex354 with the coded audio data, through the synchronous bus ex370. The video signal processing unit ex355 decodes the video signal using a moving image decoding method corresponding to the moving image coding method shown in each of Embodiments, and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television ex300, a terminal such as the cellular phone ex114 probably have 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus. Although the digital broadcasting system ex200 receives and transmits the multiplexed data obtained by multiplexing audio data onto video data in the description, the multiplexed data may be data obtained by multiplexing not audio data but character data related to video onto video data, and may be not multiplexed data but video data itself.

As such, the moving image coding method and the moving image decoding method in each of Embodiments can be used in any of the devices and systems described. Thus, the advantages described in each of Embodiments can be obtained.

Furthermore, the present invention is not limited to Embodiments, and various modifications and revisions are possible without departing from the scope of the present invention.

Embodiment 5

Video data can be generated by switching, as necessary, between (i) the moving image coding method or the moving image coding apparatus shown in each of Embodiments and (ii) a moving image coding method or a moving image coding apparatus in conformity with a different standard, such as MPEG-2, MPEG4-AVC, and VC-1.

Here, when a plurality of video data that conforms to the different standards is generated and is then decoded, the decoding methods need to be selected to conform to the different standards. However, since to which standard each of the plurality of the video data to be decoded conforms cannot be detected, there is a problem that an appropriate decoding method cannot be selected.

In order to solve the problem, multiplexed data obtained by multiplexing audio data and others onto video data has a structure including identification information indicating to which standard the video data conforms. The specific structure of the multiplexed data including the video data generated in the moving image coding method and by the moving image coding apparatus shown in each of Embodiments will be hereinafter described. The multiplexed data is a digital stream in the MPEG-2 Transport Stream format.

FIG. 25 illustrates a structure of multiplexed data. As illustrated in FIG. 25, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part, and the presentation graphics stream represents subtitles of a movie. Here, the primary video is normal video to be displayed on a screen, and the secondary video is video to be displayed on a smaller window in the main video. Furthermore, the interactive graphics stream represents an interactive screen to be generated by arranging the GUI components on a screen. The video stream is coded in the moving image coding method or by the moving image coding apparatus shown in each of Embodiments, or in a moving image coding method or by a moving image coding apparatus in conformity with a conventional standard, such as MPEG-2, MPEG4-AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary video to be mixed with the primary audio.

Figure 26:
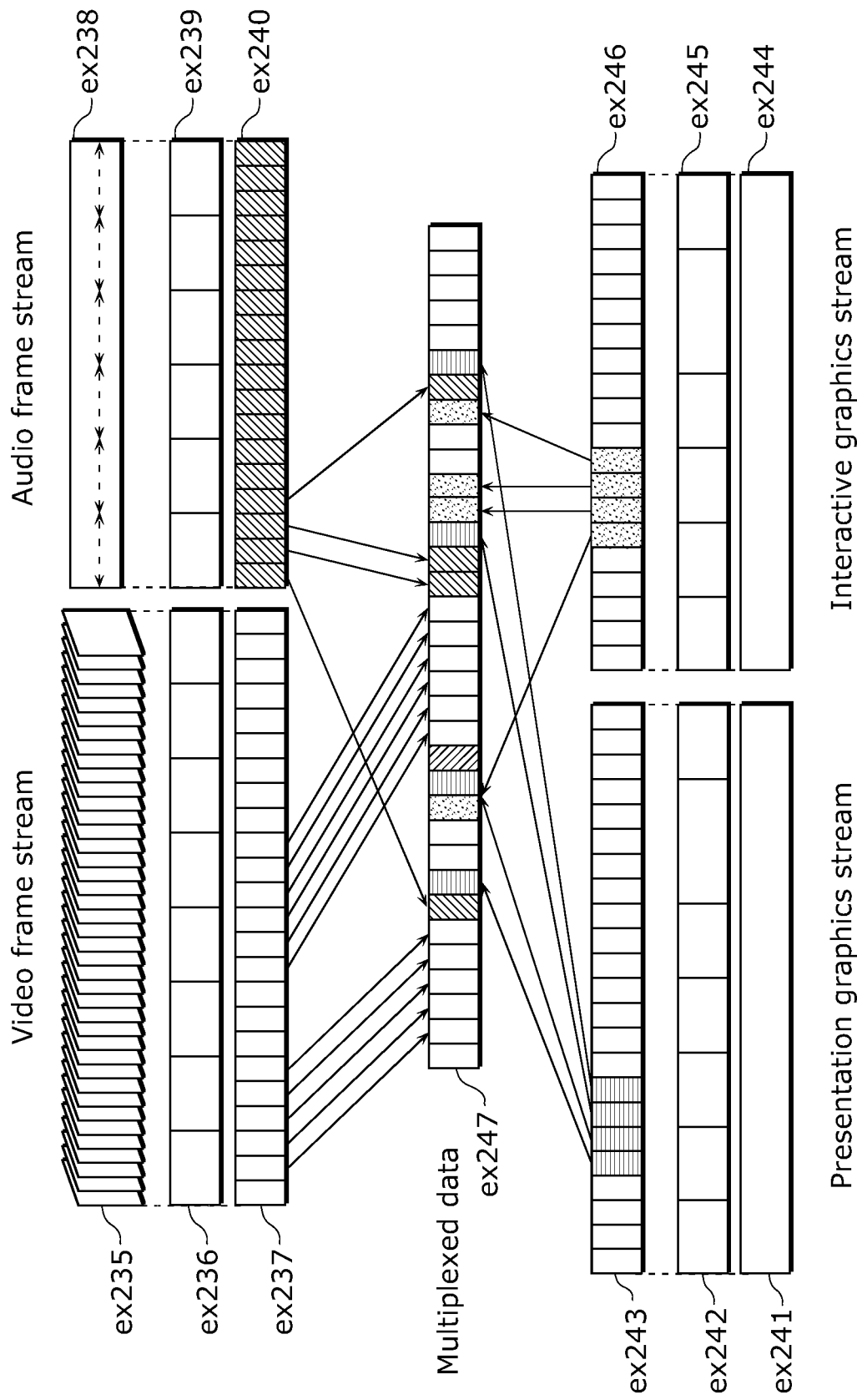
FIG. 26 schematically illustrates how each stream is multiplexed in multiplexed data.

FIG. 26 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets ex245, and further into TS packets ex243 and TS packets ex246, respectively. These TS packets are multiplexed into a stream to obtain multiplexed data ex247.

Figure 27:
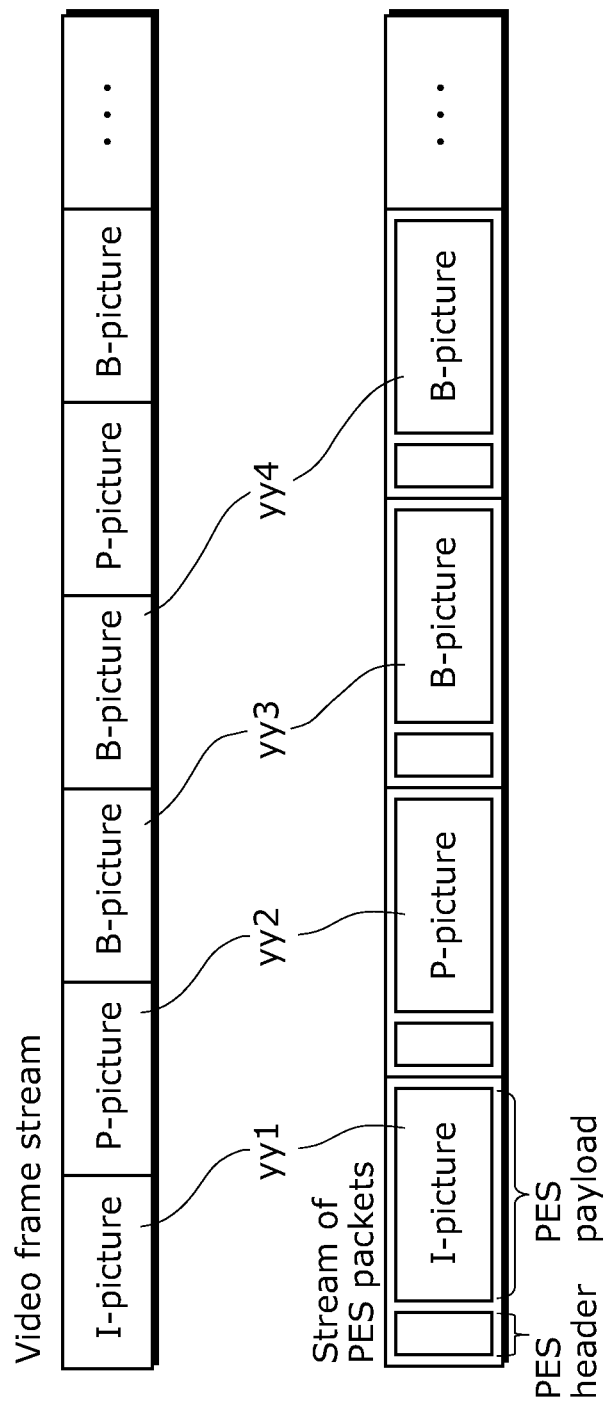
FIG. 27 illustrates how a video stream is stored in a stream of PES packets in more detail.

FIG. 27 illustrates how a video stream is stored in a stream of PES packets in more detail. The first bar in FIG. 27 shows a video frame stream in a video stream. The second bar shows the stream of PES packets. As indicated by arrows denoted as yy1, yy2, yy3, and yy4 in FIG. 27, the video stream is divided into pictures as I pictures, B pictures, and P pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

FIG. 28 illustrates a format of TS packets to be finally written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The numbers incrementing from the head of the multiplexed data are called source packet numbers (SPNs) as shown at the bottom of FIG. 28.

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information of the streams corresponding to the PIDs. The PMT also has various descriptors relating to the multiplexed data. The descriptors have information such as copy control information showing whether copying of the multiplexed data is permitted or not. The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

Figure 29:
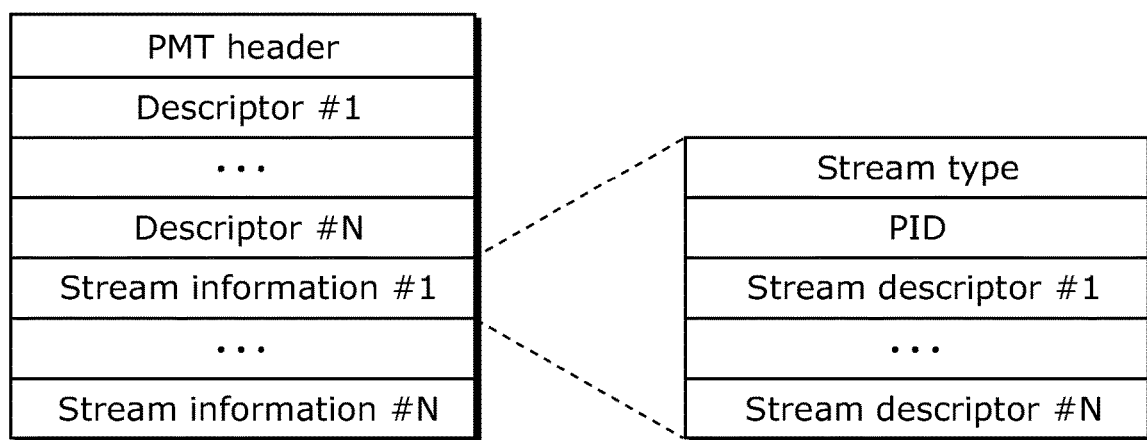
FIG. 29 illustrates a data structure of a PMT.

FIG. 29 illustrates the data structure of the PMT in detail. A PMT header is disposed at the top of the PMT. The PMT header describes the length of data included in the PMT and others. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec of a stream, a stream PID, and stream attribute information (such as a frame rate or an aspect ratio). The stream descriptors are equal in number to the number of streams in the multiplexed data.

When the multiplexed data is recorded on a recording medium and others, it is recorded together with multiplexed data information files.

Figure 30:
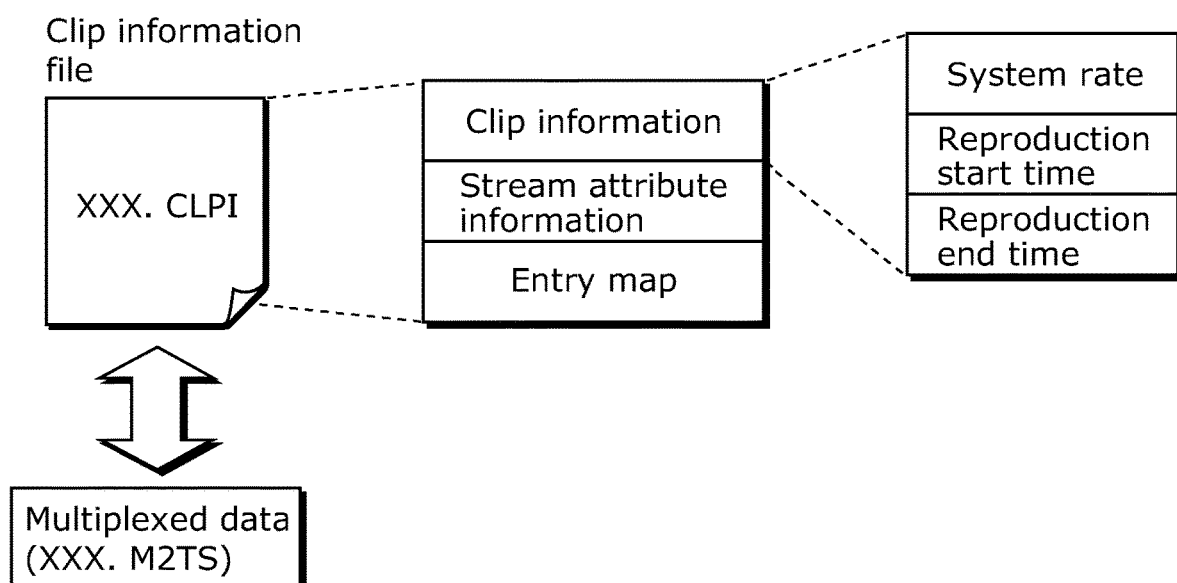
FIG. 30 illustrates an internal structure of multiplexed data information.

Each of the multiplexed data information files is management information of the multiplexed data as shown in FIG. 30. The multiplexed data information files are in one to one correspondence with the multiplexed data, and each of the files includes multiplexed data information, stream attribute information, and an entry map.

As illustrated in FIG. 30, the multiplexed data information includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

Figure 31:
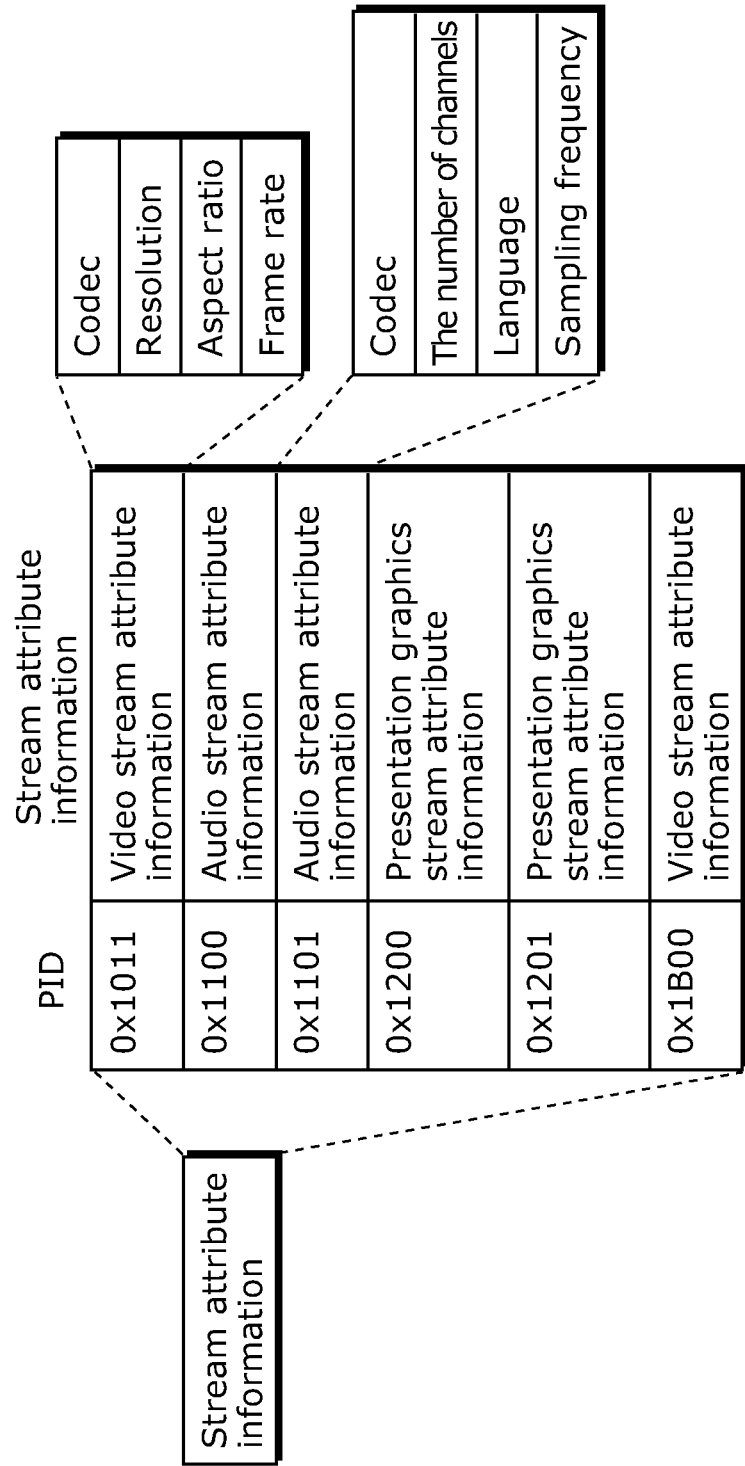
FIG. 31 illustrates an internal structure of stream attribute information.

As shown in FIG. 31, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data that is included in the video stream. Each piece of audio stream attribute information carries information including what kind of compression codec is used for compressing the audio stream, how many channels are included in the audio stream, which language the audio stream supports, and how high the sampling frequency is. The video stream attribute information and the audio stream attribute information are used for initialization of a decoder before the player plays back the information.

In Embodiment 5, the multiplexed data to be used is of a stream type included in the PMT. Furthermore, when the multiplexed data is recorded on a recording medium, the video stream attribute information included in the multiplexed data information is used. More specifically, the moving image coding method or the moving image coding apparatus described in each of Embodiments includes a step or a unit for allocating unique information indicating video data generated by the moving image coding method or the moving image coding apparatus in each of Embodiments, to the stream type included in the PMT or the video stream attribute information. With the structure, the video data generated by the moving image coding method or the moving image coding apparatus described in each of Embodiments can be distinguished from video data that conforms to another standard.

Figure 32:
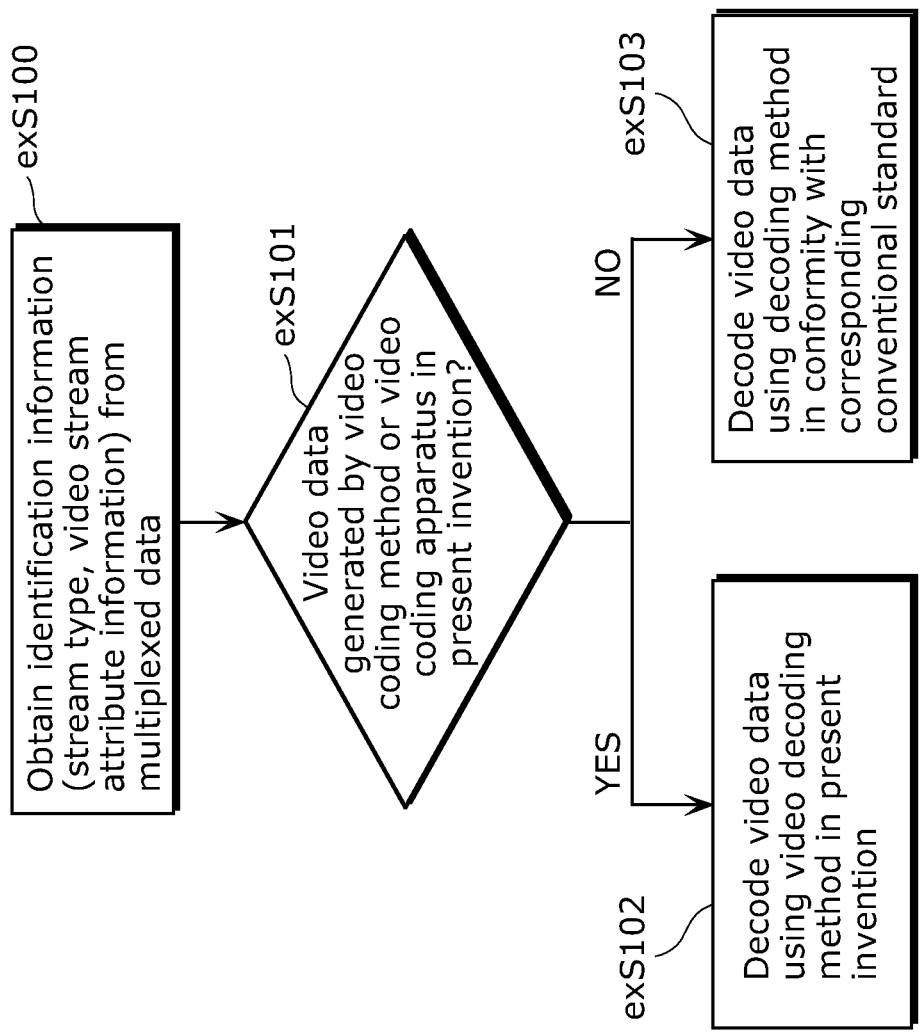
FIG. 32 illustrates steps for identifying video data.

Furthermore, FIG. 32 illustrates steps of the moving image decoding method according to Embodiment 5. In Step exS100, the stream type included in the PMT or the video stream attribute information is obtained from the multiplexed data. Next, in Step exS101, it is determined whether or not the stream type or the video stream attribute information indicates that the multiplexed data is generated by the moving image coding method or the moving image coding apparatus in each of Embodiments. When it is determined that the stream type or the video stream attribute information indicates that the multiplexed data is generated by the moving image coding method or the moving image coding apparatus in each of Embodiments, in Step exS102, the stream type or the video stream attribute information is decoded by the moving image decoding method in each of Embodiments. Furthermore, when the stream type or the video stream attribute information indicates conformance to the conventional standards, such as MPEG-2, MPEG4-AVC, and VC-1, in Step exS103, the stream type or the video stream attribute information is decoded by a moving image decoding method in conformity with the conventional standards.

As such, allocating a new unique value to the stream type or the video stream attribute information enables determination whether or not the moving image decoding method or the moving image decoding apparatus that is described in each of Embodiments can perform decoding. Even upon an input of multiplexed data that conforms to a different standard, an appropriate decoding method or apparatus can be selected. Thus, it becomes possible to decode information without any error. Furthermore, the moving image coding method or apparatus, or the moving image decoding method or apparatus in Embodiment 5 can be used in the devices and systems described above.

Embodiment 6

Figure 33:
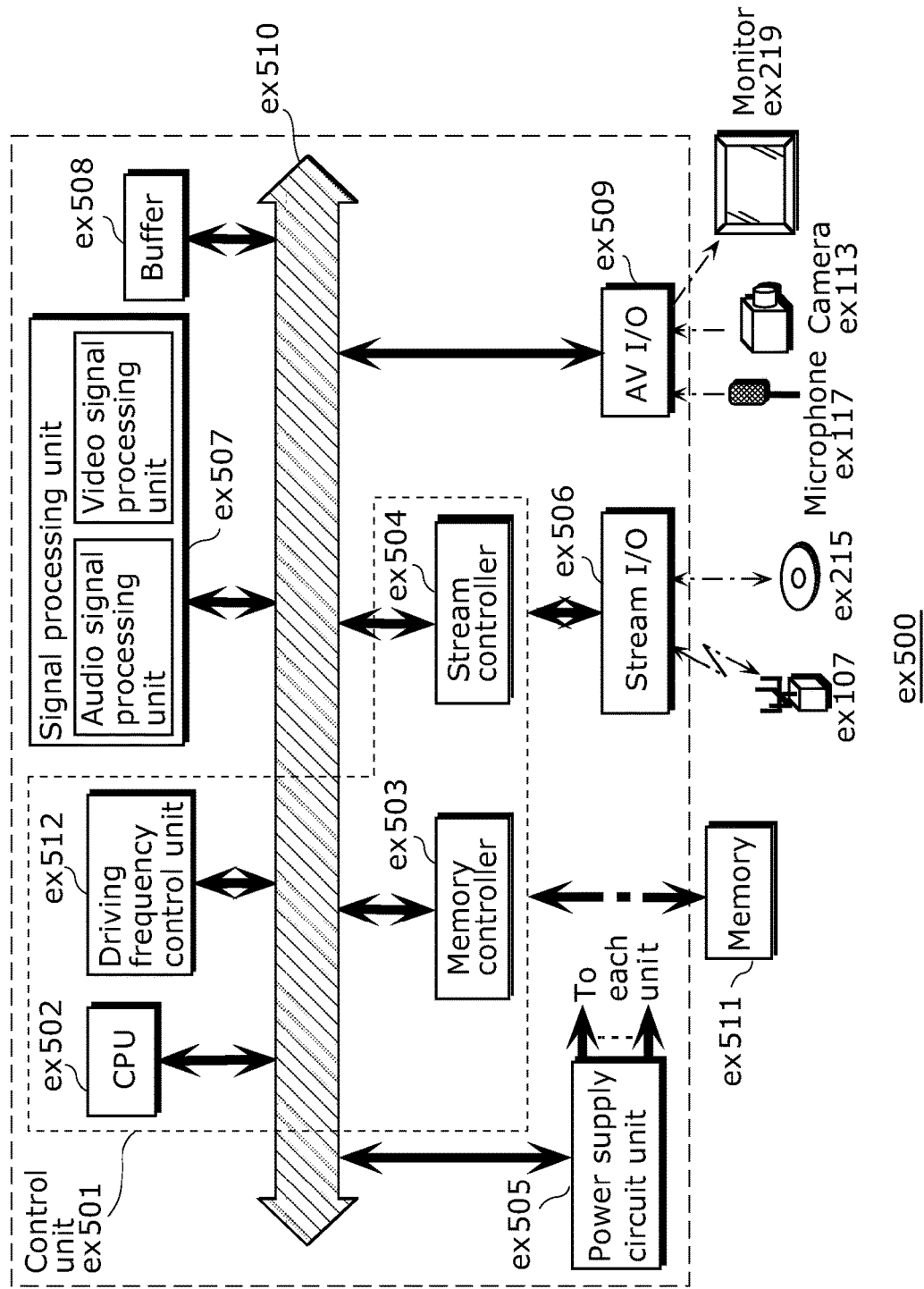
FIG. 33 is a block diagram illustrating an example of a configuration of an integrated circuit for implementing the moving image coding method and the moving image decoding method according to each of Embodiments.

Each of the moving image coding method, the moving image coding apparatus, the moving image decoding method, and the moving image decoding apparatus in each of Embodiments is typically achieved in the form of an integrated circuit or a Large Scale Integrated (LSI) circuit. As an example of the LSI, FIG. 33 illustrates a configuration of the LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV IO ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is segmented into data portions according to the processing amount and speed to be transmitted to a signal processing unit ex507. Then, the signal processing unit ex507 codes an audio signal and/or a video signal. Here, the coding of the video signal is the coding described in each of Embodiments. Furthermore, the signal processing unit ex507 sometimes multiplexes the coded audio data and the coded video data, and a stream IO ex506 provides the multiplexed data outside. The provided multiplexed data is transmitted to the base station ex107, or written on the recording media ex215. When data sets are multiplexed, the data sets should be temporarily stored in the buffer ex508 so that the data sets are synchronized with each other.

Although the memory ex511 is an element outside the LSI ex500, it may be included in the LSI ex500. The buffer ex508 is not limited to one buffer, but may be composed of buffers. Furthermore, the LSI ex500 may be made into one chip or a plurality of chips.

Furthermore, although the control unit ex501 includes the CPU ex502, the memory controller ex503, the stream controller ex504, the driving frequency control unit ex512, the configuration of the control unit ex501 is not limited to such. For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present invention is applied to biotechnology.

Embodiment 7

When video data is decoded by the moving image coding method or by the moving image coding apparatus described in each of Embodiments, compared to when video data that conforms to a conventional standard, such as MPEG-2, MPEG4-AVC, and VC-1, the computing amount probably increases. Thus, the LSI ex500 needs to be set to a driving frequency higher than that of the CPU ex502 to be used when video data in conformity with the conventional standard is decoded. However, when the driving frequency is set higher, there is a problem that the power consumption increases.

Figure 34:
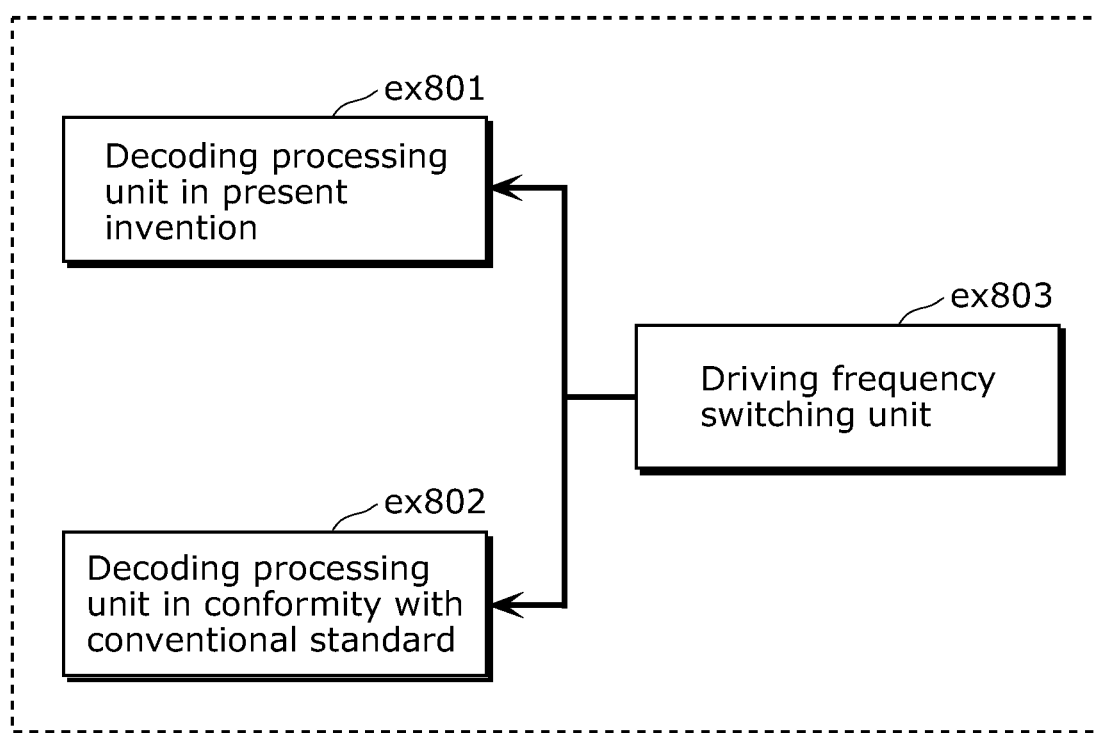
FIG. 34 illustrates a configuration for switching between driving frequencies.

In order to solve the problem, the moving image decoding apparatus, such as the television ex300 and the LSI ex500 is configured to determine to which standard the video data conforms, and switch between the driving frequencies according to the determined standard. FIG. 34 illustrates a configuration ex800 in Embodiment 7. A driving frequency switching unit ex803 sets a driving frequency to a higher driving frequency when video data is generated by the moving image coding method or the moving image coding apparatus described in each of Embodiments. Then, the driving frequency switching unit ex803 instructs a decoding processing unit ex801 that executes the moving image decoding method described in each of Embodiments to decode the video data. When the video data conforms to the conventional standard, the driving frequency switching unit ex803 sets a driving frequency to a lower driving frequency than that of the video data generated by the moving image coding method or the moving image coding apparatus described in each of Embodiments. Then, the driving frequency switching unit ex803 instructs the decoding processing unit ex802 that conforms to the conventional standard to decode the video data.

More specifically, the driving frequency switching unit ex803 includes the CPU ex502 and the driving frequency control unit ex512 in FIG. 33. Here, each of the decoding processing unit ex801 that executes the moving image decoding method described in each of Embodiments and the decoding processing unit ex802 that conforms to the conventional standard corresponds to the signal processing unit ex507 in FIG. 33. The CPU ex502 determines to which standard the video data conforms. Then, the driving frequency control unit ex512 determines a driving frequency based on a signal from the CPU ex502. Furthermore, the signal processing unit ex507 decodes the video data based on a signal from the CPU ex502. For example, the identification information described in Embodiment 5 is probably used for identifying the video data. The identification information is not limited to the one described in Embodiment 5 but may be any information as long as the information indicates to which standard the video data conforms. For example, when which standard video data conforms to can be determined based on an external signal for determining that the video data is used for a television or a disk, etc., the determination may be made based on such an external signal. Furthermore, the CPU ex502 selects a driving frequency based on, for example, a look-up table in which the standards of the video data are associated with the driving frequencies as shown in FIG. 36. The driving frequency can be selected by storing the look-up table in the buffer ex508 and an internal memory of an LSI and with reference to the look-up table by the CPU ex502.

Figure 35:
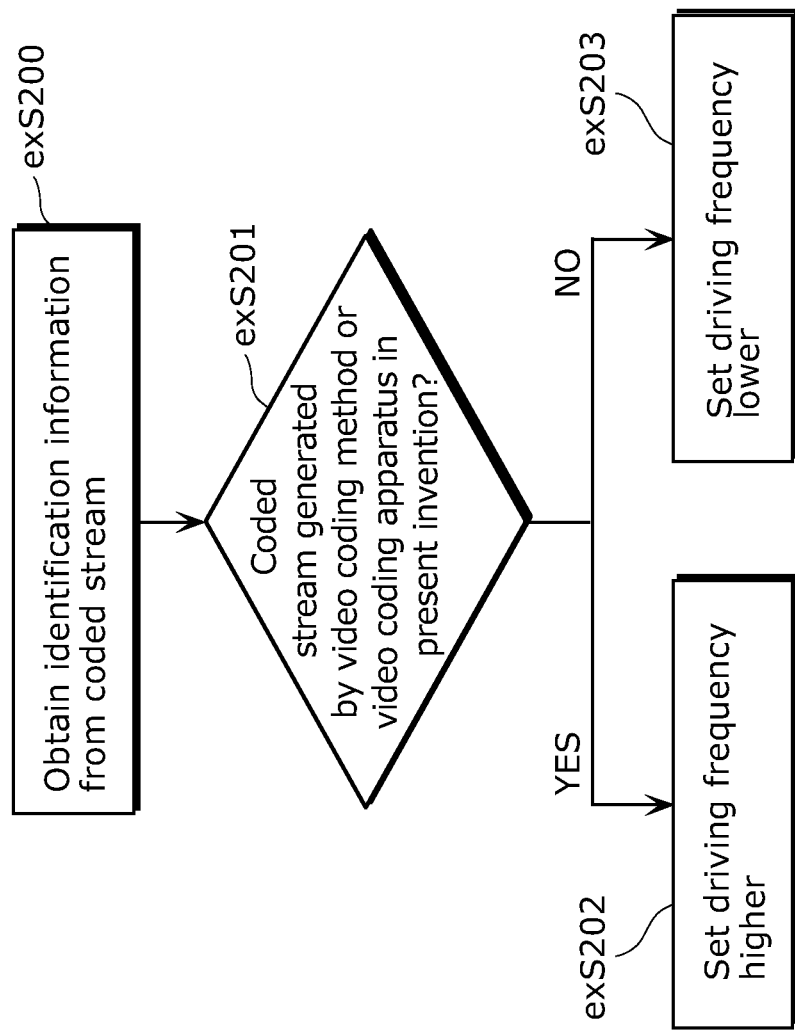
FIG. 35 illustrates steps for identifying video data and switching between driving frequencies.

FIG. 35 illustrates steps for executing a method in Embodiment 7. First, in Step exS200, the signal processing unit ex507 obtains identification information from the multiplexed data. Next, in Step exS201, the CPU ex502 determines whether or not the video data is generated based on the identification information by the coding method and the coding apparatus described in each of Embodiments. When the video data is generated by the coding method and the coding apparatus described in each of Embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to the conventional standard, such as MPEG-2, MPEG4-AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the coding method and the coding apparatus described in each of Embodiments.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the computing amount for decoding is larger, the driving frequency may be set higher, and when the computing amount for decoding is smaller, the driving frequency may be set lower as the method for setting the driving frequency. Thus, the setting method is not limited to the ones described above. For example, when the computing amount for decoding video data in conformity with MPEG 4-AVC is larger than the computing amount for decoding video data generated by the moving image coding method and the moving image coding apparatus described in each of Embodiments, the driving frequency is probably set in reverse order to the setting described above.

Furthermore, the method for setting the driving frequency is not limited to the method for setting the driving frequency lower. For example, when the identification information indicates that the video data is generated by the moving image coding method and the moving image coding apparatus described in each of Embodiments, the voltage to be applied to the LSI ex500 or the apparatus including the LSI ex500 is probably set higher. When the identification information indicates that the video data conforms to the conventional standard, such as MPEG-2, MPEG4-AVC, and VC-1, the voltage to be applied to the LSI ex500 or the apparatus including the LSI ex500 is probably set lower. As another example, when the identification information indicates that the video data is generated by the moving image coding method and the moving image coding apparatus described in each of Embodiments, the driving of the CPU ex502 does not probably have to be suspended. When the identification information indicates that the video data conforms to the conventional standard, such as MPEG-2, MPEG4-AVC, and VC-1, the driving of the CPU ex502 is probably suspended at a given time because the CPU ex502 has extra processing capacity. Even when the identification information indicates that the video data is generated by the moving image coding method and the moving image coding apparatus described in each of Embodiments, in the case where the CPU ex502 may have a time delay, the driving of the CPU ex502 is probably suspended at a given time. In such a case, the suspending time is probably set shorter than that in the case where when the identification information indicates that the video data conforms to the conventional standard, such as MPEG-2, MPEG4-AVC, and VC-1.

Accordingly, the power conservation effect can be improved by switching between the driving frequencies in accordance with the standard to which the video data conforms. Furthermore, when the LSI ex500 or the apparatus including the LSI ex500 is driven using a battery, the battery life can be extended with the power conservation effect.

Embodiment 8

There are cases where a plurality of video data that conforms to different standards, is provided to the devices and systems, such as a television and a cellular phone. In order to enable decoding the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing units ex507 that conform to the respective standards.

Figure 37A:
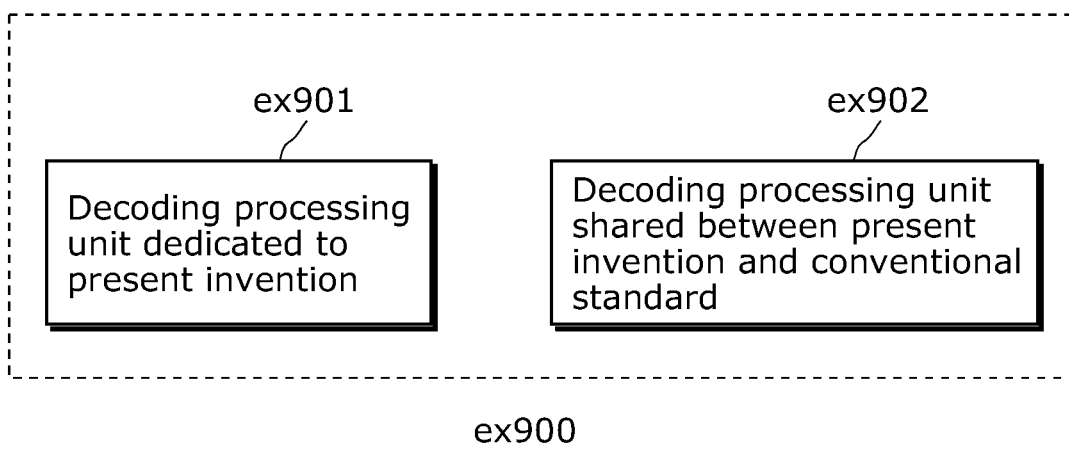
FIG. 37A illustrates an example of a configuration for sharing a module of a signal processing unit.

In order to solve the problem, what is conceived is a configuration in which the decoding processing unit for implementing the moving image decoding method described in each of Embodiments and the decoding processing unit that conforms to the conventional standard, such as MPEG-2, MPEG4-AVC, and VC-1 are partly shared. Ex900 in FIG. 37A shows an example of the configuration. For example, the moving image decoding method described in each of Embodiments and the moving image decoding method that conforms to MPEG4-AVC have, partly in common, the details of processing, such as entropy coding, inverse quantization, deblocking filtering, and motion compensated prediction. The details of processing to be shared probably include use of a decoding processing unit ex902 that conforms to MPEG4-AVC. In contrast, a dedicated decoding processing unit ex901 is probably used for other processing unique to the present invention. Since the present invention is characterized by the arithmetic decoding in particular, for example, the dedicated decoding processing unit ex901 is used for the arithmetic decoding. Otherwise, the decoding processing unit is probably shared for one of the inverse quantization, deblocking filtering, and motion compensation, or all of the processing. The decoding processing unit for implementing the moving image decoding method described in each of Embodiments may be shared for the processing to be shared, and a dedicated decoding processing unit may be used for processing unique to that of MPEG4-AVC.

Figure 37B:
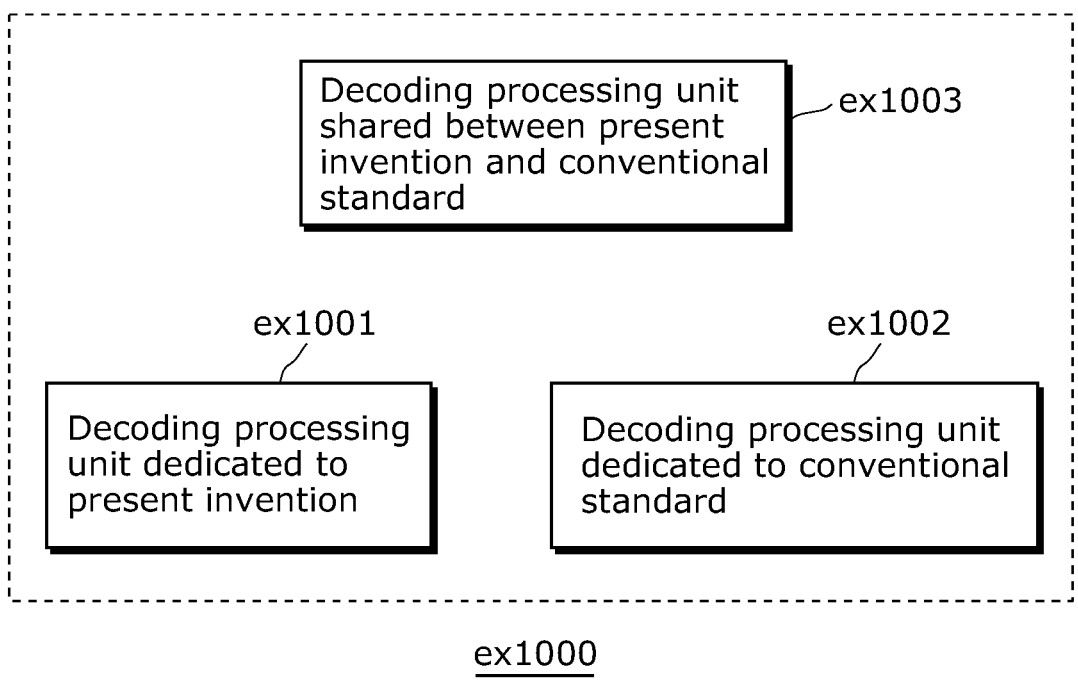
FIG. 37B illustrates another example of a configuration for sharing a module of a signal processing unit.

Furthermore, ex1000 in FIG. 37B shows another example in which processing is partly shared. This example uses a configuration including a dedicated decoding processing unit ex1001 that supports the processing unique to the present invention, a dedicated decoding processing unit ex1002 that supports the processing unique to another conventional standard, and a decoding processing unit ex1003 that supports processing to be shared between the moving image decoding method in the present invention and the conventional moving image decoding method. Here, the dedicated decoding processing units ex1001 and ex1002 are not necessarily specialized for the processing of the present invention and the processing of the conventional standard, and may be the ones capable of implementing general processing. Furthermore, the configuration of Embodiment 8 can be implemented by the LSI ex500.

As such, reducing the scale of the circuit of an LSI and reducing the cost are possible by sharing the decoding processing unit for the processing to be shared between the moving image decoding method in the present invention and the moving image decoding method in conformity with the conventional standard.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present invention is applicable to an image coding method, an image decoding method, an image coding apparatus, and an image decoding apparatus, and in particular, is applicable to an image coding method, an image decoding method, an image coding apparatus, and an image decoding apparatus which use arithmetic coding and arithmetic decoding.

The invention claimed is:

1. Circuitry executing operations, the operations comprising:
    receiving an encoded bitstream;
    determining a context for a current block in an image, from among a plurality of contexts, the current block being decoded in a first mode or a second mode which is different from the first mode;
    performing arithmetic decoding on the encoded bitstream, which corresponds to the current block, using the determined context to obtain a control parameter for the current block, and obtaining a decoded image signal; and
    reproducing and outputting the decoded image signal,
    wherein the determining further includes:
        determining a signal type under which the control parameter for the current block is classified;
        for the signal type of a first type, determining the context by using both of decoded control parameters for a left block and an upper block, the left block being a neighboring block to the left of the current block, and the upper block being a neighboring block on top of the current block; and
        for the signal type of a second type different from the first type, determining the context to be a predetermined fixed value, without using any decoded control parameters for the left block and the upper block,
    wherein the control parameter determined as the first type belongs to the current block having a size larger than or equal to a size of a block to which the control parameter determined as the second type belongs,
    wherein one of a split flag and a skip flag is classified under the first type, the split flag indicating whether or not the current block is partitioned into a plurality of blocks, and the skip flag indicating whether or not the current block is to be skipped, and
    wherein a luma coefficient flag is classified under the second type, the luma coefficient flag indicating whether or not the current block includes a non-zero luma coefficient.

2. Circuitry executing operations, the operations comprising:
    determining a context for a current block in an image, from among a plurality of contexts, the current block being coded in a first mode or a second mode which is different from the first mode;
    performing arithmetic coding on a control parameter for the current block, using the determined context to generate an encoded bitstream corresponding to the current block; and
    sending the encoded bitstream,
    wherein the determining further includes:
        determining a signal type under which the control parameter for the current block is classified;
        for the signal type of a first type, determining the context by using both of coded control parameters for a left block and an upper block, the left block being a neighboring block to the left of the current block, and the upper block being a neighboring block on top of the current block; and
        for the signal type of a second type different from the first type, determining the context to be a predetermined fixed value, without using any coded control parameters for the left block and the upper block, wherein the control parameter determined as the first type belongs to the current block having a size larger than or equal to a size of a block to which the control parameter determined as the second type belongs, wherein one of a split flag and a skip flag is classified under the first type, the split flag indicating whether or not the current block is partitioned into a plurality of blocks, and the skip flag indicating whether or not the current block is to be skipped, and wherein a luma coefficient flag is classified under the second type, the luma coefficient flag indicating whether or not the current block includes a non-zero luma coefficient.

* * * * *